United States Patent
Miyazawa et al.

(10) Patent No.: US 7,116,038 B2
(45) Date of Patent: Oct. 3, 2006

(54) ULTRASONIC MOTOR, AN OPERATING APPARATUS, AN OPTICAL APPARATUS AND AN ELECTRIC INSTRUMENT

(75) Inventors: Osamu Miyazawa, Shimosuwa (JP); Yasuharu Hashimoto, Minamiminowa (JP)

(73) Assignee: Seiko Epson Corporation, (JP)

( * ) Notice: Subject to any disclaimer, the term of this patent is extended or adjusted under 35 U.S.C. 154(b) by 68 days.

(21) Appl. No.: 10/789,941

(22) Filed: Feb. 27, 2004

(65) Prior Publication Data
US 2004/0227433 A1 Nov. 18, 2004

(30) Foreign Application Priority Data
Feb. 28, 2003 (JP) .............................. 2003-055019

(51) Int. Cl.
*H01L 41/08* (2006.01)
(52) U.S. Cl. ................. 310/323.02; 359/383; 359/557; 310/323.14; 250/201.03
(58) Field of Classification Search ........... 310/323.02, 310/323.12, 323.16, 328; 359/557, 554, 359/363, 368, 383, 391; 396/133; 250/201.3
See application file for complete search history.

(56) References Cited

U.S. PATENT DOCUMENTS

| | | | | |
|---|---|---|---|---|
| 5,453,653 A * | 9/1995 | Zumeris | ................. | 310/323.16 |
| 5,949,177 A * | 9/1999 | O'Brien et al. | ........ | 310/316.01 |
| 6,064,140 A * | 5/2000 | Zumeris | ................. | 310/323.02 |
| 6,067,421 A * | 5/2000 | Kitazawa et al. | ........... | 396/133 |
| 6,397,008 B1 * | 5/2002 | Kuwana et al. | ................ | 396/55 |
| 6,831,393 B1 * | 12/2004 | Miyazawa | ............. | 310/323.14 |
| 6,909,223 B1 * | 6/2005 | Miyazawa | ................... | 310/328 |
| 6,924,929 B1 * | 8/2005 | Yasuda et al. | .............. | 359/383 |
| 2002/0015234 A1 | 2/2002 | Suzuki et al. | | |
| 2004/0027032 A1 * | 2/2004 | Moteki et al. | ......... | 310/323.02 |
| 2004/0256956 A1 * | 12/2004 | Miyazawa | ................... | 310/328 |
| 2004/0256957 A1 * | 12/2004 | Miyazawa | ................... | 310/328 |

FOREIGN PATENT DOCUMENTS

| EP | 1 075 079 A1 | 2/2001 |
|---|---|---|
| EP | 1 176 741 A2 | 1/2002 |
| EP | 1 372 256 A2 | 12/2003 |

(Continued)

OTHER PUBLICATIONS

Miyazawa, O et al, "Investigation of Ultrasonic Motors Using Thin Piezo-Ceramics and a Metal Composite-Plate for Watches", Japanese Journal of Applied Physics, Part 1, vol. 38, No. 9B, Sep. 1999, pp. 5608-5611.

(Continued)

*Primary Examiner*—Mark Budd
(74) *Attorney, Agent, or Firm*—Harness, Dickey & Pierce, P.L.C.

(57) ABSTRACT

An ultrasonic motor of the present invention has a vibrating element 6. The vibrating element 6 includes a first piezoelectric element 62 that undergoes extension and contraction by application of an AC voltage, a reinforcing plate 63 having a contact portion 66 and an arm portion 68, and a second piezoelectric element 64 that undergoes extension and contraction by application of an AC voltage. The first piezoelectric element 62, the reinforcing plate 63, and the second piezoelectric element 64 are laminated in this order. The vibrating element 6 is fixedly mounted through the arm portion 68 so that the contact portion 66 abuts on a driven element (rotor 51). Further, the vibrating element 6 has a body portion and a length L of the body portion in a direction in which the vibrating element 6 extends and contracts by application of the AC voltage is 1 to 20 mm.

12 Claims, 36 Drawing Sheets

FOREIGN PATENT DOCUMENTS

| | | |
|---|---|---|
| JP | 2722211 | 11/1997 |
| JP | 10-225151 | 8/1998 |
| JP | 2980541 | 9/1999 |
| JP | 2000-333480 | 11/2000 |

OTHER PUBLICATIONS

Communication from European Patent Office re: related application.

* cited by examiner

ULTRASONIC MOTOR, AN OPERATING APPARATUS, AN OPTICAL APPARATUS AND AN ELECTRIC INSTRUMENT

TECHNICAL FIELD

The present invention is related to an ultrasonic motor, an operating apparatus, an optical apparatus and an electric instrument.

BACKGROUND ART

So far, ultrasonic motors that drive a driven element such as a rotor, linear actuator, or the like by vibrating a vibrating element are well known. In such an ultrasonic motor, a vibrating element has a piezoelectric element, and undergoes vibration by application of an AC voltage to the piezoelectric element. A technology described in Japanese Laid-Open Patent Publication No. 2000-333480 is known as the above-mentioned technology.

However, in conventional ultrasonic motors, research about a relationship between the size of a vibrating element and reliability of drive or breakage of a drive IC caused by fall is not executed well.

SUMMARY OF THE INVENTION

It is an object of the present invention to provide an ultrasonic motor, an operating apparatus, an optical apparatus and an electric instrument each of which can improve reliability of drive and effectively prevent (or inhibit) from breakage of a drive IC thereof when it falls.

In order to achieve the above-mentioned object, in one aspect of the invention, the present invention is directed to an ultrasonic motor. The ultrasonic motor comprises:

a vibrating element which includes a first piezoelectric element that undergoes extension and contraction by application of an AC voltage, a reinforcing plate having a contact portion and an arm portion, and a second piezoelectric element that undergoes extension and contraction by application of an AC voltage, the first piezoelectric element, the reinforcing plate and the second piezoelectric element being laminated in this order, and the vibrating element being fixedly mounted through the arm portion so that the contact portion abuts on a driven element;

wherein the vibrating element has a body portion and a length of the body portion in a direction in which the vibrating element extends and contracts by application of the AC voltage is 1 to 20 mm.

In the present invention, when the AC voltage is applied to the piezoelectric elements, the vibrating element repeatedly undergoes vibration at a high speed. This vibration is transmitted to the driven element through the contact portion of the vibrating element, and the contact portion strikes on the driven element to be driven. Here, in the ultrasonic motor, the length (L) of the body portion of the vibrating element in the expansion-and-contraction direction is adapted to be 1 to 20 mm. Since the contact portion can surely overcome surface roughness of the driven element by means of the vibration of the vibrating element when the ultrasonic motor is driven, it is possible to drive the driven element surely. Since a voltage applied to a drive IC of the ultrasonic motor that is more than a permissible voltage is not generated when the shock from the outside is applied to the ultrasonic motor by fall thereof or the like, it is possible to prevent electrical breakage of the drive IC more effectively.

In the ultrasonic motor of the present invention, it is preferable that the length of the body portion in the extension-and-contraction direction is less than 18 mm.

This makes it possible to drive the driven element more appropriately, and to prevent electrical breakage of a drive IC more effectively.

In the ultrasonic motor of the present invention, it is preferable that a planar structure of the body portion is a substantially rectangular shape.

Further, in the ultrasonic motor of the present invention, it is preferable that the arm portion is arranged at a substantially central portion of the body portion in the extension-and-contraction direction.

Moreover, in the ultrasonic motor of the present invention, it is preferable that the body portion has a short side substantially perpendicular to the extension-and-contraction direction of the body portion, and the contact portion is arranged at a substantially central portion of the short side.

In the ultrasonic motor of the present invention, it is preferable that the body portion has a short side substantially perpendicular to the extension-and-contraction direction of the body portion, and the contact portion is arranged at a portion of the short side other than a substantially central portion thereof.

Thus, since a complex vibration of combination of longitudinal vibration and bending vibration can be readily induced in the vibrating element when the vibrating element undergoes expansion and contraction by the application of the AC voltage, it is possible to enhance a drive efficiency of the vibrating element.

In the ultrasonic motor of the present invention, it is preferable that the body portion has a centerline in a direction parallel to the extension-and-contraction direction, and the contact portion is arranged at a portion other than the centerline.

Thus, since a complex vibration of combination of longitudinal vibration and bending vibration can be readily induced in the vibrating element when the vibrating element undergoes expansion and contraction by the application of the AC voltage, it is possible to enhance a drive efficiency of the vibrating element.

In the ultrasonic motor of the present invention, it is preferable that the contact portion is arranged so as to protrude in the extension-and-contraction direction partly.

In the ultrasonic motor of the present invention, it is preferable that the body portion has a centerline in a direction parallel to the protruding direction of the contact portion, and the contact portion is arranged at a portion other than the centerline.

Thus, since a complex vibration of combination of longitudinal vibration and bending vibration can be readily induced in the vibrating element when the vibrating element undergoes expansion and contraction by the application of the AC voltage, it is possible to enhance a drive efficiency of the vibrating element.

In the ultrasonic motor of the present invention, it is preferable that the vibrating element has a vibrational node, and the arm portion supports the vibrating element at the vibrational node.

Thus, the arm portion does not prevent the vibrating element from vibrating when the vibrating element undergoes expansion and contraction. Therefore, since this makes it possible to prevent vibration leakage from the arm portion toward the outside, it is possible to drive the driven element efficiently.

In the ultrasonic motor of the present invention, it is preferable that the length of body portion of the vibrating element in the extension-and-contraction direction is longer than that in a direction perpendicular to the extension-and-contraction direction.

Further, in the ultrasonic motor of the present invention, it is preferable that the length of body portion of the vibrating element in the protruding direction of the contact portion is longer than that in a direction perpendicular to the extension-and-contraction direction.

Moreover, in the ultrasonic motor of the present invention, it is preferable that the vibrating element undergoes a complex vibration of combination of longitudinal vibration and bending vibration, and a resonant frequency of the longitudinal vibration is different from but close to that of the bending vibration.

Thus, in the case where the vibrating element is driven near these frequencies, in particular, at a frequency between these resonant frequencies, it is possible to efficiently obtain the drive characteristics of both the longitudinal vibration and the bending vibration. Further, it is possible to constitute a wide frequency band where the value of the impedance becomes lower near the resonant frequencies, in particular, at a predetermined frequency between the resonant frequencies. This makes it possible to carry out the excitation combining longitudinal (primary) vibration and bending (secondary) vibration at a wide frequency band, and to stabilize an input power to the vibrating element while driving. By appropriately setting (selecting) the drive frequency of the vibrating element within the frequency band between the resonant frequencies, it is possible to obtain arbitrary drive characteristics with respect to driving force, drive speed, or the like, for example.

In another aspect of the invention, the present invention is directed to an operating apparatus. The operating apparatus comprises:
    a driven element; and
    an ultrasonic motor comprising:
        a vibrating element which includes a first piezoelectric element that undergoes extension and contraction by application of an AC voltage, a reinforcing plate having a contact portion and an arm portion, and a second piezoelectric element that undergoes extension and contraction by application of an AC voltage, the first piezoelectric element, the reinforcing plate and the second piezoelectric element being laminated in this order, and the vibrating element being supported through the arm portion so that the contact portion abuts on the driven element;
        wherein the vibrating element has a body portion and a length of the body portion in a direction in which the vibrating element extends and contracts by the application of the AC voltage is 1 to 20 mm;
    wherein driving force is generated by the vibration of the vibrating element, and the driven element is driven by means of the driving force from the ultrasonic motor.

In the operating apparatus of the present invention, it is preferable that the driven element has a rotor and the rotor is rotatively driven by means of the driving force from the ultrasonic motor.

Further, in the operating apparatus of the present invention, it is preferable that the driven element has a circumferential surface, and the contact portion of the ultrasonic motor abuts on the circumferential surface of the driven element so that the driven element is driven by means of the driving force from the ultrasonic motor.

In yet another aspect of the invention, the present invention is directed to an optical apparatus. The optical apparatus comprises:
    an optical system;
    a driven element;
    an ultrasonic motor comprising:
        a vibrating element which includes a first piezoelectric element that undergoes extension and contraction by application of an AC voltage, a reinforcing plate having a contact portion and an arm portion, and a second piezoelectric element that undergoes extension and contraction by application of an AC voltage, the first piezoelectric element, the reinforcing plate and the second piezoelectric element being laminated in this order, and the vibrating element being supported through the arm portion so that the contact portion abuts on the driven element;
        wherein the vibrating element has a body portion and a length of the body portion in a direction in which the vibrating element extends and contracts by the application of the AC voltage is 1 to 20 mm; and
    a switching mechanism for the optical system, the switching mechanism being operated in association with the driven element;
    wherein driving force is generated by the vibration of the vibrating element, and the driven element is driven by means of the driving force from the ultrasonic motor.

In the optical apparatus of the present invention, it is preferable that the switching mechanism has at least one of a diaphragm portion, a filter portion, and a mechanical shutter.

In still another aspect of the invention, the present invention is directed to an electric instrument. The electric instrument comprises:
    a driven element; and
    an ultrasonic motor comprising:
        a vibrating element which includes a first piezoelectric element that undergoes extension and contraction by application of an AC voltage, a reinforcing plate having a contact portion and an arm portion, and a second piezoelectric element that undergoes extension and contraction by application of an AC voltage, the first piezoelectric element, the reinforcing plate and the second piezoelectric element being laminated in this order, and the vibrating element being supported through the arm portion so that the contact portion abuts on the driven element;
        wherein the vibrating element has a body portion and a length of the body portion in a direction in which the vibrating element extends and contracts by the application of the AC voltage is 1 to 20 mm;
    wherein driving force is generated by the vibration of the vibrating element, and the driven element is driven by means of the driving force from the ultrasonic motor.

BRIEF DESCRIPTION OF THE DRAWINGS

The preferred embodiments of an ultrasonic motor, an operating apparatus, an optical apparatus and an electric instrument are described below with reference to the appended drawings.

PREFERRED EMBODIMENTS OF THE INVENTION

The preferred embodiments of an ultrasonic motor, an operating apparatus, an optical apparatus and an electric instrument of the present invention will be described below with reference to the appended drawings.

First Embodiment

Figure 1:
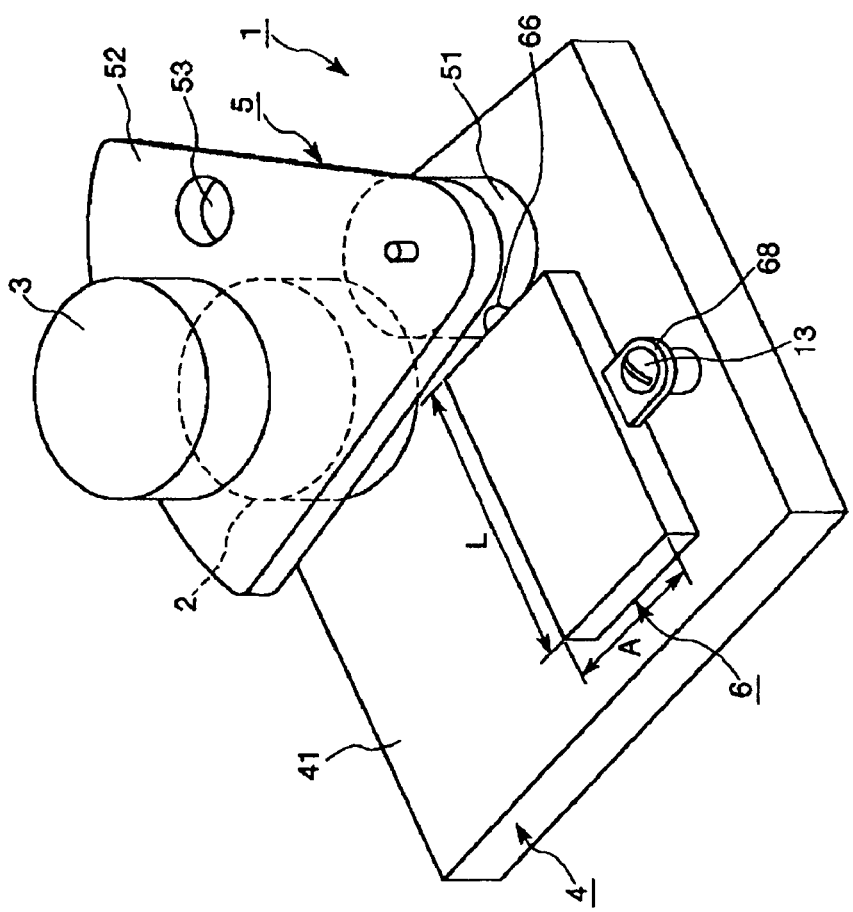
FIG. 1 is a perspective view illustrating an electric instrument of a first embodiment according to the present invention.
Figure 2:
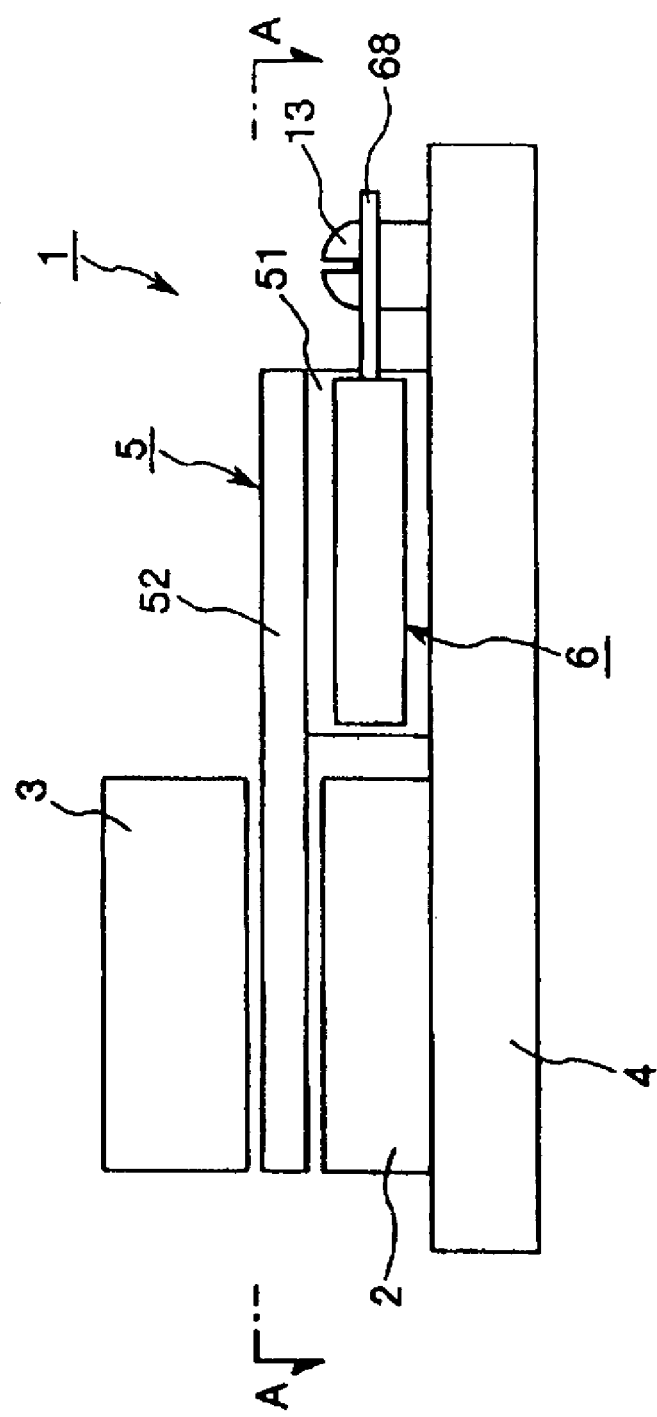
FIG. 2 is a front view illustrating the electric instrument shown in FIG. 1.
Figure 3:
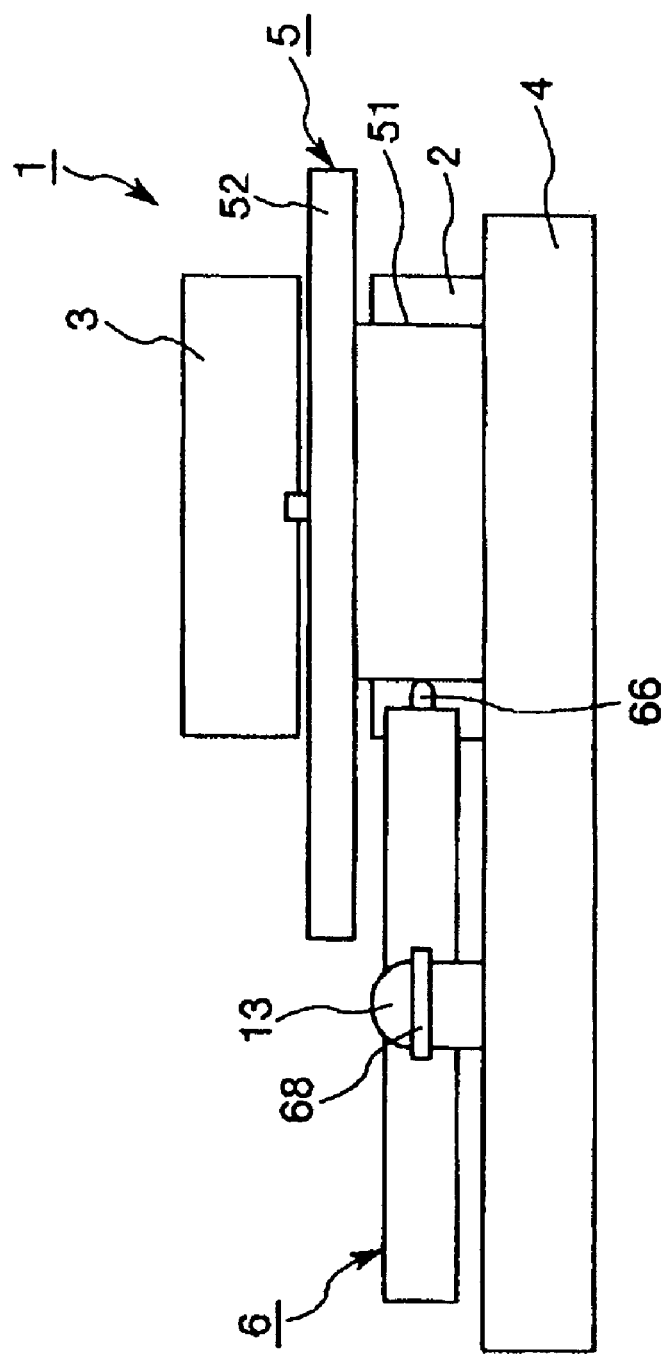
FIG. 3 is a side view illustrating the electric instrument shown in FIG. 1.

FIG. 1 is a perspective view illustrating an electric instrument of a first embodiment according to the present invention. FIG. 2 is a front view illustrating the electric instrument shown in FIG. 1. FIG. 3 is a side view illustrating the electric instrument shown in FIG. 1.

The electric instrument 1 is an electro-optic instrument (optical apparatus) having an imaging portion 2, and an optical system 3. This electric instrument 1 is constituted from a base 4, a diaphragm portion 5, and a vibrating element 6. The imaging portion 2 is fixedly mounted on a surface 41 of the base 4 so that an imaging side of the imaging portion 2 faces upward. The optical system 3 is disposed above the imaging portion 2 so as to face toward the imaging portion 2 and to be spaced from the imaging portion 2 for a predetermined spacing, and is fixedly supported to a wall surface (not shown) extending from the base 4. The base 4 has a substantially plate-shaped structure, and is a base for mounting the imaging portion 2, the optical system 3, the diaphragm portion 5 and the vibrating element 6.

In this electric instrument 1, a constitution comprising the vibrating element 6 and a conducting device (not shown) for driving the vibrating element 6 is referred to as an ultrasonic motor, and a constitution comprising this ultrasonic motor and the diaphragm portion 5 is referred to as an operating apparatus. However, the ultrasonic motor of the present invention may include one having no conducting device. Further, the electric instrument 1 is constructed so as to include the operating apparatus. Moreover, the electric instrument 1 (or optical apparatus) constructs a switching mechanism of a diaphragm having the diaphragm portion 5 and the vibrating element 6, which adjusts light intensity from the optical system 3 toward the imaging portion 2.

The diaphragm 5 is constructed to include a rotor 51 and a shielding plate 52. The rotor 51 is constructed from a cylinder member having rigidity, and disposed so as to erect a rotation axis thereof on the surface 41 of the base 4. The shielding plate 52 is constructed from a substantially sector-form plate-shaped member, and has a circular opening 53 near one line segment (i.e., a radius of the sector of a circle). The opening 53 is a diaphragm for adjusting light intensity from the optical system 3 toward the imaging portion 2.

Further, the diaphragm portion 5 is fixedly mounted on the top surface of the rotor 51 through a center side of the sector of a circle so that the sector-form surface of the shielding plate 52 is substantially parallel to the surface 41 of the base 4. Thus, when the rotor 51 rotates, the shielding plate 52 is rotatively displaced in a horizontal direction with respect to the surface 41 of the base 4 with the rotor 51 as an axis of the shielding plate 52. In this regard, at an initial condition, the shielding plate 52 of the diaphragm portion 5 interposes between the imaging portion 2 and the optical system 3 to shut out a light path from the optical system 3 toward the imaging portion 2 (see FIGS. 1 and 2).

The vibrating element 6 has a substantially rectangular plate shape as a whole, and comprises a contact portion 66 and an arm portion 68. The contact portion 66 is protrudingly arranged on the center of a short side of the vibrating element 6, and has a rounded top portion. The arm portion 68 is provided on the center of a long side of the vibrating element 6 so as to extend in a direction substantially perpendicular to the side surface of the short side, and has an aperture 681 on a tip portion thereof. The vibrating element 6 is arranged at a condition where it is floating in the air above the surface 41 of the base 4 so that a main surface of the vibrating element 6 is substantially parallel to the surface 41 of the base 4, and fixed on the base 4 by inserting a bolt 13 through the aperture 681 of the arm portion 68. In this case, the contact portion 66 of the vibrating element 6 abuts on (is in contact with) a side surface of the rotor 51 of the diaphragm portion 5 at a setting condition (see FIGS. 1 and 3). At this time, the contact portion 66 resiliently biases toward the side surface of the rotor 51 by means of elasticity of the arm portion 68 and the bolt 13. This makes it possible to obtain enough frictional force at the contact surface. Therefore, there is an advantage that the vibration of the vibrating element 6 can be transmitted to the rotor 51 surely. In addition, in this constitution, it is possible to adjust biasing force of the contact portion 66 by operating the bolt 13. Thus, there is an advantage that the biasing force of the contact portion 66 can be adjusted to a proper value by operating the bolt 13 when the biasing force declines due to usage of the electric instrument 1. The vibrating element 6 is connected to an outside conducting circuit (not shown) to control the drive of the vibrating element 6. The vibrating element 6 and the conducting circuit function as an ultrasonic motor for driving the diaphragm portion 5.

Figure 4:
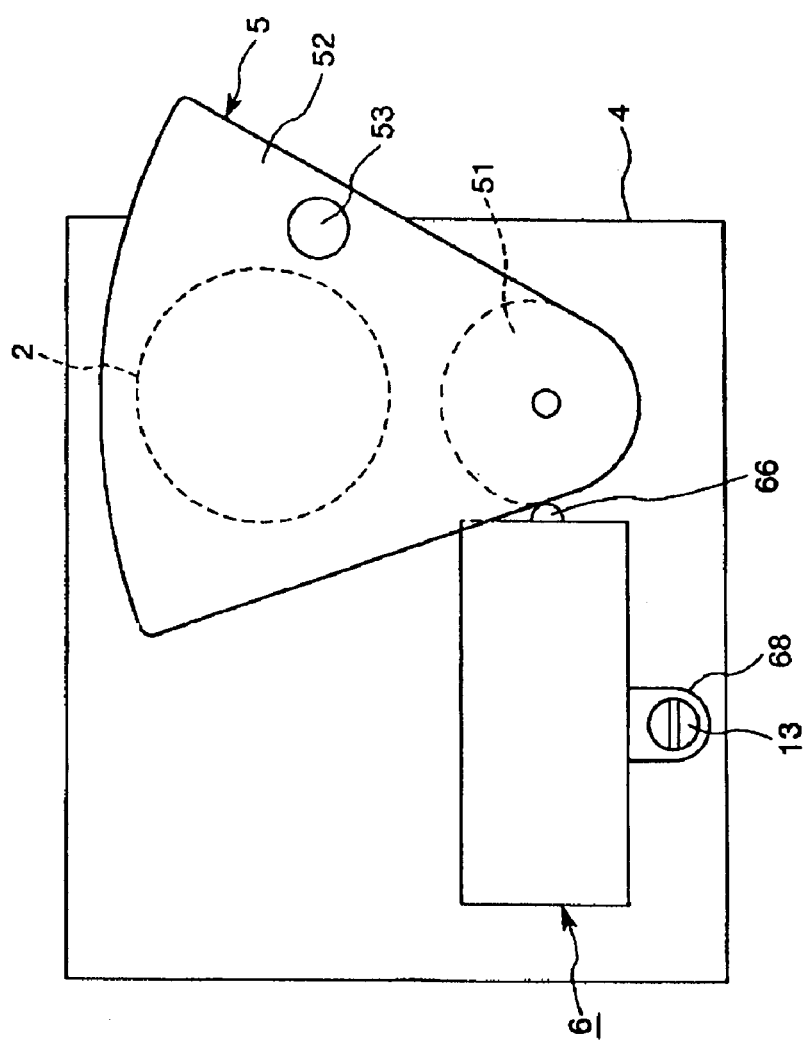
FIG. 4 is an explanatory drawing showing an operation of the electric instrument shown in FIGS. 1–3.
Figure 5:
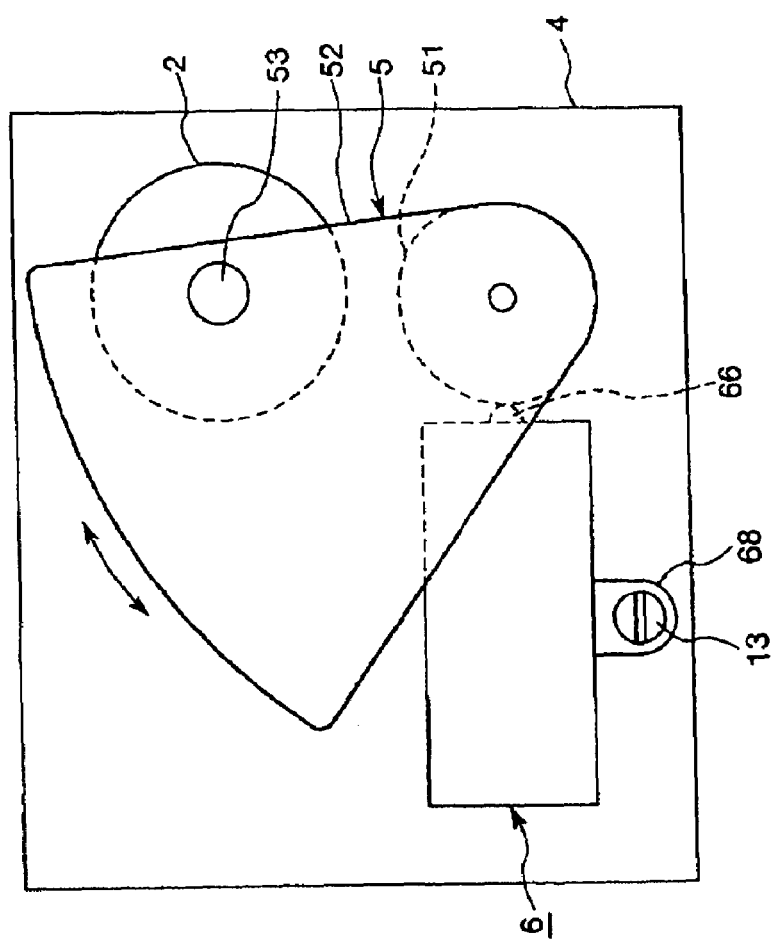
FIG. 5 is an explanatory drawing showing an operation of the electric instrument shown in FIGS. 1–3.
Figure 6:
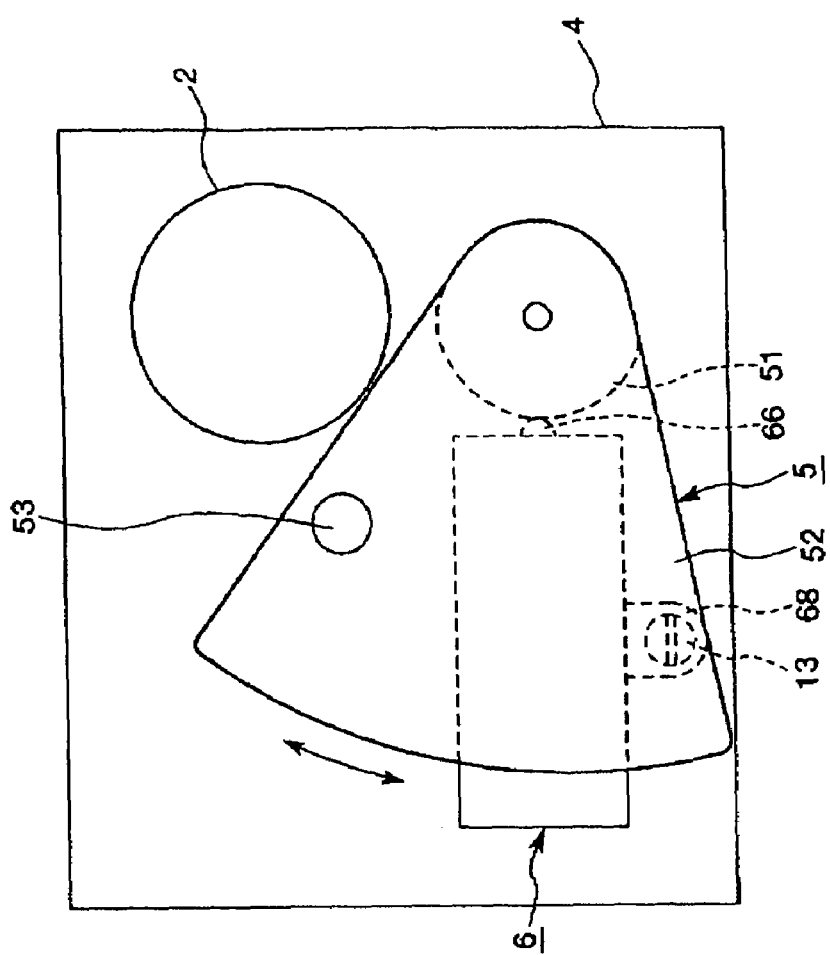
FIG. 6 is an explanatory drawing showing an operation of the electric instrument shown in FIGS. 1–3.

FIGS. 4–6 are explanatory drawings showing an operation of the electric instrument shown in FIGS. 1–3. At the initial condition, the diaphragm portion 5 makes the shielding plate 52 be positioned above the imaging portion 2 to shield the entire imaging portion 2 (see FIG. 4). At this time, the opening 53 of the shielding portion 52 is positioned at a position different from that of the imaging portion 2 when seen from upper side of the base 4. Thus, at the condition shown in FIG. 4, since the light path from the optical system 3 toward the imaging portion 2 is cut off completely, the light intensity to input into the imaging portion 2 becomes zero.

In the case where the light intensity from the optical system 3 toward the imaging portion 2 is to be changed, first, an AC current having a high frequency is supplied to the vibrating element 6 from the outer conducting circuit (not shown in the drawings). Then, the vibrating element 6 undergoes extension and contraction at a high speed, whereby the contact portion 66 repeatedly come in contact with the side surface of the rotor 51 at a high speed. Therefore, since the contact portion 66 hits the rotor 51 continuously, the rotor 51 rotates in a counterclockwise direction in FIG. 4 due to frictional contact. This rotation of the rotor 51 makes the diaphragm portion 5 rotatively displace on the base 4. Thus, the shielding plate 52 rotatively displace in a horizontal direction to the surface 41 of the base 4 in a space between the imaging portion 2 and the optical system 3, and therefore the opening 53 is moved to the position of the imaging portion 2 (see FIG. 5). Then, the light path from the optical system 3 toward the imaging portion 2 is spread to the size of the opening 53, thereby increasing the light intensity into the imaging portion 2.

Next, in the case where the light intensity is to be increased, the rotor 51 further rotates in the counterclockwise direction in FIG. 5 by driving the vibrating element 6. Then, the vibrating element 6 is stopped at a position where the shielding plate 52 completely goes through the upper side of the imaging portion 2 (see FIG. 6). Thus, the upper side of the imaging portion 2 is exposed, and the light intensity into the imaging portion 2 becomes a maximum value. On the other hand, in the case where the light intensity is to be returned to zero, the rotor 51 rotates in a clockwise direction in FIG. 5 (or 6) by driving the vibrating element 6, and the shielding plate 52 is stopped at a predetermined position. In this way, the electric instrument 1 can change the light intensity from the optical system 3 toward the imaging portion 2 with complete control by driving the diaphragm portion 5 in response to the drive of the vibrating element 6.

Figure 7:
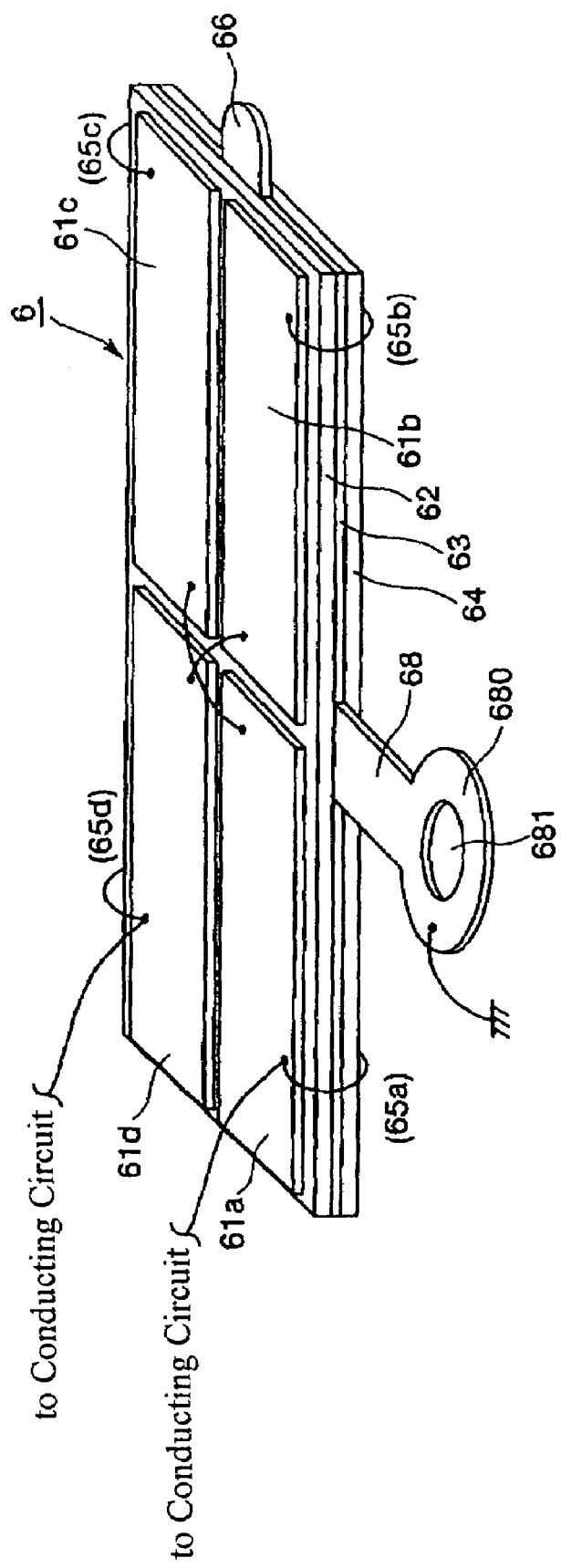
FIG. 7 is a perspective view of the vibrating element shown in FIGS. 1–6.
Figure 8:
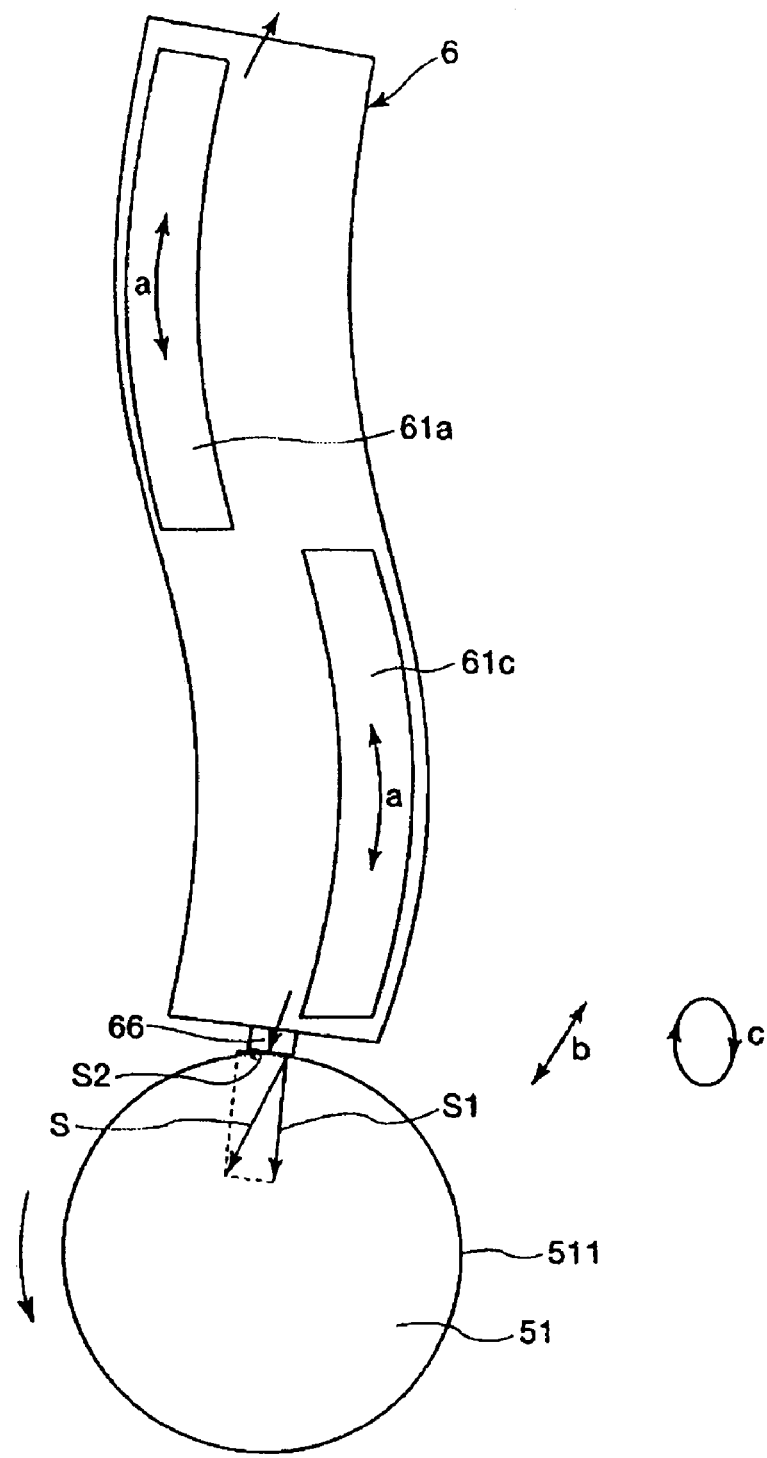
FIG. 8 is an explanatory drawing showing an action of the vibrating element shown in FIG. 7.
Figure 9:
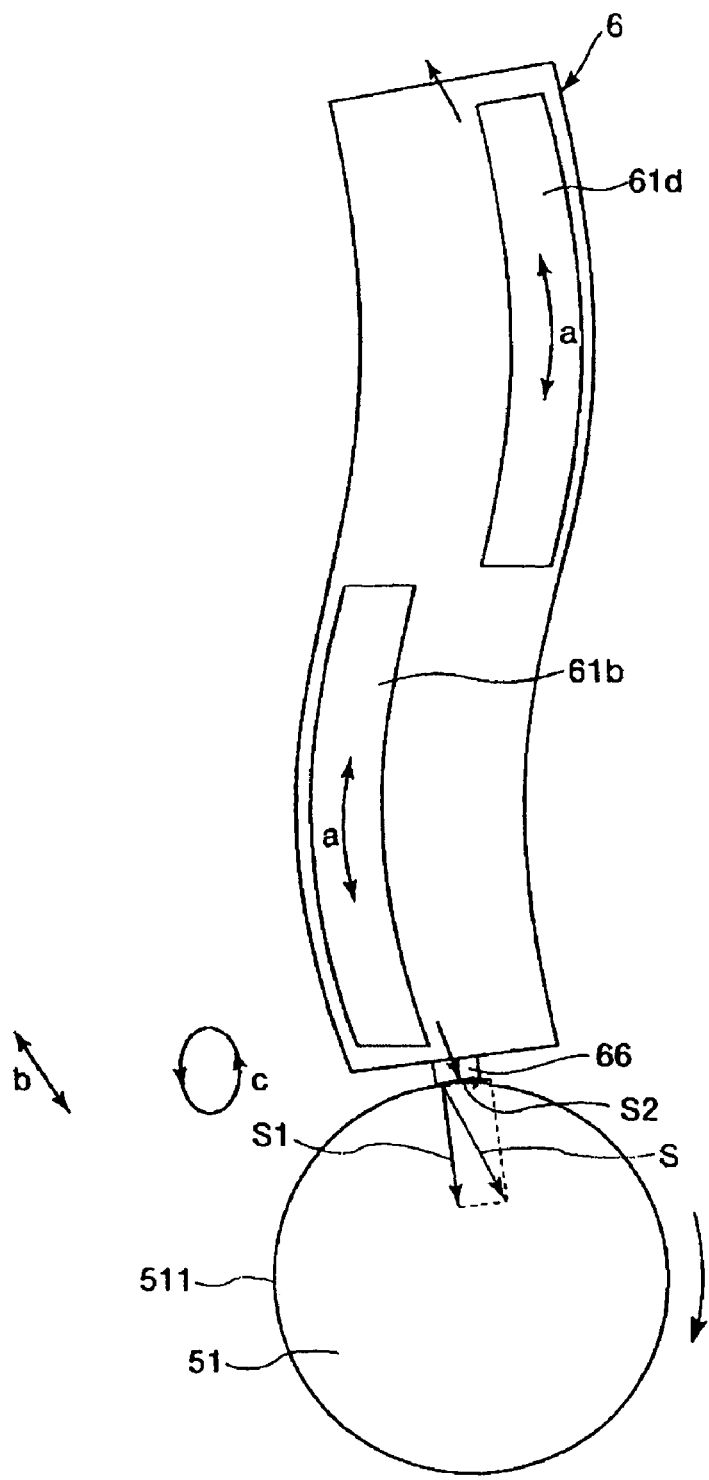
FIG. 9 is an explanatory drawing showing an action of the vibrating element shown in FIG. 7.

FIG. 7 is a perspective view of the vibrating element shown in FIGS. 1–6. FIGS. 8 and 9 are explanatory drawings each showing an action of the vibrating element shown in FIG. 7. The vibrating element 6 is constructed by laminating a piezoelectric element (first piezoelectric element) 62, a single reinforcing plate 63, and a piezoelectric element (second piezoelectric element) 64 in this order so that the reinforcing plate 63 is centrally arranged and is interposed between the pair of piezoelectric elements 62, 64. Further, in the vibrating element 6, electrodes 61a–61d and electrodes 65a–65d (These electrodes 65a–65d are not shown in FIG. 7, but reference numerals of these electrodes are merely designated using parentheses.) are arranged at predetermined positions on the both faces of the vibrating element 6.

The reinforcing plate 63 has a substantially rectangular plate-shaped structure, and a thickness of the reinforcing plate 63 is thinner than that of each of the piezoelectric elements 62, 64. Thus, there is an advantage that the vibrating element 6 can undergo vibration with high efficiency. Material to constitute the reinforcing plate 63 is not especially limited. However, the material is preferably a kind of metal material such as stainless steel, aluminum or aluminum alloy, titan or titan alloy, and copper or copper system alloy or the like. The reinforcing plate 63 has a function to reinforce the entire vibrating element 6, thereby preventing the vibrating element 6 from being injured due to over-vibration of the vibrating element 6, external force or the like. Further, the reinforcing element 63 has a function as a common electrode for the piezoelectric elements 62, 64 to conduct these piezoelectric elements.

The piezoelectric elements 62, 64 respectively have substantially rectangular plate-shaped structures same as that of the reinforcing plate 63. The piezoelectric elements 62, 64 face each other so as to sandwich the reinforcing plate 63 from the both faces thereof, and are laminated so as to coordinate with these plan positions with respect to the reinforcing plate 63. Further, the piezoelectric elements 62, 64 are fixed to the reinforcing plate 63 to integrate into a single structure. This makes it possible to improve strength of the vibrating element 6. The piezoelectric elements 62, 64 consist of material that can undergo expansion and contraction by application of an AC voltage to the elements 62, 64. Material to constitute the piezoelectric elements 62, 64 is not especially limited. For example, it is possible to use various kinds of materials such as plumbum zirconate titanate (PZT), quartz crystal, lithium niobate, barium titanate, plumbum titanate, plumbum metaniobate, polyvinylidene fluoride, zinc plumbum niobate, scandium plumbum niobate, and the like.

The electrodes 61a–61d and 65a–65d are made from rectangle-shaped metal members, and arranged at predetermined positions on the piezoelectric elements 62, 64, respectively. In this case, these electrodes have a length substantially half of the long side of the piezoelectric elements, and are arranged so that two of the electrodes are aligned in their longitudinal direction along the end portion of the long side on each of the piezoelectric elements 62, 64. Thus, the electrodes 61a–61d and 65a–65d are respectively arranged on the piezoelectric elements 62, 64, and respectively positioned symmetrical to both centerlines of the longitudinal and width directions on the piezoelectric elements 62, 64 (see FIG. 7).

In this regard, the electrodes 61a–61d and 65a–65d are respectively arranged on the both faces of the vibrating element 6 so as to face each other. Reference numerals designated using parentheses in FIG. 7 indicate the electrodes 65a–65d facing to the electrodes 61a–61d against the vibrating element 6 each other. The electrodes 61a, 61c lying at one diagonal line in a front face on the piezoelectric element 62 are electrically connected to the electrodes 65a, 65c lying at a corresponding diagonal line in the back face on the piezoelectric element 64, and these electrodes 61a, 61c, 65a, and 65c are connected to the outer conducting circuit. In a same way, the electrodes 61b, 61d lying at the other diagonal line in the front face on the piezoelectric element 62 are electrically connected to the electrode 65b, 65d lying at a corresponding diagonal line in the back face on the piezoelectric element 64, and these electrodes 61b, 61d, 65b, and 65d are connected to the outer conducting circuit. In this way, the electrodes 61a–61d and 65a–65d are conducted as these combinations by application of the voltage from the conducting circuit. In this regard, to conduct the electrodes in either combination can be arbitrarily selected based on the constitution of the conducting circuit described later.

Further, the vibrating element 6 has the contact portion 66 at the center of one short side, i.e., the center of the tip portion in the longitudinal direction. The contact portion 66 is integrally formed from a single member to the reinforcing plate 63. Thus, there is an advantage that the contact portion 66 can be placed on the vibrating element 6 tightly. In particular, the contact portion 66 repeatedly strikes on the rotor 51 with high pushing force (suppress strength) at a high speed by means of the vibration of the vibrating element 6 during the operation of the electric instrument 1. Therefore, this structure makes it possible to ruggedize (improve endurance of) the contact portion 66. The contact portion 66 has a semicircular (arched) tip portion (see FIG. 7). The contact portion 66 can stably come into frictional contact with the side surface of the rotor 51 in comparison with the case where the contact portion 66 has a square-shaped tip portion. Thus, there is an advantage that the pushing force from the vibrating element 6 can be transmitted to the rotor 51 surely in the case where the direction of action of the vibrating element 6 is out of alignment more or less.

Further, the vibrating element 6 has the arm portion 68 protruding substantially perpendicular to the long side thereof at the center of one long side, i.e., the center of the side surface in the longitudinal direction. The arm portion 68 is integrally formed from a single member to the reinforcing plate 63. Thus, there is an advantage that the arm portion 68 can be placed on the vibrating element 6 tightly. The vibrating element 6 is fixedly arranged to the base 4 by means of the bolt 13 so that the bolt 13 is inserted through the aperture 681 provided on the tip portion of the arm portion 68. The vibrating element 6 is provided in a floating condition in the air above the base 4 by means of the arm portion 68 (see FIGS. 1–3). Since there is no friction between the vibrating element 6 and the base 4 in this structure, it is hard to restrict the vibration of the vibrating element 6, whereby there is an advantage that the vibrating element 6 can realize unlimited vibration. Further, since the reinforcing plate 63 is made from metal material, the arm portion 68 has elasticity. The vibrating element 6 is supported by means of (or through) the arm portion 68 at the condition where the contact portion 66 is biased to the side surface of the rotor 51 due to the elasticity. Moreover, the reinforcing plate 63 of the vibrating element 6 is connected to ground via the arm portion 68.

Here, an arm portion 68 is arranged at a position of a vibrational node of the vibrating element 6 on the side surface of the vibrating element 6. The point of the vibrational node may be appropriately determined within an obvious scope of one skilled in the art using known methods such as vibration analysis. For example, in a case where the electrodes 61a–61d and the electrodes 65a–65d are symmetrically arranged in the longitudinal direction and the width direction of the vibrating element 6 as the electric instrument 1, the vibrational node may be located at substantial center of the longitudinal direction of the vibrating element 6. Therefore, the arm portion 68 is provided at the substantial center of the long side of the vibrating element 6 in the electric instrument 1. In this case, since the arm portion 68 does not prevent the vibration of the vibrating element 6, it is possible to reduce vibration leakage (extinction of the vibrational energy) from the arm portion 68 to an external portion. This makes it possible to efficiently rotate (drive) the rotor 51.

FIGS. 8 and 9 are explanatory drawings each showing an action of the vibrating element shown in FIGS. 1–7. FIG. 8 shows a case where the rotor 51 rotates in a counterclockwise direction in the drawing, while FIG. 9 shows a case where the rotor 51 rotates in a direction reverse to the direction shown in FIG. 8 (i.e., in a clockwise direction).

In a condition shown in FIG. 8, first, an AC voltage is applied to the vibrating element 6 from an outer conducting circuit (not shown). Then, the electrodes 61a, 61c, 65a, and 65c lying at one diagonal line on both faces of the vibrating element 6 are conducted, whereby the AC voltage is applied between these electrodes and the reinforcing plate 63. The portions where these electrodes are provided on the piezoelectric elements 62, 64 repeatedly undergo expansion and contraction at a high speed. In this case, as shown in FIG. 8, the portions corresponding to the electrodes 61a, 61c, 65a, and 65c respectively repeatedly undergo extension and contraction in a direction represented by arrows a. Thus, as a whole, the vibrating element 6 undergoes micro vibration bending as a substantial S shape. By this vibration, the contact portion 66 of the vibrating element 6 undergoes vibration (reciprocates) in a slanting direction represented by an arrow b, or the contact portion 66 is displaced along a substantially elliptic shape, i.e., vibrates (moves) in an elliptical manner as represented by an arrow c. The rotor 51 receives frictional force (or pushing force) from the contact portion 66 by this movement. In other words, great frictional force is provided between the contact portion 66 and the outer circumferential surface 511 by a component S1 corresponding to the radial direction of an vibrating displacement S of the contact portion 66 (displacement in a radial direction of the rotor 51), and further turning force generated in a counterclockwise direction in FIG. 8 is provided to the rotor 51 by a component S2 corresponding to circumferential direction of the vibrating displacement S (displacement in a circumferential direction of the rotor 51). The rotor 51 rotates in the counterclockwise direction by repeatedly receiving the pushing force from the contact portion 66 at a high speed.

On the other hand, in a condition shown in FIG. 9, the electrodes 61b, 61d, 65b, and 65d are conducted. These electrodes are conducted symmetrical to the condition shown in FIG. 8. Then, the vibrating element 6 undergoes vibration symmetrical to the condition shown in FIG. 8, whereby the rotor 51 rotates in a clockwise direction in the drawing by receiving the pushing force from the contact portion 66. In this way, in the electric instrument 1, there is an advantage that the rotor 51 can rotate (be driven) in either the clockwise direction or the counterclockwise direction by selecting a conducting pattern. In this regard, in the condition shown in FIG. 9, the electrodes 61a, 61c, 65a, and 65c to which a power is not applied (not activated) constitute vibration detecting means for detecting the vibration of the vibrating element 6.

Figure 10:
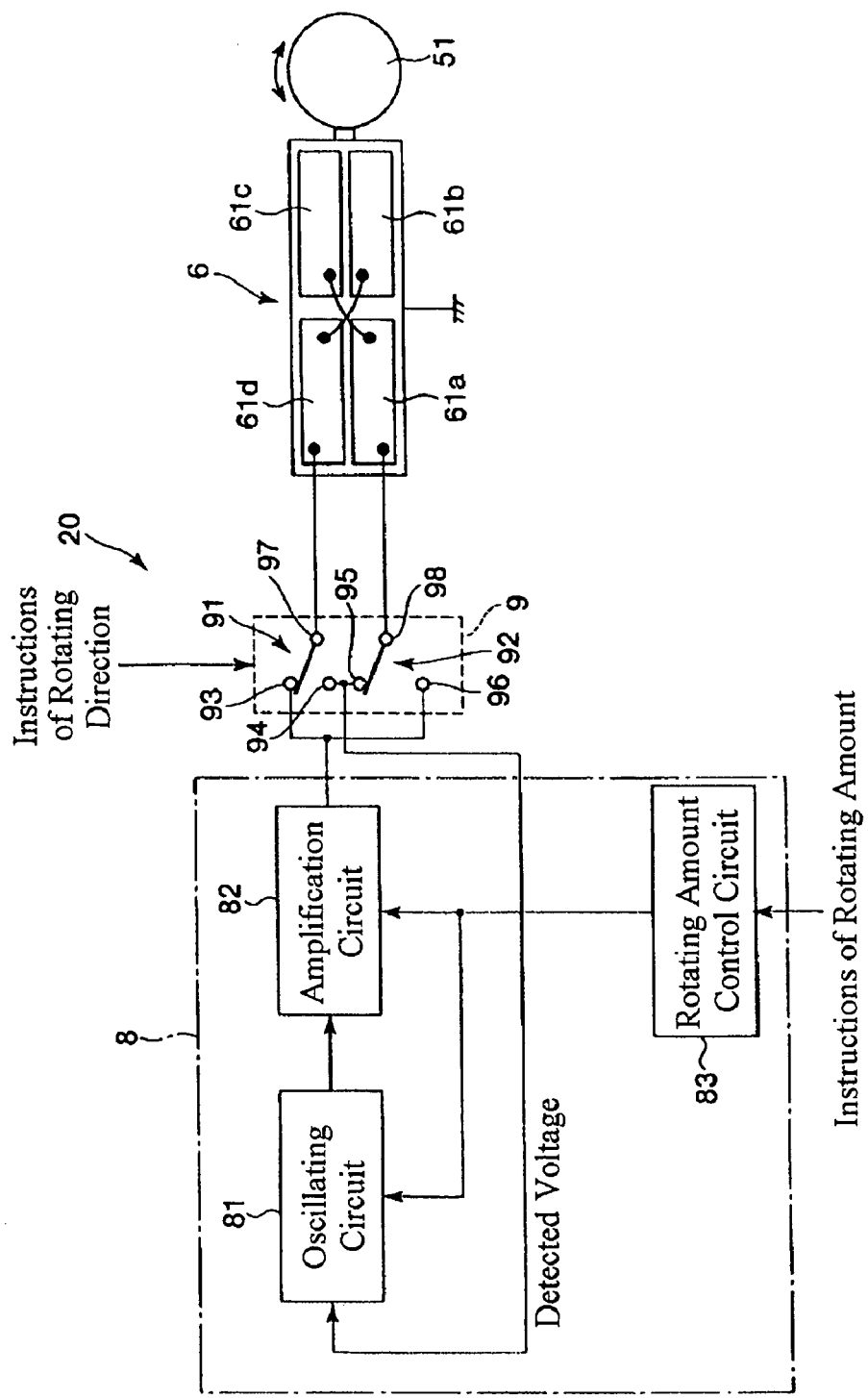
FIG. 10 is a block diagram illustrating a conducting circuit of the vibrating element described in FIGS. 1–9.

FIG. 10 is a block diagram illustrating a conducting circuit of the vibrating element described in FIGS. 1–9. As shown in FIG. 10, the conducting circuit 20 is provided with a drive circuit 8 and a switch 9. The conducting circuit 20 applies an AC voltage to the vibrating element 6 to drive the vibrating element 6. Further, the conducting circuit 20 has a function for switching vibrating modes of the vibrating element 6 by selecting the conducting pattern, and a function for feedback controlling the vibration of the vibrating element 6 by detecting the voltage value of the vibrating element 6.

The drive circuit 8 includes an oscillating circuit 81, an amplification circuit 82, and a rotating amount control circuit 83. In the drive circuit 8, the oscillating circuit 81 generates an AC voltage to be outputted to the amplification circuit 82, and the amplification circuit 82 amplifies the AC voltage to apply the amplified AC voltage to the vibrating element 6. The rotating amount control circuit 83 controls both the oscillating circuit 81 and the amplification circuit 82, and adjusts the AC voltage applied to the vibrating element 6 so that the rotating amount of the rotor 51 becomes a target value instructed.

The switch 9 switches between conducting electrodes to which the AC voltage is applied and electrodes to be used as vibration detecting means, thereby switching a rotative direction of the rotor 51. The switch 9 has two switching sections 91, 92 that operate simultaneously with each other. The electrode 61d of the vibrating element 6 is connected to a terminal 97 of the switching section 91. The electrode 61a is connected to a terminal 98 of the switching section 92. Further, a terminal 93 of the switching section 91 and a terminal 96 of the switching section 92, each is connected to an output side of the amplification circuit 82 of the drive circuit 8, and an AC voltage from the amplification circuit 82 is applied to the vibrating element 6 via each of the terminals 93, 96. Moreover, a terminal 94 of the switching section 91 and a terminal 95 of the switching section 92, each is connected to an input side of the oscillating circuit 81 of the drive circuit 8.

Next, an operation of the electric instrument 1 will be described with reference to FIG. 10.

First, instructions regarding the rotative direction and the rotating amount (for example, rotation number, rotation angle, or the like) are inputted to the rotating amount control circuit 83 in the conducting circuit 20 when the rotor 51 is driven. In a case of the instructions that the rotor 51 is rotated in a counterclockwise direction in FIG. 10 (in a forward direction), the switch 9 is switched so that the terminal 94 of the switching portion 91 is connected to the terminal 97, and that the terminal 96 of the switching portion 92 is connected to the terminal 98. Thus, the output side of the amplification circuit 82 of the drive circuit 8 is conducted to the electrodes 61a, 61c, 65a, and 65c of the vibrating element 6. When an AC voltage is applied to the piezoelectric elements 62, 64 of the vibrating element 6, the vibrating element 6 undergoes longitudinal vibration and bending vibration, whereby the contact portion 66 strikes on the rotor 51 so that the rotor 51 rotates in the counterclockwise direction in FIG. 10.

Further, in this condition, the electrodes 61b, 61d, 65b, and 65d of the vibrating element 6 are conducted to the input side of the oscillating circuit 81 of the drive circuit 8. These electrodes constitute detecting electrodes during driven of the vibrating element 6, which are used for detecting a voltage to be induced between the reinforcing plate 63 and each of the electrodes 61b, 61d, 65b, and 65d (i.e., induced voltage). Based on the detected voltage, the oscillating circuit 81 outputs an AC voltage having a frequency (resonant frequency) at which amplitude of the vibrating element 6 becomes maximum, i.e., the detected voltage becomes maximum. Thus, there is an advantage that the rotor 51 can rotate efficiently. Further, the rotating amount control circuit 83 operates (controls.) the oscillating circuit 81 and the amplification circuit 82 until a rotating amount of the rotor 51 becomes a target value instructed, thereby driving the vibrating element 6 to rotate the rotor 51.

On the other hand, in a case of the instructions that the rotor 51 is rotated in a clockwise direction in FIG. 10 (in a reverse direction), the switch 9 is switched so that the terminal 93 of the switching portion 91 is connected to the terminal 97, and that the terminal 95 of the switching portion 92 is connected to the terminal 98. Thus, the output side of the amplification circuit 82 of the drive circuit 8 is conducted to the electrodes 61b, 61d, 65b, and 65d of the vibrating element 6. When an AC voltage is applied to the piezoelectric elements 62, 64 of the vibrating element 6, the vibrating element 6 undergoes longitudinal vibration and bending vibration, whereby the contact portion 66 strikes on the rotor 51 so that the rotor 51 rotates in the clockwise direction in FIG. 10. Further, in this condition, the electrodes 61a, 61c, 65a, and 65c of the vibrating element 6 are conducted to the input side of the oscillating circuit 81 of the drive circuit 8. These electrodes function as detecting electrodes during driven of the vibrating element 6. Explanation of following operations will be omitted, because the following operations are the same as the operations in the case of the instructions for rotating the rotor 51 in the counterclockwise direction.

According to the electric instrument 1, since the vibrating element 6 has a thinner plate-shaped structure, it is possible to make the entire instrument 1 thinner and to miniaturize the entire instrument 1. In particular, in the electro-optic instrument field, since there are a great number of requests that such an instrument is made thinner and miniaturized recently, one skilled in the art tends to spend a large amount of development costs on this point. Therefore, the electric instrument 1 in which a drive member is constituted from the vibrating element 6 comes in very useful. Further, since the vibrating element 6 drives the rotor 51 by means of the frictional force (pushing force), it is possible to obtain high drive torque and high efficiency in comparison with the motor driven by magnetic force. Therefore, there is an advantage that the rotor 51 can be driven with enough force without a converting mechanism (decelerating mechanism).

Further, according to the electric instrument 1, since electromagnetic noise of the vibrating element 6 is extremely smaller than that of the motor driven by the magnetic force, it is possible to reduce effects against peripheral equipments due to the electromagnetic noise. Moreover, since there is no need for a converting mechanism, it is possible to lower (reduce) energy loss. In addition, since the rotor 51 is directly driven by the vibrating element 6 and therefore there is no need for a decelerating mechanism, it is possible to make the instrument lighter and thinner, and to miniaturize the instrument. Thus, since the structure of the instrument can be simplified extremely and the instruments can be easily manufactured, there is an advantage the manufacturing cost can be reduced.

Furthermore, according to the electric instrument 1, since in-plan vibration of the vibrating element 6 can be converted to rotation of the rotor 51, it is possible to reduce energy loss caused by this conversion and to obtain high drive efficiency. Further, the contact portion 66 of the vibrating element 6 biases to the rotor 51 with a frictional contact condition while the rotor 51 is stopping, it is possible to prevent the rotation of the rotor 51 and to hold the rotor 51 at a stopping position stably. Moreover, since the rotor 51 can alternatively rotate in the forward and reverse directions using a signal vibrating element 6, a number of components of the electric instrument 1 can be reduced in comparison with a case where two dedicated vibrating elements are respectively provided for the moving (driving) directions.

Here, as shown in FIG. 1, in the case where a length of the body portion of the vibrating element 6 in the longitudinal direction (the direction in which the vibrating element 6 undergoes expansion and contraction by the application of the AC voltage), i.e., a length of the long side of the vibrating element 6 is determined to be a length L, the lower limit of the length L may be about 1 mm.

In the case where the length L of the body portion of the vibrating element 6 becomes less than 1 mm, the amplitude generated by the vibration of the contact portion 66 of the vibrating element 6 cannot overcome surface roughness of the rotor (driven element) 51. In other words, by setting the length L to 1 mm or more, the vibrating element 6 can undergo extension and contraction at a drive time so that the vibrating element 6 can overcome the surface roughness of the rotor (driven element) 51 in a direction to give the driving force to the rotor 51.

Figure 11:
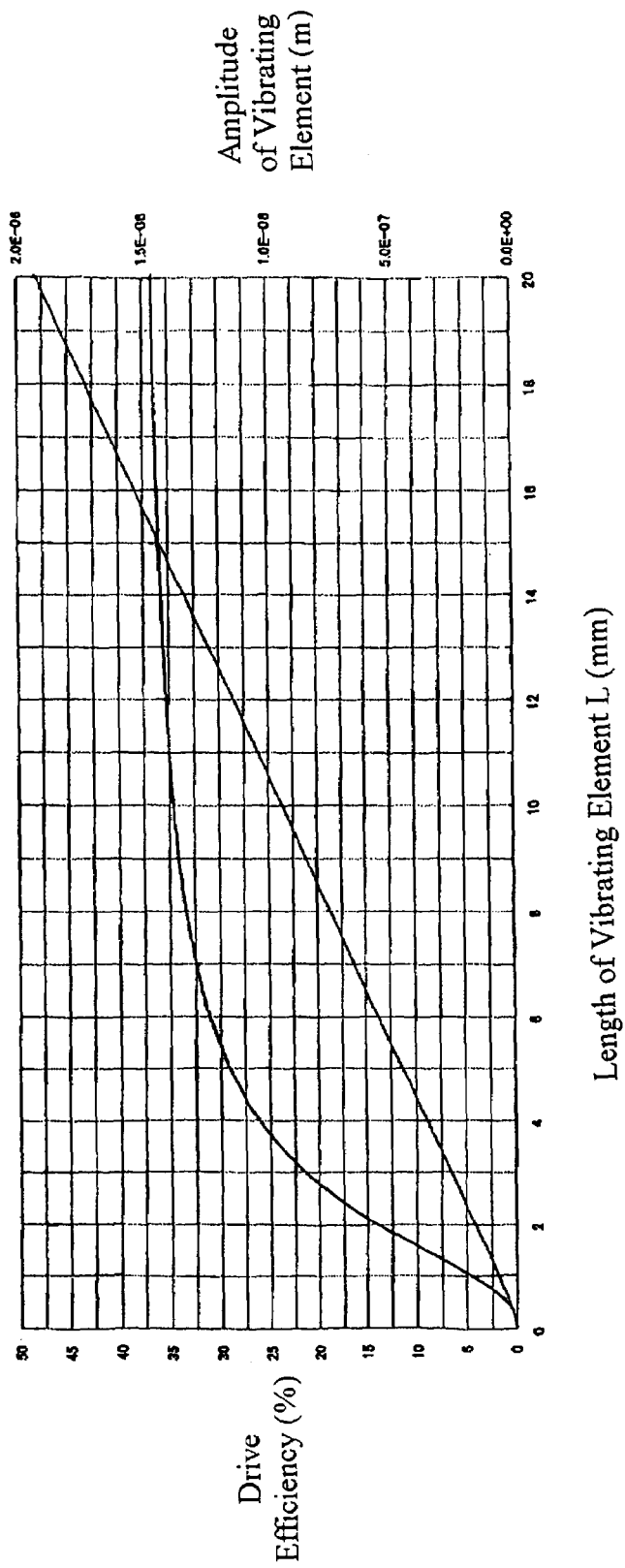
FIG. 11 is a graph showing amplitude and a drive efficiency of the vibrating element against the size of the vibrating element.

FIG. 11 is a graph showing amplitude of the vibrating element and a drive efficiency of the vibrating element against the size of the vibrating element. In this graph shown in FIG. 11, the horizontal axis represents a length L (mm) of the vibrating element 6, and the perpendicular axis represents amplitude (m) of the vibrating element and drive efficiency (%). A method of calculating the amplitude and the drive efficiency of the vibrating element 6 will be described later in detail.

As shown in FIG. 11, there is a turning point in the drive efficiency of the vibrating element 6 when the length L is near 1 mm. The drive efficiency goes down remarkably while the length L is less than 1 mm. Thus, in this electric instrument 1, the length L of the vibrating element 6 is to be determined at a range in which the length L is more than 1 mm. This makes it possible to drive the rotor (driven element) 51 suitably. Further, a change rate in the drive efficiency of the vibrating element 6 becomes smaller when the length L is more than 3 mm. Therefore, it is preferable that the length L of the vibrating element 6 is more than 3 mm in the electric instrument 1. Since a change in the drive efficiency due to uneven of the length L is prevented in this range, it is possible to drive the vibrating element 6 stably.

Moreover, it is more preferable that the length L of the vibrating element 6 is more than 4 mm. This makes it possible to improve the drive efficiency of the vibrating element 6 still more.

Figure 12:
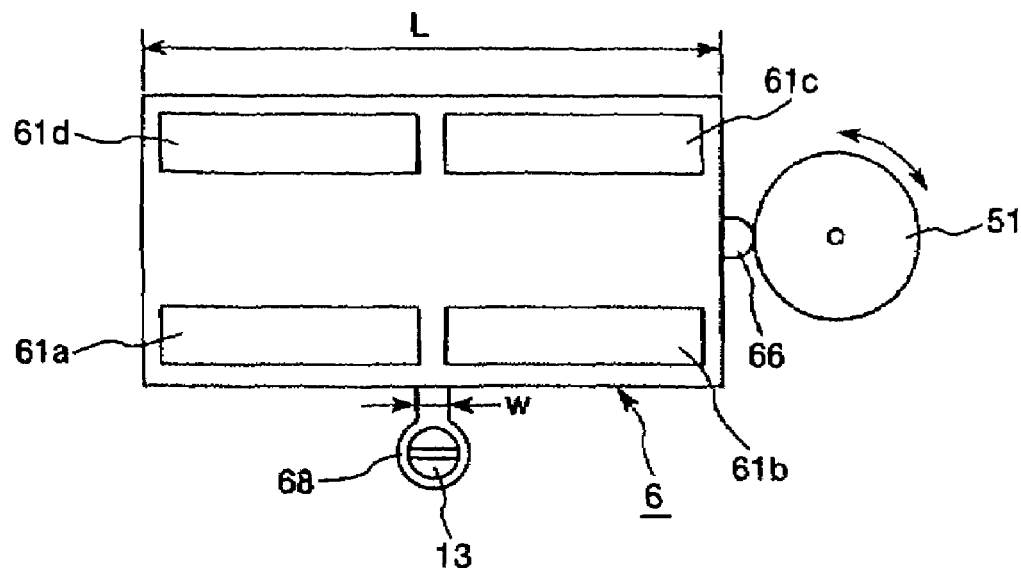
FIG. 12 is an explanatory drawing showing a method of calculating the amplitude and the drive efficiency of the vibrating element.
Figure 13:
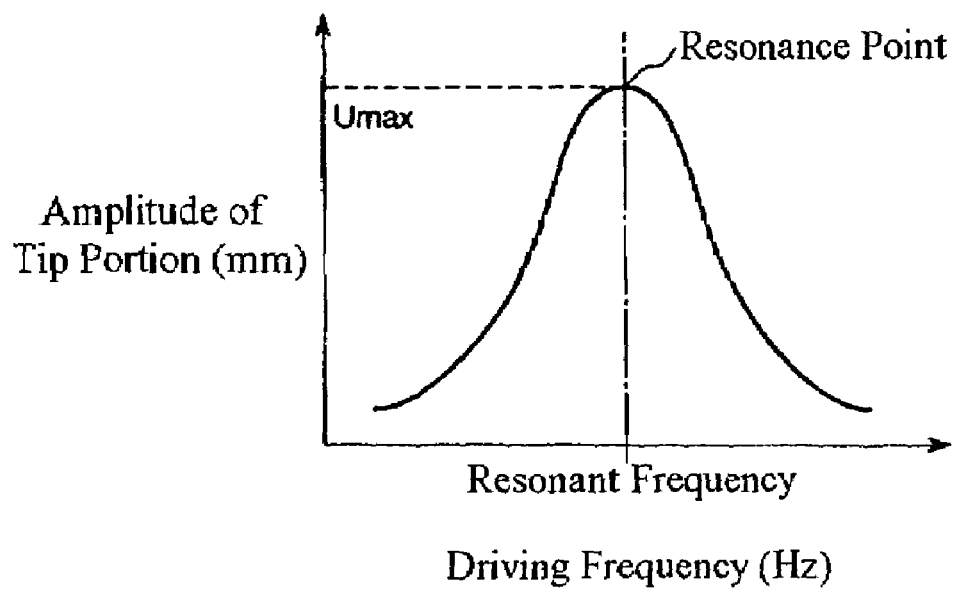
FIG. 13 is an explanatory drawing showing a method of calculating the amplitude and the drive efficiency of the vibrating element.

FIGS. 12 and 13 are explanatory drawings each showing a method of calculating the amplitude and the drive efficiency of the vibrating element. In this regard, the amplitude of the vibrating element 6 is calculated by measuring amplitude u of the tip portion of the contact portion 66. First, in the case where a drive frequency of the vibrating element 6 is not the resonant frequency, amplitude $u_0$ of the vibrating element 6 is calculated as follows.

$$U_0 = d \times V \times L$$

(where d is a piezoelectric constant, V is a voltage, and L is a length.)

The piezoelectric constant d is an inherent value depending on the quality of the material of the piezoelectric element 62, or 64.

Further, in the case where a drive frequency of the vibrating element 6 is the resonant frequency, amplitude u of the vibrating element 6 is calculated as follows.

$$u = Q \times d \times V \times L$$

(where Q is a mechanical quality coefficient.)

The mechanical quality coefficient Q is reciprocal of energy loss rate on the vibration per unit cycle of the vibrating element 6.

On the other hand, the drive efficiency η of the vibrating element 6 to the length (η=mechanical output/input voltage) has a relationship to the mechanical quality coefficient Q and an electromechanical coupling coefficient $k_v^2$ (the vibrational energy of the vibrating element/the electric power inputted into the vibrating element) as follows.

$$\eta \propto Q \times k_v^2$$

Thus, in the case where the correction coefficient is to be $C_1$, the drive efficiency η is calculated as follows.

$$\eta = C_1 \times Q \times k_v^2 \qquad (1)$$

In this regard, the mechanical quality coefficient Q is constituted from a loss rate $L_1$ due to pressurization, contact, internal loss, or the like, and a loss rate $L_2$ due to the arm portion 68 of the vibrating element 6. Here, the loss rate $L_1$ is thought of as a constant value. Further, it is thought that the loss rate $L_2$ is proportional to the ratio of the length L of the body portion of the vibrating element 6 in the longitudinal direction to the width w of the arm portion 68 (i.e., the ratio of L to w) (see FIG. 13). Therefore, the reciprocal of the mechanical quality coefficient is represented as follows.

$$1/Q = C_2(L_1 + L_2) = C_2(L_1 + w/L) \qquad (2)$$

(where $L_1$ and $C_2$ is constant.)

Furthermore, in the case where the volume of the entire vibrating element 6 and the volume of the piezoelectric element 62 or 64 are respectively $V_1$ and $V_2$, the electromechanical coupling coefficient $k_v^2$ is represented as follows.

$$k_v^2 = C_3 \times V_2/V_1 \quad (3)$$

(where $C_3$ is constant.)

By using the formulas mentioned above, the formula for thee drive efficiency of the vibrating element 6 is set up. Then, the drive efficiency η, the mechanical quality coefficient Q, and the electromechanical coupling coefficient $k_v^2$ are actually measured, the constant values $C_1$–$C_3$, and $L_1$ are calculated using the formulas (1)–(3) mentioned above. Thus, the drive efficiency η of the vibrating element 6 is calculated (computed).

Further, in the first embodiment of the present invention, the upper limit of the length L of the body portion of the vibrating element 6 in the direction in which the contact portion 66 protrudes is to be determined to about 20 mm. This reason is as follows.

In the case the electric instrument 1 receives shock from the outside due to fall or the like, a voltage due to this shock (hereinafter, it is referred to as "shock voltage.") occurs in the piezoelectric elements 62, 64. The longer the length L of the piezoelectric element 62 or 64 is, the larger the shock voltage becomes. When the shock voltage becomes more than a predetermined voltage value, a drive IC of the electric instrument 1 is electrically destroyed. Here, the endurance voltage for the drive IC is generally about the power supply voltage pulse 0.6V. For example, in a case of the electric instrument whose power supply voltage is 3.0V, the drive IC is electrically destroyed when the shock voltage becomes over 3.6V. Thus, the electric instrument 1 of the present invention has a characteristic on the point where the maximum value of the shock voltage is restricted (controlled) by adjusting the length L of the vibrating element 6. This makes it possible to prevent the drive IC from being electrically destroyed due to the shock such as fall or the like.

Figure 14:
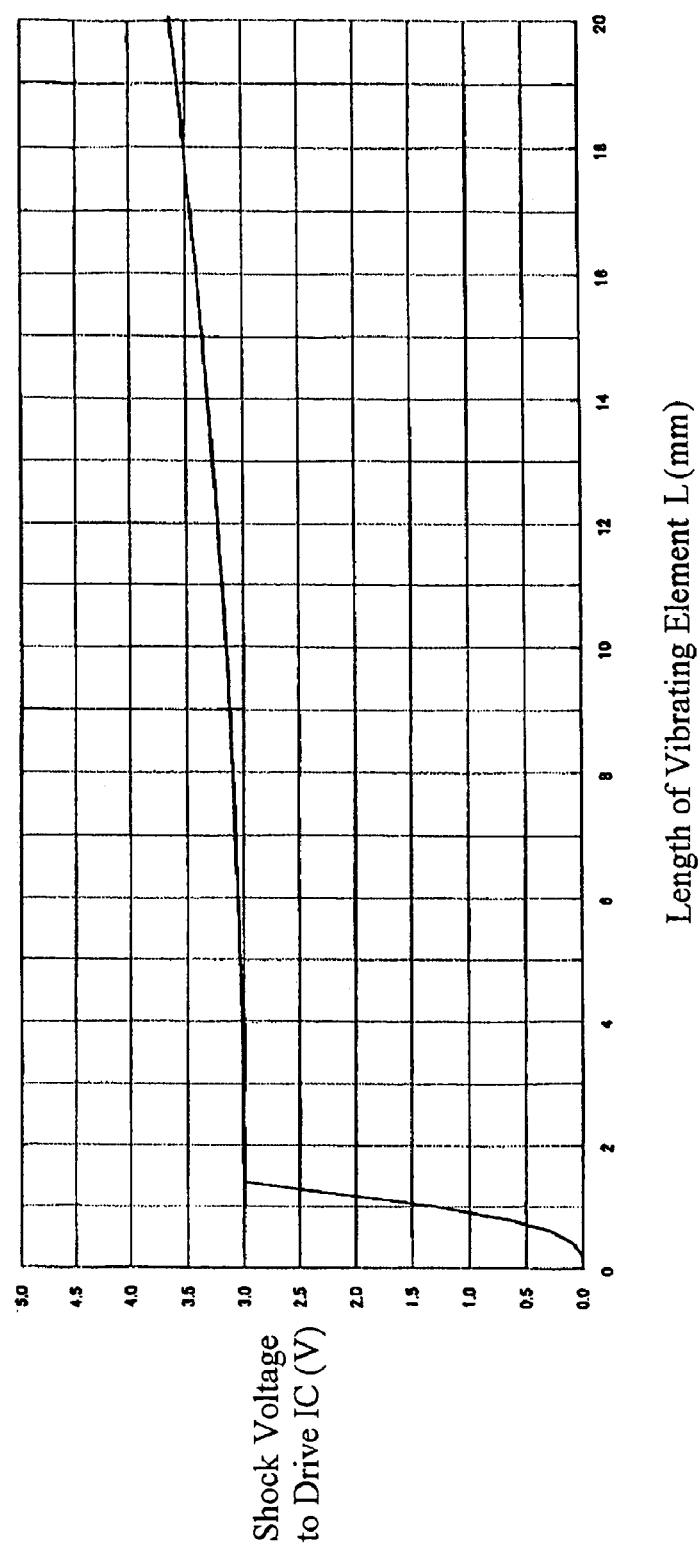
FIG. 14 is a graph showing a relationship between a size of a vibrating element and shock voltage to the drive IC.

FIG. 14 is a graph showing a relationship between a size of the vibrating element and the shock voltage to the drive IC. In this graph shown in FIG. 14, the horizontal axis represents the length L (mm) of the vibrating element 6, and the perpendicular axis represents shock voltage (V) applied to the drive IC. The shock voltage is measured against each of the lengths L of the vibrating element 6 by carrying out fall down test for the vibrating element 6. Here, a method of calculating the shock voltage will be described later in detail. Further, since the power supply voltage of the drive IC in this electric instrument 1 is 3.0V, it is preferable that the endurance voltage for the drive IC is 3.6V, and more preferable that it is 3.5V.

As shown in FIG. 14, the longer the length L of the vibrating element 6 is, the larger the shock voltage applied to the drive IC becomes. Thus, it is preferable that the length L of the vibrating element 6 is set so that the shock voltage applied to the drive IC becomes less than the endurance voltage for the drive IC. In other words, in the case where the shock voltage is generated in the piezoelectric elements 62, 64 by means of the shock that the vibrating element 6 receives, it is preferable that the voltage applied to the drive IC in this shock voltage becomes less than the endurance voltage for the drive IC. For example, in this fall down test, the shock voltage applied to the drive IC exceeds 3.6V, i.e., the endurance voltage for the drive IC in the case where the length L is over 20 mm. Therefore, in the electric instrument 1, the upper limit of the length L of the vibrating element 6 is to be determined to about 20 mm.

This makes it possible to effectively prevent (inhibit) the electrical breakage of the drive IC due to fall or the like.

Further, in the case where the endurance voltage is set to 3.5V more strictly, it is preferable that the upper limit of the length L of the vibrating element 6 is about 18 mm. Thus, since the electric instrument 1 can have a margin (or clearance) between the shock voltage and the endurance voltage for the drive IC, it is possible to prevent the electrical breakage of the drive IC more surely.

Moreover, it is more preferable that the length L of the vibrating element 6 is less than 13 mm, and it is further more preferable that the length L is less than 7 mm. Thus, since the electric instrument 1 can have larger margin (or clearance), it is possible to prevent the electrical breakage of the drive IC still more surely even though variation in the value of resistance of a protection diode is wide.

Figure 15:
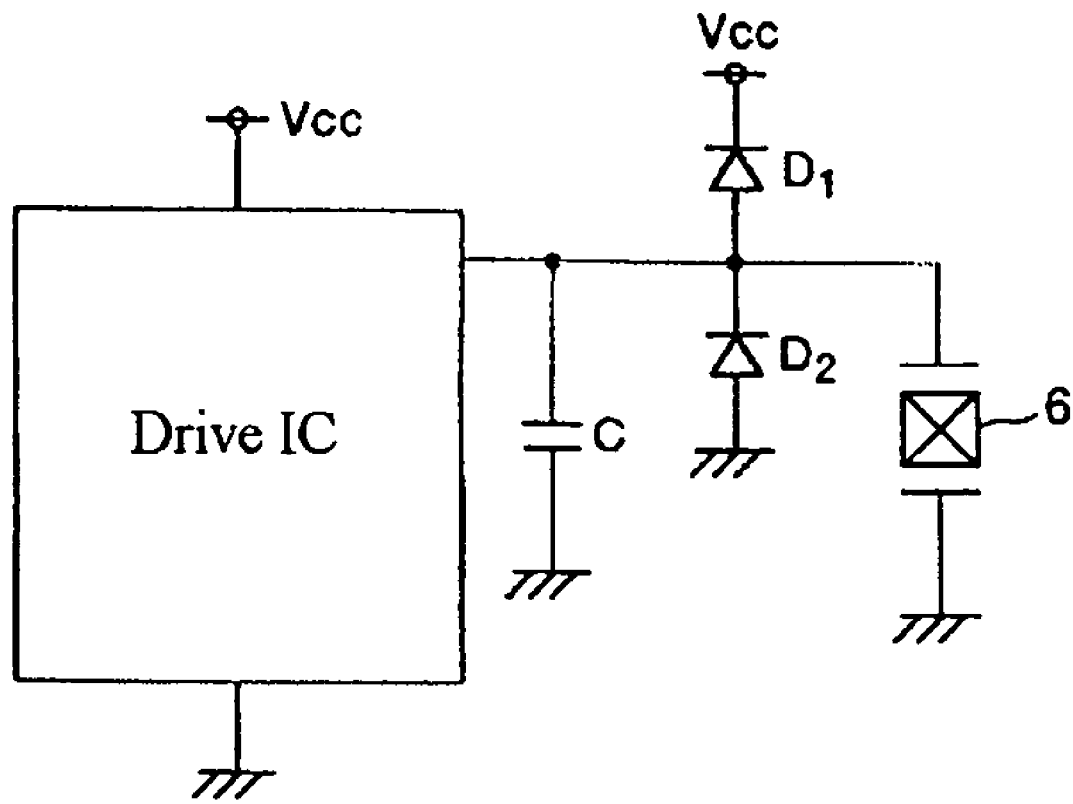
FIG. 15 is an explanatory drawing showing a method of calculating the shock voltage to the drive IC.

FIG. 15 is an explanatory drawing showing a method of calculating the shock voltage applied to the drive IC. The circuit shown in FIG. 15 is an equivalent circuit of a protection circuit of the drive IC that a general electric instrument has. Further, in the drawing, symbol Vcc represents a power supply voltage, symbols $D_1$, $D_2$ each represents a protection diode for protecting the drive IC, and symbol C represents a capacitor having an equivalent capacity of the drive IC. In this regard, values of forward resistance of the protection diodes $D_1$, $D_2$ is 0.1Ω, capacitance of the capacitor C is less than 100 pF. The calculation of the shock voltage is carried out by the fall down test.

In FIG. 15, when it is determined that a potential energy that the vibrating element 6 has while falling is $U_0$, and an energy converted into an electric energy in the potential energy is $U_e$, these energies are as follows.

$U_0 \propto$ a potential energy of the vibrating element 6 before fall $$U_e \propto U_0$$

Therefore, the converted energy $U_e$ is as follows.

$$U_e = C_4 \times mgh$$

(where m is mass of the vibrating element 6, h is a falling distance, and $C_4$ is a proportionality constant.)

Here, in the case where the capacitance of the piezoelectric elements 62, 64 is C, an electric charge generated in the vibrating element 6 is represented as follows.

$$q0 = \sqrt{2CuUe}$$

Further, a quantity of electric charge $q_v$ flowing through either the protection diode D1 or D2 is represented as follows.

$$Q_v = q_0 - Vcc \times C_u'$$

(when $q_v > 0$ and $q_0 - Vcc \times C_u' < 0$, $q_v = 0$)

In this regard, the current flows through the protection diode D1 when a high voltage is generated in the drive IC, while the current flows through the protection diode D2 when a low voltage is generated in the drive IC. Since only the breakage of the drive IC is a problem, it is thought about only a case where a high voltage is applied to the drive IC.

Next, in the case where discharge duration of the electric charge, i.e., collision time of the vibrating element 6 against the ground is Δt, and discharge waveform is sine wave, the peak value $I_{max}$ of the flowing current is represented as follows.

$$i_{max} = \sqrt{2} \frac{q_v}{\Delta t}$$

In the case where values of forward equivalent resistance of the protection diodes $D_1$, $D_2$ is R, the voltage $V_{max}$ applied to the drive IC is represented as follows.

$$V_{max}=R \times I_{max}$$

(when $q_v>0$, and $q_v<0$, $V_{max}=q_0/C_u'$)

In this regard, the proportionality constant C4 and the collision time Δt are obtained from the waveform of the voltage generated while the vibrating element 6 falls.

Further, in the first embodiment of the present invention, it is preferable that the length L of the body portion of the vibrating element 6 is to be determined in consideration of the maximum stress generated in the piezoelectric elements 62, 64.

Figure 16:
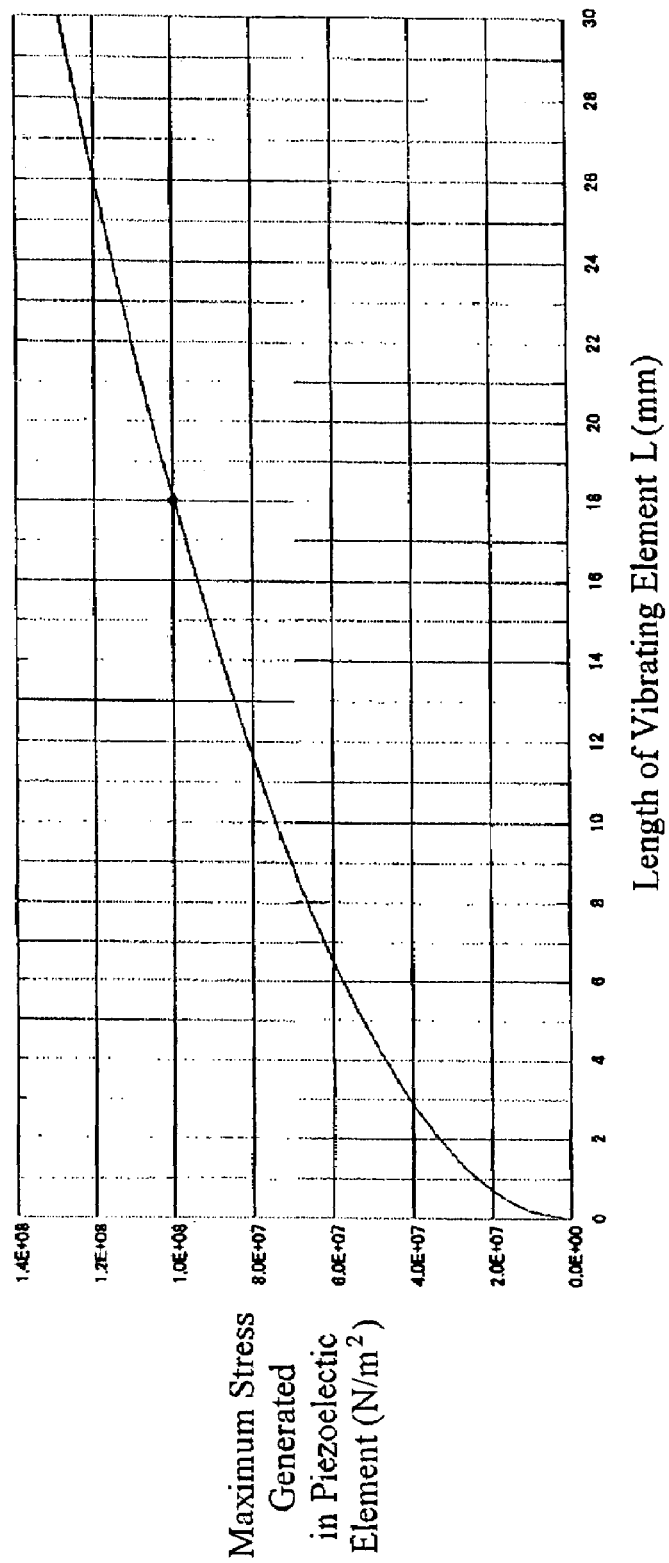
FIG. 16 is a graph showing a relationship between the size and a maximum stress generated in a piezoelectric element.

FIG. 16 is a graph showing a relationship between the size and a maximum stress generated in a piezoelectric element. In this graph shown in FIG. 16, the horizontal axis represents the length L (mm) of the vibrating element 6, and the perpendicular axis represents the maximum stress (N/m$^2$) generated in the piezoelectric elements 62, 64. The maximum stress is a maximum value of the stress generated in the piezoelectric elements 62, 64 when the vibrating element 6 receives the shock from the outside due to fall or the like. The maximum stress is measured against each of the length L of the vibrating element 6 by means of the fall down test for the vibrating element 6. Here, FIG. 16 is the graph in which the width W of the arm portion 68 for supporting the vibrating element 6 (see FIG. 12) is 0.5 mm. a method of calculating the maximum stress will be described later in detail.

As shown in FIG. 16, the longer the length L of the vibrating element 6 is, the larger the maximum stress that the piezoelectric elements 62, 64 receives at a shock time becomes. Thus, the electric instrument 1 of the present invention has a characteristic on the point where physical breakage of the piezoelectric elements 62, 64 due to the shock is restricted (controlled) by adjusting the length L of the vibrating element 6.

More specifically, the maximum stress that the piezoelectric elements 62, 64 receive at the shock time is calculated, and then the length L of the vibrating element 6 is adjusted so that the maximum value is less than a permissible stress of the piezoelectric elements 62,64. For example, it is known that the endurance stress of the piezoelectric elements 62, 64 made from plumbum zirconate titanate (PZT) is 1×10$^8$ (N/m$^2$). In FIG. 16, when the length L of the vibrating element 6 is over 18 mm, the shock stress that the piezoelectric elements 62, 64 receive exceeds the permissible stress. Thus, it is preferable that the length L of the vibrating element 6 in the longitudinal direction is less than 18 mm in the electric instrument 1. This makes it possible to restrict the maximum stress generated in the piezoelectric elements 62, 64 at the shock time to less than the permissible stress. Therefore, it is possible to effectively prevent the physical breakage of the piezoelectric elements 62, 64 due to the shock.

Further, even though the maximum stress generated in the piezoelectric elements 62, 64 at the shock time is less than the permissible stress, there is a case where the drive characteristics of the vibrating element 6 diminish (come down) due to outbreak of minor defect in the piezoelectric elements 62, 64. For example, in the piezoelectric elements 62, 64 made from plumbum zirconate titanate (PZT), the drive characteristics of the vibrating element 6 diminish at the range between 6×10$^7$ to 1×10$^8$ (N/m$^2$). Thus, in the electric instrument 1, it is preferable that the length L of the vibrating element is less than 7 mm based on the graph shown in FIG. 16. This makes it possible to prevent the breakage of the piezoelectric elements 62, 64 more surely while maintaining the drive characteristics of the vibrating element 6.

Moreover, it is more preferable that the length L of the vibrating element 6 is less than 6 mm. Thus, since the electric instrument 1 can have a margin (or clearance) between the maximum stress generated at the shock time and the permissible stress of the piezoelectric elements 62, 64, it is possible to prevent the physical breakage of the piezoelectric elements 62, 64 more surely.

In this regard, the permissible stress of the piezoelectric elements 62, 64 varies according to quality of material thereof. Therefore, it is preferable that the length L of the vibrating element 6 is appropriately design-changed within an obvious scope of one skilled in the art in consideration with the quality of material of the piezoelectric elements 62, 64.

Figure 17:
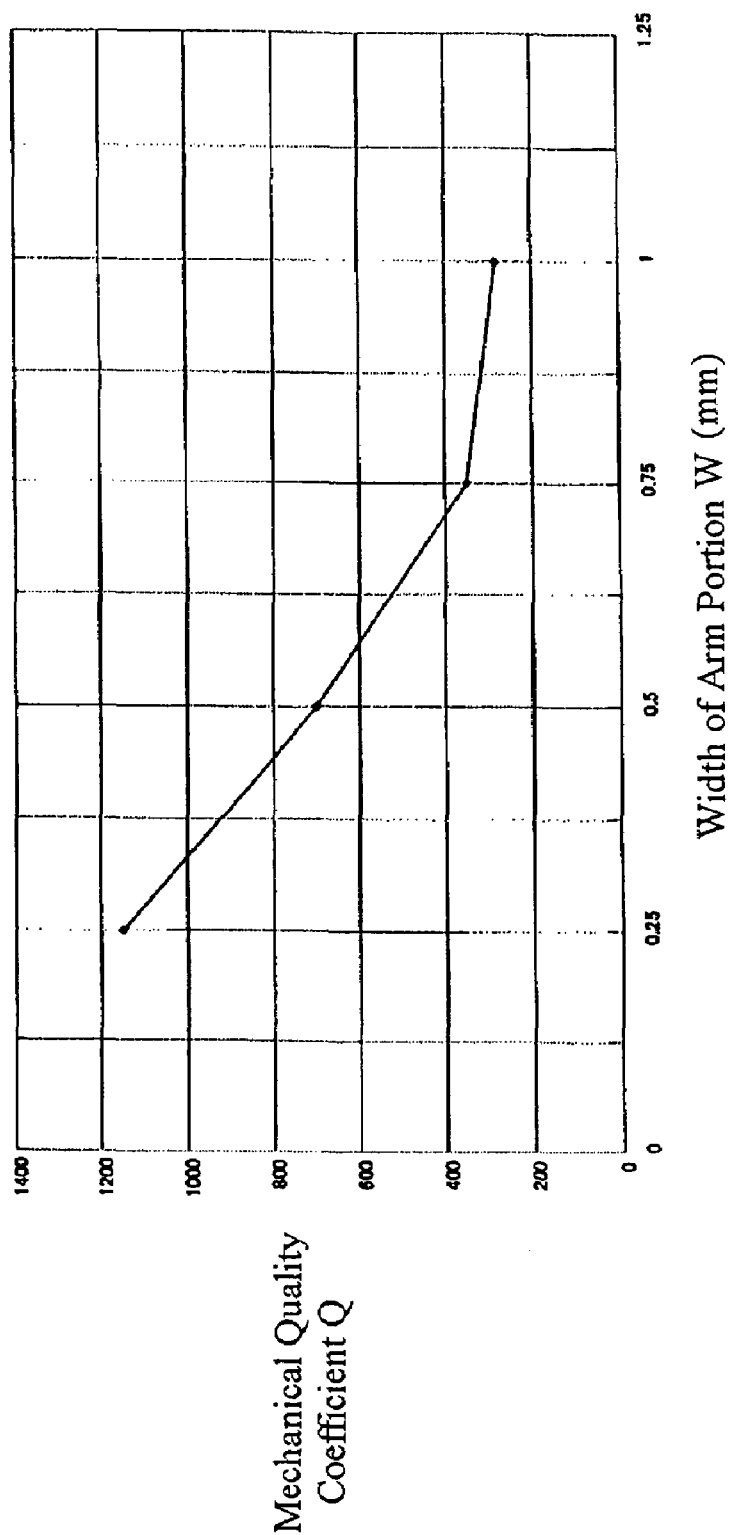
FIG. 17 is a graph showing a relationship between a width of an arm portion and a mechanical quality coefficient.

Here, the maximum stress that the piezoelectric elements 62, 64 receive may vary according to the width w of the arm portion 68 for supporting the vibrating element 6 (see FIG. 12). FIG. 17 is a graph showing a relationship between the width of the arm portion and the mechanical quality coefficient.

As shown in the graph in FIG. 17, the larger the width w of the arm portion 68 is, the more the mechanical quality coefficient Q goes down (decrease). Further, the drive characteristics of the vibrating element 6 goes down markedly when the mechanical quality coefficient Q becomes less than 700. Thus, it is preferable that the width w of the arm portion 68 is less than 0.5 mm so that the mechanical quality coefficient Q becomes more than 700. Thus, in the graph shown in FIG. 16, the width w of the arm portion 68 for supporting the vibrating element 6 is set to 0.5 mm, namely, the upper limit of the width w.

Figure 18:
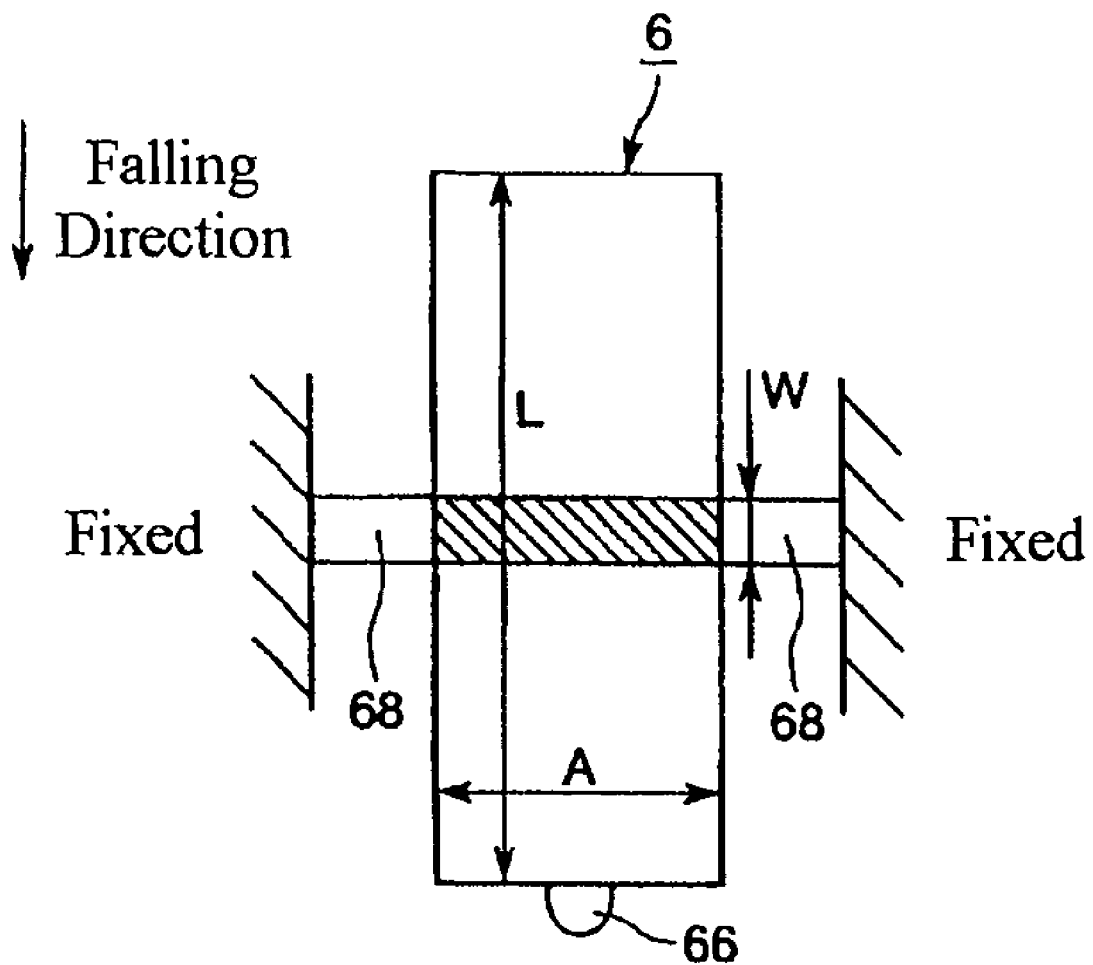
FIG. 18 is an explanatory drawing showing a method of measuring the maximum stress generated in the piezoelectric element.

FIG. 18 is an explanatory drawing showing a method of measuring the maximum stress generated in the piezoelectric element. FIG. 18 shows a method of measuring the maximum stress generated in the piezoelectric element 62, 64 when shock is applied to the vibrating element 6 from the outside thereof. Generally, in a portable electric instrument such as a watch or the like, it is required that the piezoelectric elements 62, 64 of the vibrating element 6 does not break even though it is fallen from the height of 1 m to a concrete floor. In this case, impact acceleration applied to the vibrating element 6 becomes 10,000 (G) at this time. Thus, in this measuring method, the maximum stress generated in the piezoelectric elements 62, 64 when shock is applied to the vibrating element 6 by falling it is measured. In this fall down test, the piezoelectric element made from plumbum zirconate titanate (PZT) is utilized.

In FIG. 18, the reinforcing plate 63 of the vibrating element 6 has arm portions 68, 68 at central portions of both side surfaces in the longitudinal direction of the vibrating element 6, respectively, and the vibrating element 6 is fixedly provided between walls by means of the arm portions 68, 68. Impact acceleration is applied to the vibrating element 6 by falling it from the height of about 1 m. This makes the shadow area in FIG. 18 be broken. This is because energy of movement generated by the fall of the vibrating element 6 is consumed as (converted into) distortion of the shadow area. In this regard, the energy of movement T that the vibrating element 6 obtains by the impact acceleration is represented as follows.

$$T = m \times v^2/2$$
$$= m \times (\alpha \times t_0)^2/2$$

Since the mass of the vibrating element 6 is represented as m=ρ×L×A×t, T is represented as follows.

$$T = \rho \times L \times A \times t \times (\alpha \times t_0)^2/2 \quad (4)$$

On the other hand, since the width w of the arm portion 68 is narrow, the stress σ is constant in this area. Thus, distortion energy U is represented as follows.

$$U = \frac{\sigma^2}{2E}(B \times w \times t) \quad (5)$$

When the formula is transformed as T=U using the formulas (4) and (5) mentioned above, the following formula is obtained.

$$\sigma = \alpha \times t_0 \times \sqrt{E \times \rho \times \frac{L}{w}} \quad (6)$$

The maximum stress is calculated using the formula (6).

Here, as shown in FIG. 1, in the case where a length of the body portion of the vibrating element 6 in a direction substantially perpendicular to the longitudinal direction (the length of the body portion in the direction substantially perpendicular to the direction in which the contact portion 66 protrudes), i.e., a length of the short side of the vibrating element 6 is determined to be a width length A (hereinafter, it is merely referred to as the width A), the width A is not especially limited. However, it is preferable that the width A is about 0.1 to 6.0 mm. Further, it is more preferable that the width A is about 0.2 to 2.0 mm.

In the case where the width A is less than 0.1 mm, adhesive force between the reinforcing plate 63 and each of the piezoelectric elements 62, 64 is deficient. Thus, there is a case where they are separated from each other (peel off) when the vibrating element 6 falls. Further, in the case where the width A is less than 0.2 mm, deterioration of the drive characteristics may occur.

On the other hand, in the case where the width A becomes larger than 6 mm, longitudinal vibration in the width direction becomes unignorable. Thus, since amplitude of vibration of the arm portion 68 becomes larger, the drive efficiency of the vibrating element 6 goes down. Since influence on the longitudinal vibration in the width direction is nearly unrecognized when the width A is less than 2 mm, it is more preferable that the width A is less than 2 mm.

Further, in the electric instrument 1, a planar structure of the body portion of the vibrating element 6 is a substantially rectangular shape. This is preferable because the number of products becomes large and a yield rate is improved when the piezoelectric elements 62, 64 of the vibrating element 6 are manufactured by dice cutting (dicing) or the like.

Moreover, the vibrating element 6 (the body portion of the vibrating element 6) has a thinner plate-shaped structure. This is preferable on the point that it is possible to make the electric instrument 1 thinner.

However, the present invention is not limited to these. In the present invention, the shape and thickness of the vibrating element 6 (the body portion) is not especially limited.

Further, in the first embodiment of the present invention, an electro-optic instrument is mentioned as an example of the electric instrument 1. However, the present invention is not limited to this instrument. The ultrasonic motor and the operating apparatus mentioned above may be applied to other electric instruments. Moreover, in the electric instrument 1, the rotor 51 (the diaphragm portion 5) is used as a driven element, and the switching mechanism for the diaphragm portion of the optical system is constituted by driving the vibrating element 6.

However, the present invention is not limited to this constitution. A switching mechanism for the optical system (optical apparatus) such as a switching mechanism for the filter, mechanical shutter mechanism, or the like may be constructed using other driven element.

Further, the switching mechanism mentioned above can have at least one of the diaphragm portion, the filter portion, and the mechanical shutter, for example.

Second Embodiment

Next, a description will be given for a second embodiment of the present invention.

Figure 19:
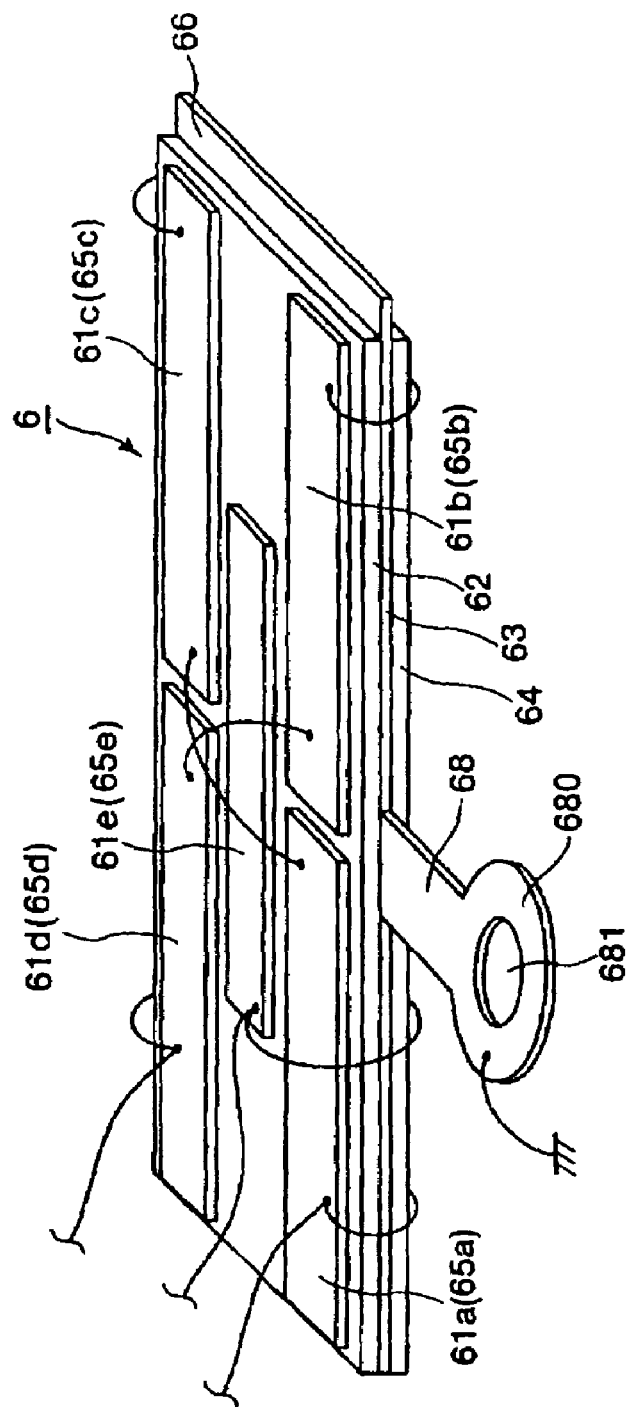
FIG. 19 is a perspective view of a vibrating element in a second embodiment of an electric instrument according to the present invention.
Figure 20:
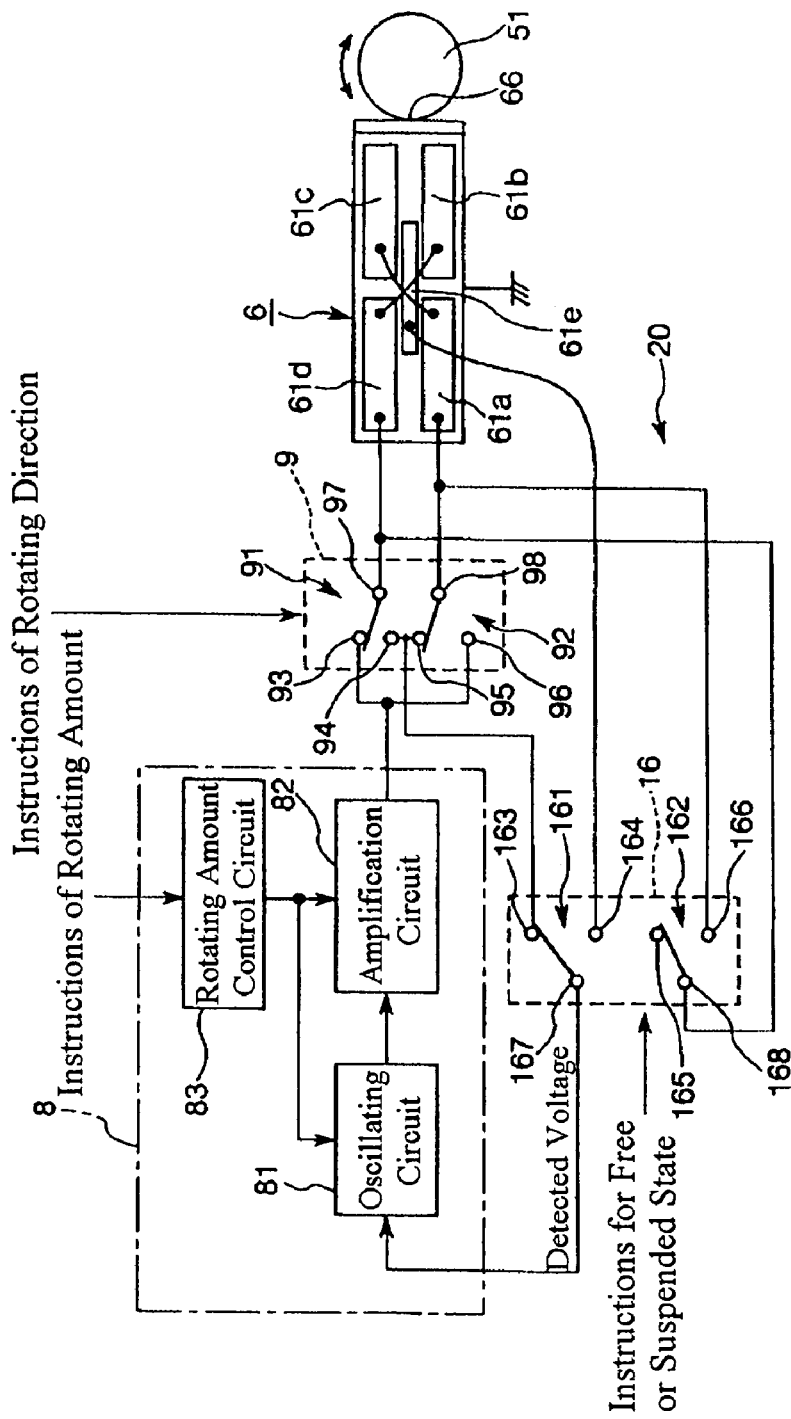
FIG. 20 is a block diagram illustrating circuitry of a conducting circuit in the second embodiment.

FIG. 19 is a perspective view of a vibrating element in a second embodiment of an electric instrument according to the present invention. FIG. 20 is a block diagram illustrating circuitry of a conducting circuit in the second embodiment according to the present invention.

Hereinafter, an electric instrument 1 in the second embodiment will be described, focusing on different points between the above-mentioned first embodiment and the second embodiment. In this regard, explanation of items including the same matters and the like is omitted.

The electric instrument 1 in the second embodiment has a first mode in which a rotor 51, i.e., a diaphragm portion 5 is maintained in a stopping state; a second mode in which the rotor 51 can be rotated (the rotor 51 lies in a free state), i.e., the diaphragm portion 5 can be displaced (the diaphragm portion 5 lies in a free state); a third mode in which the rotor 51 is rotated in a forward direction; and a fourth mode in which the rotor 51 is rotated in a reverse direction. The electric instrument 1 is adapted to select one of the first, second, third, and fourth modes by selecting any of conducting patterns to each of electrodes to change a vibrating pattern of a vibrating element 6. Hereinafter, more specific explanations will be given as follows.

As shown in FIG. 19, in the vibrating element 6, five plate-shaped electrodes 61a, 61b, 61c, 61d, and 61e are disposed at the upper side of a piezoelectric element 62 in FIG. 19, while five plate-shaped electrodes 65a, 65b, 65c, 65d, and 65e are disposed at the lower side of a piezoelectric element 64 in FIG. 19. (The electrodes 65a, 65b, 65c, 65d, and 65e are not shown in FIG. 19, but reference numerals of these electrodes are merely designated using parentheses.)

In other words, the piezoelectric element 62 is substantially equally divided (partitioned) into four rectangular areas. The rectangular electrodes 61a, 61b, 61c, and 61d are respectively disposed at the divided areas. In a same way, the piezoelectric element 64 is divided (partitioned) into four rectangular areas. The rectangular electrodes 65a, 65b, 65c, and 65d are respectively disposed at the divided areas.

Further, the rectangular electrode 61e is disposed at the middle of the piezoelectric element 62, while the rectangular electrode 65e is disposed at the middle of the piezoelectric element 64. The longitudinal direction of each of the electrodes 61e, 65e substantially corresponds with that (the long side direction) of the vibrating element 6. The electrodes 61e and 65e are detecting electrodes that are used for detecting a voltage to be induced between a reinforcing plate 63 and each of electrodes 61e, 65e, i.e., a voltage to be induced (an induced voltage) in response to a component in a longitudinal direction of the vibration of the vibrating element 6 (i.e., a component of the longitudinal vibration). Further, the electrodes 61e, 65e are respectively used at the second mode.

In this case, the electrodes 65a, 65b, 65c, 65d, and 65e are disposed at the back faces of the electrodes 61a, 61b, 61c, 61d, and 61e, respectively.

The electrodes 61a, 61c lying at one diagonal line in a front face are electrically connected to the electrodes 65a, 65c lying at a corresponding diagonal line in the back face. In a same way, the electrodes 61b, 61d lying at the other diagonal line in the front face are electrically connected to the electrode 65b, 65d lying at corresponding diagonal line in the back face. (Hereinafter, to "electrically connect" is merely referred to as "connected.")

As shown in FIG. 20, the conducting circuit 20 of the electric instrument 1 in the second embodiment has: a switch 9; a switch 16; and a drive circuit 8 provided with an oscillating circuit 81, an amplification circuit 82, and a rotating amount control circuit 83.

The switch 9 is switching means for switching between conducting electrodes and electrodes to be used as vibration detecting means. When the switch 9 is switched, a rotative direction of the rotor 51 can be changed.

The switch 9 has two switching sections 91, 92 that operate simultaneously with each other. The electrode 61d of the vibrating element 6 is connected to a terminal 97 of the switching section 91. The electrode 61a is connected to a terminal 98 of the switching section 92.

Further, each of a terminal 93 of the switching section 91 and a terminal 96 of the switching section 92 is connected to an output side of the amplification circuit 82 in the drive circuit 8. An AC voltage is applied from the amplification circuit 82 to each of the terminals 93, 96.

The reinforcing plate 63 of the vibrating element 6 is connected to ground.

Further, each of a terminal 94 of the switching section 91 and a terminal 95 of the switching section 92 is connected to an input side of the oscillating circuit 81 in the drive circuit 8.

The switch 16 has two switching sections 161, 162 that operate simultaneously with each other.

A terminal 163 of the switching portion 161 is connected to the terminals 94, 95 of the switch 9. A terminal 164 is connected to the electrode 61e of the vibrating element 6.

Further, a terminal 167 of the switching portion 162 is connected to the input side of the oscillating circuit 81 in the drive circuit 8.

A terminal 166 of the switching portion 162 is connected to the terminal 98 of the switch 9 and the electrode 61a of the vibrating element 6. A terminal 168 is connected to the terminal 97 of the switch 9 and the electrode 61d of the vibrating element 6.

In this regard, explanation of the drive circuit 8 will be omitted because it is the same as one in the first embodiment described above.

Next, each of the above-mentioned modes will be described.

In the first mode, there does not occur excitation with relative to the vibrating element 6. In other words, an electric power is not supplied to any of the above-mentioned electrodes. In this case, since the contact portion 66 of the vibrating element 6 abuts on (is pressed to) the rotor 51, and the rotor 51 is maintained in a stopping state by frictional force between the contact portion 66 and the rotor 51. This makes it possible to maintain the diaphragm portion 5 in a stopping state. Namely, it is possible to prevent the diaphragm portion 5 from being moved, and to maintain the diaphragm portion 5 at a desired position.

In the second mode, vibration is excited in a direction substantially perpendicular to a tangent line at a portion where the outer circumferential surface 511 of the rotor 51 abuts on the contact portion 66. In other words, an electric power is supplied to the electrodes 61a, 61b, 61c, 61d, 65a, 65b, 65c, and 65d at both diagonal lines of both surfaces of the vibrating element 6, whereby an AC voltage is applied between the reinforcing plate 63 and each of the electrodes 61a, 61b, 61c, 61d, 65a, 65b, 65c, and 65d. This makes the vibrating element 6 repeatedly undergo extension and contraction in its longitudinal direction (in its long side direction), i.e., vibrate (longitudinally vibrate) with minute amplitude in its longitudinal direction. In other words, the contact portion 66 of the vibrating element 6 undergoes vibration (reciprocates) in its longitudinal direction (in its long side direction).

When the vibrating element 6 undergoes contraction, the rotor 51 is away from the contact portion 66 so that frictional force between the rotor 51 and the contact portion 66 disappears or decreased and therefore the rotor 51 is in a free state. Thus, the rotor 51 can be freely rotated in both counterclockwise and clockwise directions in FIG. 20. This makes it possible to freely move the diaphragm portion 5. On the other hand, when the vibrating element 6 undergoes extension, the rotor 51 receives pushing force from the contact portion 66. However, since the direction of the pushing force is substantially perpendicular to the tangent line, the rotor 51 rotates in neither the counterclockwise direction nor the clockwise direction in FIG. 20, and therefore the diaphragm portion 5 does not move.

Thus, the rotor 51, i.e., the diaphragm portion 5 lies in a free state by vibration of the vibrating element 6, and can freely move in both directions.

In the third mode, vibration is excited, which at least has a displacing component of vibration in the forward rotating direction of the rotor 51 (the circumferential direction component S2 shown in FIG. 8). In other word, an electric power is supplied to the electrodes 61a, 61c, 65a, and 65c that are located at one diagonal line of the vibrating element 6, whereby an AC voltage is applied between the reinforcing plate 63 and each of the electrodes 61a, 61c, 65a, and 65c. As mentioned in the first embodiment, this makes the rotor 51 rotate in a counterclockwise direction in FIG. 20 (in the forward direction). At this time, the electrodes 61b, 61d, 65b, and 65d located at the other diagonal line of the vibrating element 6 to which the electric power is not applied are used as vibration detecting means for detecting vibration of the vibrating element 6.

In the fourth mode, vibration is excited, which at least has a displacing component of vibration in the reverse rotating direction of the rotor 51 (the circumferential direction component S2 shown in FIG. 9). In other word, an electric power is supplied to the electrodes 61b, 61d, 65b, and 65d that are located at one diagonal line of the vibrating element 6, whereby an AC voltage is applied between the reinforcing plate 63 and each of the electrodes 61b, 61d, 65b, and 65d. As mentioned in the first embodiment, this makes the rotor 51 rotate in a clockwise direction in FIG. 20 (in the reverse direction). At this time, the electrodes 61*a*, 61*c*, 65*a*, and 65*c* located at the diagonal line of the vibrating element 6 to which the electric power is not applied are used as vibration detecting means for detecting vibration of the vibrating element 6.

Next, the operation of the electric instrument 1 will be explained with reference to FIG. 20.

In a state where the power switch is ON, when instructions for stopping/freeing the rotor 51 (diaphragm portion 5) and instructions for a rotative direction and a rotating amount (for example, rotation number and rotation angle) of the rotor 51 are given, the switch 9, the switch 16, and the rotating amount control circuit 83 of the drive circuit 8 are operated based on such instructions. Namely, any one of the first mode, the second mode, the third mode, and the fourth mode described above is established In the case (of the third mode) where instructions indicate that the rotor 51 is to be rotated in the counterclockwise direction in FIG. 20 (in the forward direction), the switch 16 is switched so that the terminal 163 and the terminal 167 of the switch 16 are connected, and the terminal 165 and the terminal 168 of the switch 16 are connected, while the switch 9 is switched so that the terminal 94 and the terminal 97 of the switch 9 are connected, and the terminal 96 and the terminal 98 of the switch 9 are connected. Thus, the output side of the amplification circuit 82 in the drive circuit 8 is conducted to the electrodes 61*a*, 61*c*, 65*a*, and 65*c* of the vibrating element 6, and the input side of the oscillating circuit 81 in the drive circuit 8 is conducted to the electrodes 61*b*, 61*d*, 65*b*, and 65*d* of the vibrating element 6.

Each of the oscillating circuit 81 and the amplification circuit 82 of the drive circuit 8 is controlled by the rotating amount control circuit 83.

An AC voltage outputted from the oscillating circuit 81 is amplified by the amplification circuit 82 and then applied between the reinforcing plate 63 and each of the electrodes 61*a*, 61*c*, 65*a*, and 65*c*. Thus, as mentioned above, each of the portions corresponding to the electrodes 61*a*, 61*c*, 65*a*, and 65*c* of the vibrating element 6 undergoes expansion and contraction repeatedly, and the contact portion 66 of the vibrating element 6 undergoes vibration (reciprocates) in a slanting direction as represented by the arrow b shown in FIG. 8, and vibrates (moves) in an elliptical manner as represented by the arrow c shown in FIG. 8. The rotor 51 receives the frictional force (pushing force) from the contact portion 66 when the portions corresponding to the electrodes 61*a*, 61*c*, 65*a*, and 65*c* of the vibrating element 6 are extended, and this repeating frictional force (pushing force) moves (rotates) the rotor 51 in the counterclockwise direction in FIG. 1 (in the forward direction).

When the diaphragm portion 5 rotates in the counterclockwise direction in FIG. 1 (in the forward direction) together with the rotor 51, the diaphragm portion 5 moves (rotates) in the same direction.

At this time, the electrodes 61*b*, 61*d*, 65*b*, and 65*d* to which an AC voltage is not applied (not activated) function as detecting electrodes that are used to detect a voltage to be induced between the reinforcing plate 63 and each of the electrodes 61*b*, 61*d*, 65*b*, and 65*d* (induced voltage).

The detected induced voltage (detected voltage) is inputted to the oscillating circuit 81, and then based on such detected voltage, the oscillating circuit 81 outputs an AC voltage having a frequency (resonant frequency) at which amplitude of the vibrating element 6 becomes maximum, namely, the detected voltage becomes maximum. This makes it possible to move the diaphragm portion 5 efficiently.

Further, the rotating amount control circuit 83 controls operation for conducting to each of those electrodes based on the instructed rotating amount (target value) of the rotor 51.

Namely, the rotating amount control circuit 83 allows the oscillating circuit 81 and the amplification circuit 82 to activate until the rotating amount of the rotor 51 reaches the instructed rotating amount (target value) of the rotor 51, thereby driving the vibrating element 6 and rotating the rotor 51.

On the contrary thereto, in the case (of the fourth mode) where the instructions indicate that the rotor 51 is to be rotated in the clockwise direction in FIG. 20 (in the reverse direction), as shown in FIG. 20, the switch 16 is switched so that the terminal 163 and the terminal 167 of the switch 16 are connected, and the terminal 165 and the terminal 168 of the switch 16 are connected, while the switch 9 is switched so that the terminal 93 and the terminal 97 of the switch 9 are connected, and the terminal 95 and the terminal 98 of the switch 9 are connected. Thus, the output side of the amplification circuit 82 in the drive circuit 8 is conducted to the electrodes 61*b*, 61*d*, 65*b*, and 65*d* of the vibrating element 6, and the input side of the oscillating circuit 81 in the drive circuit 8 is conducted to the electrodes 61*a*, 61*c*, 65*a*, and 65*c* of the vibrating element 6. Since the following operations are the same as those of the case where the instructions indicate that the rotor 51 is to be rotated in the counterclockwise direction in FIG. 20, a description thereof will be omitted.

In the case (of the first mode) where the instructions indicate that the rotor 51, i.e., the diaphragm portion 5 is to be kept in the stopping state, as shown in FIG. 20, the switch 16 is switched so that the terminal 163 and the terminal 167 of the switch 16 are connected, and the terminal 165 and the terminal 168 of the switch 16 are connected.

The rotating amount control circuit 83 does not allow the oscillating circuit 81 and the amplification circuit 82 to activate. Namely, an AC voltage is not applied to any of the electrodes of the vibrating element 6.

The contact portion 66 of the vibrating element 6 is in pushing contact with (abuts on) the rotor 51, and the frictional force between the contact portion 66 and the rotor 51 keeps the rotor 51 in the stopping state. This makes it possible to keep the diaphragm portion 5 in the stopping state. Namely, the diaphragm portion 5 is prevented from moving, thereby maintaining the diaphragm portion 5 at a desired position.

In this regard, in the case of the first mode, the switches 9 and 16 may be switched in any manner as long as an AC voltage is not applied to any of the electrodes of the vibrating element 6.

In the case (of the second mode) where the instructions indicate that the rotor 51 is to be set in the free state, in other words, the instructions indicate that the diaphragm portion 5 is to be set in the free state, the switch 16 is switched so that the terminal 164 and the terminal 167 of the switch 16 are connected, and the terminal 166 and the terminal 168 of the switch 16 are connected. Thus, the output side of the amplification circuit 82 of the drive circuit 8 is conducted to the electrodes 61*a*, 61*b*, 61*c*, 61*d*, 65*a*, 65*b*, 65*c*, and 65*d* of the vibrating element 6, and the electrodes 61*e* and 65*e* of the vibrating element 6 are conducted to the input side of the oscillating circuit 81 of the drive circuit 8.

An AC voltage outputted from the oscillating circuit 81 is amplified by the amplification circuit 82 and then applied between the reinforcing plate 63 and each of the electrodes 61*a*, 61*b*, 61*c*, 61*d*, 65*a*, 65*b*, 65*c*, and 65*d*. Thus, as mentioned above, the contact portion 66 of the vibrating element 6 undergoes vibration (reciprocates) in its longitudinal direction, whereby the rotor 51, i.e., the diaphragm portion 5 becomes a free state, and it is possible to freely rotate the rotor 5 (diaphragm portion 5) in both of the directions in FIG. 20.

At this time, the voltage (induced voltage) induced between the reinforcing plate 63 and each of the electrodes 61e and 65e is detected from each of the electrodes 61e and 65e. The detected induced voltage (detected voltage) is inputted to the oscillating circuit 81, and thereafter, based on the detected voltage, the oscillating circuit 81 outputs an AC voltage having a frequency at which amplitude of the longitudinal vibration of the vibrating element 6 becomes maximum, namely, the detected voltage becomes maximum. This makes it possible to rotate the rotor 51, i.e., the diaphragm portion 5 more smoothly.

Here, in the case of the second mode, the switch 9 may be switched in any manner.

According to the electric instrument 1 in the second embodiment of the present invention, it is possible to obtain effects similar to that of the first embodiment described above.

In this electric instrument 1, since it is possible to select any state from the four states, which includes a state where the rotor 51 (diaphragm portion 5) is kept in a stopping state, i.e., a state of high friction, a state where the rotor 51 (diaphragm portion 5) is allowed to be rotated (or be moved) (i.e., the rotor 51 and the diaphragm portion 5 are set in a free state), i.e., a state of low friction, a state where the rotor 51 is rotated in the forward direction, and a state where the rotor 51 is rotated in the reverse direction, there is wide applicability.

In the above-mentioned vibrating element 6, the case where the electrodes to drive the vibrating element 6 are divided into four sections has been described. However, this is just one example for selectively exciting the longitudinal vibration and the bending vibration of the vibrating element 6, and in the present invention, the structure and the method of driving the vibrating element 6 are not limited to the above-mentioned ones.

Additionally, in the present invention, the electric instrument 1 is adapted so that the third mode or the fourth mode may be omitted, and the rotor 51 may be rotated in only one direction. Even in this case, the diaphragm portion 5 can reciprocate (i.e., move) in both of the directions in FIG. 20 using the only one vibrating element 6.

Third Embodiment

Next, a description will be given for a third embodiment of the present invention.

Figure 21:
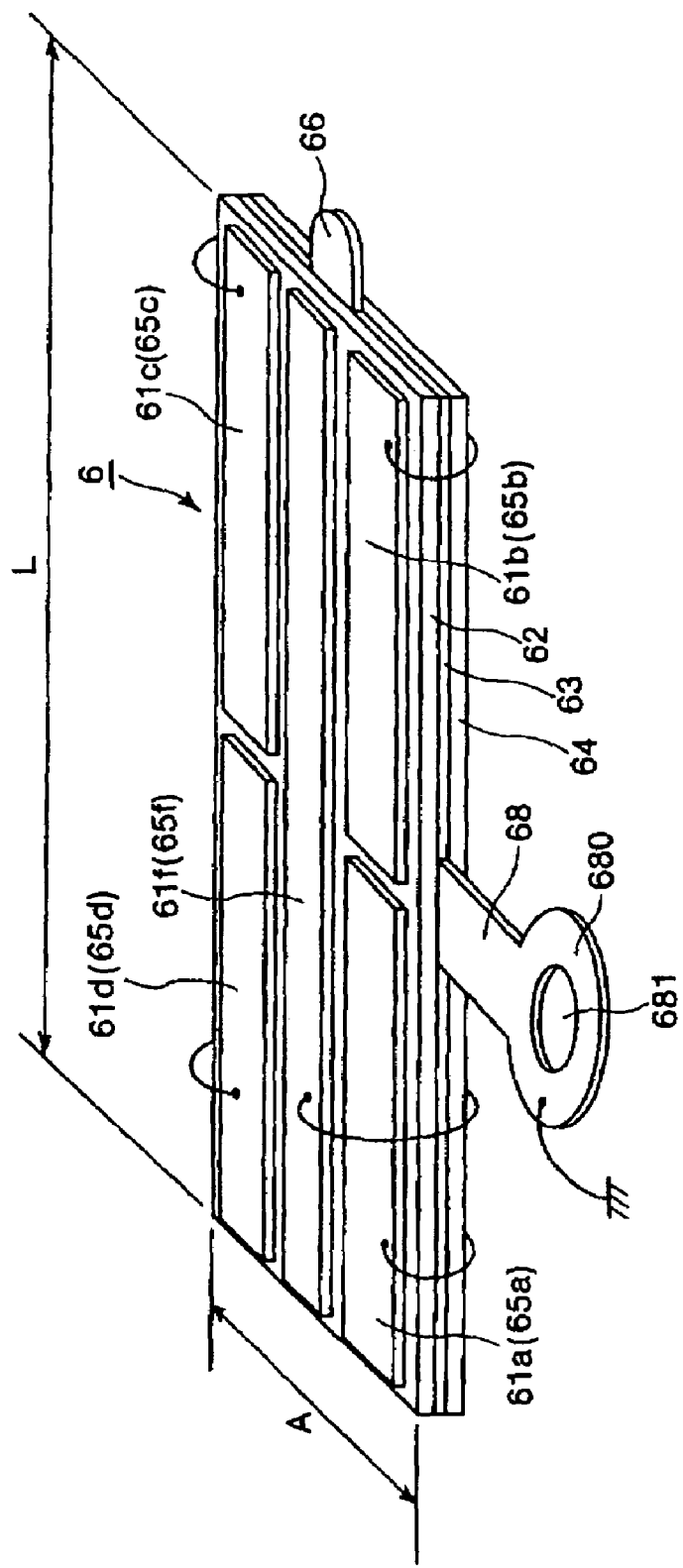
FIG. 21 is a perspective view illustrating a vibrating element in a third embodiment of an electric instrument according to the present invention.

FIG. 21 is a perspective view illustrating a vibrating element in a third embodiment of an electric instrument according to the present invention. Now, in following explanations using FIG. 29, an upper side is referred to as "upper," a lower side is referred to as "lower," a right side is referred to as "right," and a left side is referred to as "left."

Hereinafter, an electric instrument 1 in the third embodiment will be described, focusing on different points between the above-mentioned first or second embodiment and the third embodiment. In this regard, explanation of items including the same matters and the like is omitted.

The electric instrument 1 in the third embodiment has characteristics on the point that the electric instrument 1 can further employ a fifth mode and a sixth mode in which longitudinal vibration and bending vibration are combined, in addition to the first to fourth modes described in the second embodiment. The fifth mode and the sixth mode can be arbitrarily selected by changing a conducting pattern to each of electrodes 61a–61d, 61f, 65a–65d, and 65f in the same way as the first to fourth modes.

The vibrating element 6 of the electric instrument 1 has an electrode 61f at the upper side of a piezoelectric element 62 in FIG. 21 and an electrode 65f at the lower side thereof in place of the detecting electrodes 61e and 65e in the second embodiment. The electrodes 61f and 65f are rectangular and plate-shaped, and has a substantially same length as a length in a longitudinal direction of the vibrating element 6. The electrodes 61f and 65f are located at a center of the vibrating element 6 along its longitudinal direction. Further, the electrode 61f is electrically connected to the electrode 65f between the front face and the back face of the vibrating element 6. The electrodes 61f and 65f are also electrically connected to the conducting circuit 20 in the same way as the other electrodes 61a–61d and 65a–65d (the electrodes 65a–65d are not shown in FIG. 21.).

Figure 22:
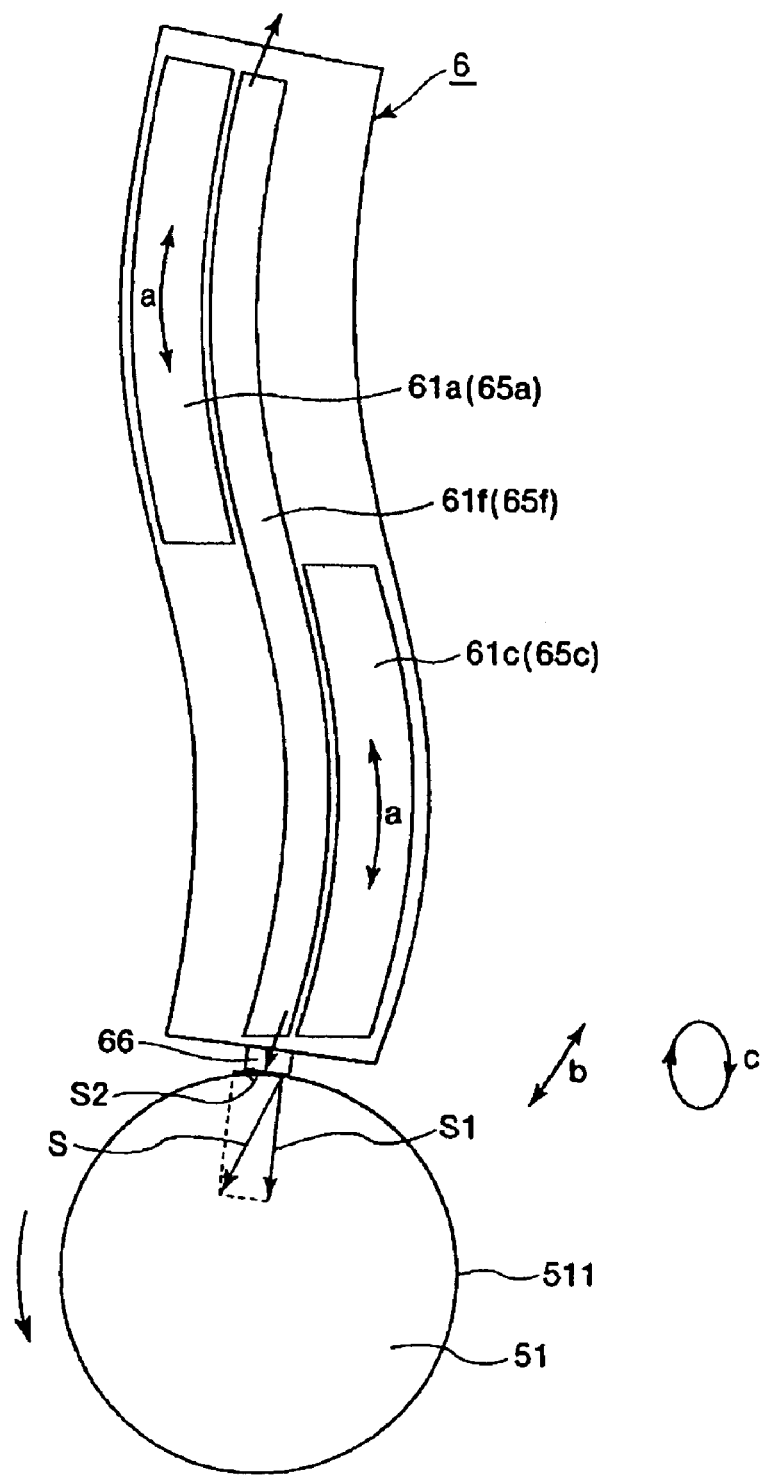
FIG. 22 is a plan view showing a vibrating state of the vibrating element shown in FIG. 21.

FIG. 22 is a plan view showing a vibrating state of the vibrating element shown in FIG. 21.

In the fifth mode of the electric instrument 1, an electric power is applied to the electrodes 61a, 61c, 65a, and 65c that are located at one diagonal line of the vibrating element 6, whereby an AC voltage is applied between the reinforcing plate 63 and each of the electrodes 61a, 61c, 65a, and 65c. Then, each of portions of the vibrating element 6 corresponding to these electrodes repeatedly undergoes extension and contraction so that the entire vibrating element 6 undergoes bending secondary vibration. By the bending secondary vibration, the contact portion 66 of the vibrating element 6 undergoes vibration (reciprocates) in a slanting direction represented by an arrow b in FIG. 22, or vibrates (moves) in an elliptical manner as represented by an arrow c in FIG. 22. Thus, the rotor 51 repeatedly receives frictional force (pushing force) from the contact portion 66 so as to rotate in the counterclockwise direction in FIG. 22 (in the forward direction).

Further, in the fifth mode, an electric power is further applied to the electrodes 61f and 65f at the center of the vibrating element 6, whereby portions of the piezoelectric elements 62, 64 corresponding to the electrodes 61f and 65f repeatedly and partly undergoes extension and contraction at a high speed. Then, portions on the centerline in the longitudinal direction of the vibrating element 6 undergo longitudinal vibration at minute amplitude along its longitudinal direction. This is referred to as longitudinal primary vibration. By the longitudinal primary vibration, the contact portion 66 increases the pushing force in the longitudinal direction of the vibrating element 6 to bias the rotor 51 with the increased (stronger) pushing force. This makes it possible to obtain high driving force in comparison with the case where the vibrating element 6 is driven by only the bending secondary vibration.

In the fifth mode, the electrodes 61b, 61d, 65b, and 65d to which the electric power is not applied serve as vibration detecting means for detecting vibration of the vibrating element 6. The electrodes 61b, 61d, 65b, and 65d detect a voltage (induced voltage) to be induced between the reinforcing plate 63 and each of the electrodes 61a, 61c, 61f, 65a, 65c, and 65f to which the electric power is applied when the vibrating element 6 is driven, and thereafter the induced voltage is inputted to an oscillating circuit 81. The oscillating circuit 81 outputs an AC voltage having frequency (resonant frequency) at which amplitude of the vibrating element 6 becomes maximum, i.e., the induced voltage becomes maximum based on the detected induced voltage. This makes it possible to rotate the rotor 51 efficiently. In this regard, the electrodes 61*b*, 61*d*, 65*b*, and 65*d* to which the electric power is not applied operate in the same way as those in the first embodiment.

Figure 23:
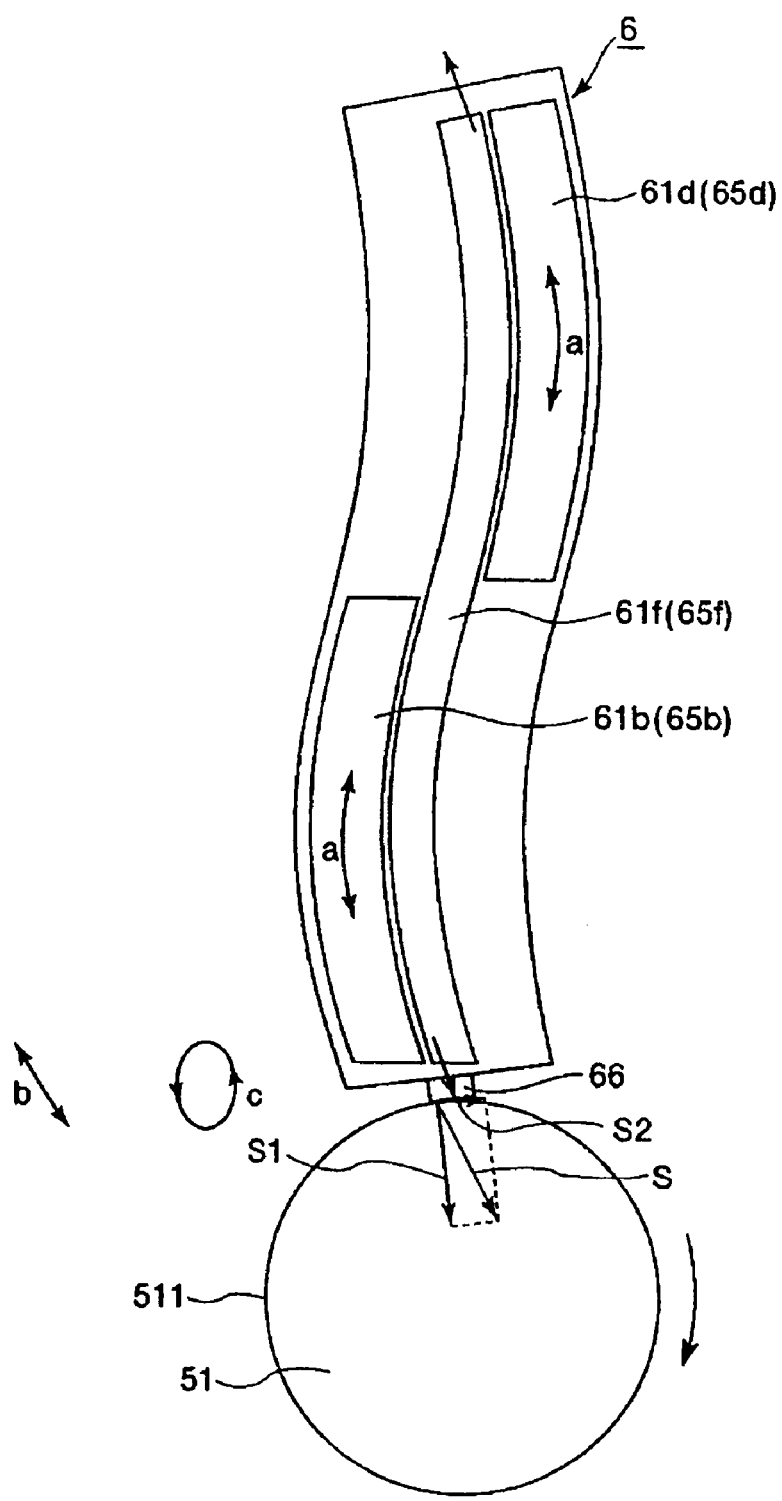
FIG. 23 is a plan view showing a vibrating state of the vibrating element shown in FIG. 21.

FIG. 23 is a plan view showing a vibrating state of the vibrating element shown in FIG. 21.

In the sixth mode of the electric instrument 1, an electric power is applied to electrodes 61*b*, 61*d*, 65*b*, and 65*d* that are located at the other diagonal line of the vibrating element 6, and electrodes 61*f* and 65*f* that are located at the center of the vibrating element 6. The vibrating element 6 undergoes vibration with motion symmetrical to that in case of the fifth mode, thereby rotating the rotor 51 in the clockwise direction in FIG. 23 (in the reverse direction). This also makes it possible to obtain stronger driving force in the reverse direction.

In the sixth mode, the electrodes 61*a*, 61*c*, 65*a*, and 65*c* to which the electric power is not applied serve as vibration detecting means for detecting vibration of the vibrating element 6. The electrodes 61*a*, 61*c*, 65*a*, and 65*c* detect a voltage (induced voltage) to be induced between the reinforcing plate 63 and each of the electrodes 61*b*, 61*d*, 61*f*, 65*b*, 65*d*, and 65*f* to which the electric power is applied when the vibrating element 6 is driven, and thereafter the induced voltage is inputted to an oscillating circuit 81. The oscillating circuit 81 outputs an AC voltage having frequency (resonant frequency) at which amplitude of the vibrating element 6 becomes maximum, i.e., the induced voltage becomes maximum based on the detected induced voltage. This makes it possible to rotate the rotor 51 efficiently. In this regard, the electrodes 61*b*, 61*d*, 65*b*, and 65*d* to which the electric power is not applied operate in the same way as those in the first embodiment.

Here, as shown in FIG. 21, in the case where a length of the body portion of the vibrating element 6 in a direction substantially perpendicular to the longitudinal direction (the length of the body portion in the direction substantially perpendicular to the direction in which the contact portion 66 protrudes), i.e., a length of the short side of the vibrating element 6 is determined to be a width length A, a ratio between the width A and the length L is not especially limited. However, it is preferable that the ratio is about 2 to 5. Further, it is more preferable that the ratio is about 3 to 4. Furthermore, it is most preferable that the ratio is 3.54. The relationship between the resonant frequencies of the longitudinal primary vibration and the bending secondary vibration becomes appropriate in the above-mentioned conditions, and it is possible to obtain satisfactory drive efficiency.

In this regard, in the electric instrument 1, the vibrating modes of the vibrating element 6 are not limited to the first to sixth modes mentioned above, and optional vibrating mode may be employed within an obvious scope of one skilled in the art. For example, in the vibrating element 6 described in FIG. 21, longitudinal primary vibration may be exited in the vibrating element 6 by application of the AC voltage only to the electrodes 61*f*, 65*f*, or a complex vibration of combination of longitudinal primary vibration and bending tertiary vibration may be exited in the vibrating element 6 by the application of the AC voltage to all of the electrodes 61*a*–61*f* and 65*a*–65*f* and delaying the application timing to predetermined electrodes.

Figure 26:
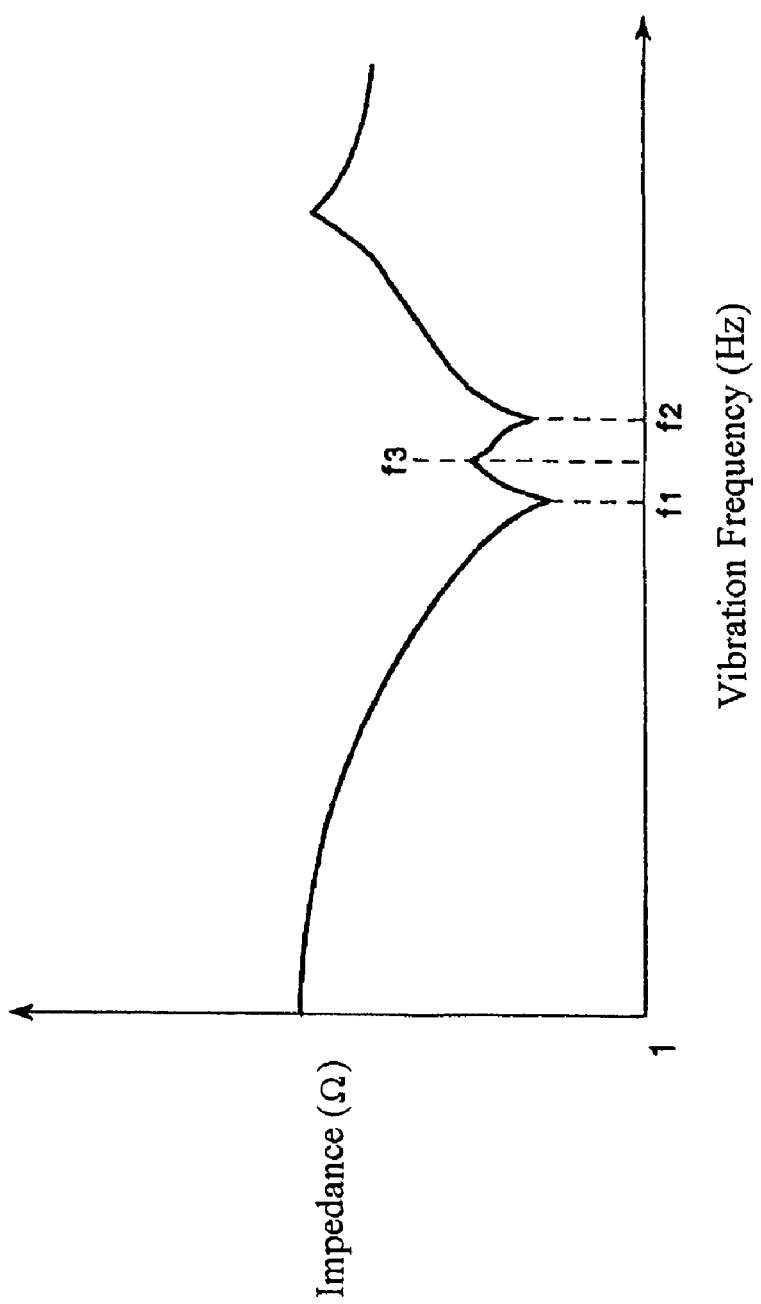
FIG. 26 is a graph showing drive characteristics of the vibrating element shown in FIG. 21.

FIG. 26 is a graph showing electric characteristics of the vibrating element shown in FIG. 21. In this graph shown in FIG. 26, the horizontal axis represents the vibration frequency (Hz) of the vibrating element 6 during driving, and the perpendicular axis represents impedance (Ω) of the piezoelectric elements 62, 64 while the vibrating element 6 is not in pushing contact with (abuts on) the rotor 51.

As shown in FIG. 26, the vibrating element 6 has a resonant frequency f1 for the longitudinal primary vibration and a resonant frequency f2 for the bending secondary vibration. There are minimum values of impedance at these resonant frequencies f1, f2. Here, these resonant frequencies f1, f2 are frequencies peculiar to the vibrating element 6. The resonant frequencies f1, f2 can be arbitrarily changed by selecting a shape or a size of the vibrating element 6, a position of the contact portion 66, or the like. In this vibrating element 6 of the present invention, the resonant frequencies f1, f2 are set so as to be close each other. For example, in the vibrating element 6, the resonant frequency f2 of the bending secondary vibration is higher than the resonant frequency f1 of the longitudinal primary vibration by about 1 to 2%. In the constitution of the vibrating element 6, when the vibrating element 6 is driven at a frequency near the resonant frequencies f1, f2, in particular, at a frequency between the resonant frequencies f1 and f2, a complex vibration of combination of the longitudinal primary vibration and the bending secondary vibration can be obtained. Further, the complex vibration noticeably has the drive characteristics of both the longitudinal primary vibration and the bending secondary vibration because the drive frequency is near the resonant frequencies f1, f2 of both the longitudinal primary vibration and the bending secondary vibration. This makes it possible to efficiently obtain the drive characteristics of both the longitudinal primary vibration and the bending secondary vibration when the vibrating element 6 is driven.

Further, in the vibrating element 6, these resonant frequencies f1, f2 are set so as to be predetermined values different from each other (see FIG. 26). Thus, a change of impedance of the piezoelectric elements 62, 64 becomes sluggish near the resonance point in the pushing condition, whereby the boundary between the resonant frequency f1 of the longitudinal primary vibration and the resonant frequency f2 of the bending secondary vibration becomes unclear. Moreover, it is possible to constitute a wide frequency band where the value of the impedance becomes lower near the resonant frequencies f1, f2, in particular, with frequencies between the resonant frequencies f1 and f2. This makes it possible to carry out the excitation combining the longitudinal primary vibration and the bending secondary vibration at a wide frequency band, and to stabilize an input power to the vibrating element 6 while driving.

In the electric instrument 1, the vibrating element 6 is driven at a vibration frequency (drive frequency) between the resonant frequency f1 of the longitudinal primary vibration and the resonant frequency f2 of the bending secondary vibration. In this case, when the drive frequency of the vibrating element 6 is brought close to the resonant frequency f1 of the longitudinal primary vibration, the amplitude of the longitudinal vibration in the direction in which the pushing force is increased becomes larger. Thus, the frictional force between the contact portion 66 of the vibrating element 6 and the rotor 51 increases, and therefore the driving force of the vibrating element 6 is enhanced (i.e., it becomes high driving force type). On the other hand, when the drive frequency of the vibrating element 6 is brought close to the resonant frequency f2 of the bending secondary vibration, the component in the rotating direction of the rotor 51 within the vibrating displacement of the vibrating element 6 becomes larger. Thus, the rotating amount of the rotor 51 per unit vibration increases, and therefore the drive speed (rotational speed) of the rotor 51 is enhanced (i.e., it becomes high speed type). In this way, by shifting the resonant frequency f1 of the longitudinal primary vibration against the resonant frequency f2 of the bending secondary vibration, and appropriately setting (selecting) the drive frequency of the vibrating element 6 within the frequency band between the resonant frequencies f1 and f2, it is possible to obtain arbitrary drive characteristics with respect to driving force, drive speed, or the like, for example.

In this regard, in this vibrating element 6, it is preferable that the resonant frequency f2 of the bending secondary vibration is higher than the resonant frequency f1 of the longitudinal primary vibration by about 0.5 to 3.0%. It is more preferable that the resonant frequency f2 is higher than the resonant frequency f1 by about 1.0 to 2.0%.

By setting a difference between the resonant frequencies f1 and f2 to the range mentioned above, since the longitudinal primary vibration and the bending secondary vibration occur simultaneously (i.e., both vibrations are combined), it is possible to obtain the frictional force and the driving force simultaneously, thereby being able to obtain satisfactory drive characteristics.

In this regard, the present invention is not limited to this constitution. The resonant frequency f1 of the longitudinal primary vibration may be higher than the resonant frequency f2 of the bending secondary vibration. In this case, it is preferable that the resonant frequency f1 of the longitudinal primary vibration is higher than the resonant frequency f2 of the bending secondary vibration by about 0.5 to 3.0%. It is more preferable that the resonant frequency f1 is higher than the resonant frequency f2 by about 1.0 to 2.0%. In addition, in order to obtain a lager mechanical output by application (input) of larger electric power to the electric instrument 1, it is preferable that the impedance at the drive frequency is reduced.

Further, in this case, the impedance at the resonant frequency f2 of the bending secondary vibration is larger than that at the resonant frequency f1 of the longitudinal primary vibration. Moreover, as shown in FIG. 26, there is a frequency f3 at which the impedance has a maximum value between the resonant frequencies f1 and f2. It is preferable that the vibrating element 6 is driven at a predetermined drive frequency between the resonant frequency f1 of the longitudinal primary vibration and the resonant frequency f2 of the bending secondary vibration. It is more preferable that the vibrating element 6 is driven at a predetermined drive frequency between the resonant frequency f2 and the frequency f3. This makes it possible to excite the vibrating element 6 while driving with a vibrating phase-lag between the longitudinal vibration and the bending vibration. Therefore, it is possible to vibrate (move) the contact portion 66 along an elliptical orbit c (see FIGS. 8 and 9), and it is possible to efficiently transmit force from the vibrating element 6 to the rotor 51 without generating the force to draw the rotor 51 back.

In this regard, this constitution in which the resonant frequencies f1, f2 are different from or close to each other as described above may be applied to the first and second embodiments of the present invention. This makes it possible to obtain effects similar to that of the third embodiment described above.

In the electric instrument 1 of the third embodiment, each five electrodes 61a–61d and 61f, or 65a–65d and 65f are disposed on each of the piezoelectric elements 62, 64 to realize bi-directional drive of the rotor 51 including forward and reverse directions (see FIGS. 22 and 23). However, the present invention is not limited to this structure. For example, in the case where the rotor 51 is to be rotated in one direction, the vibrating element 6 may has more simplified structure.

Figure 24:
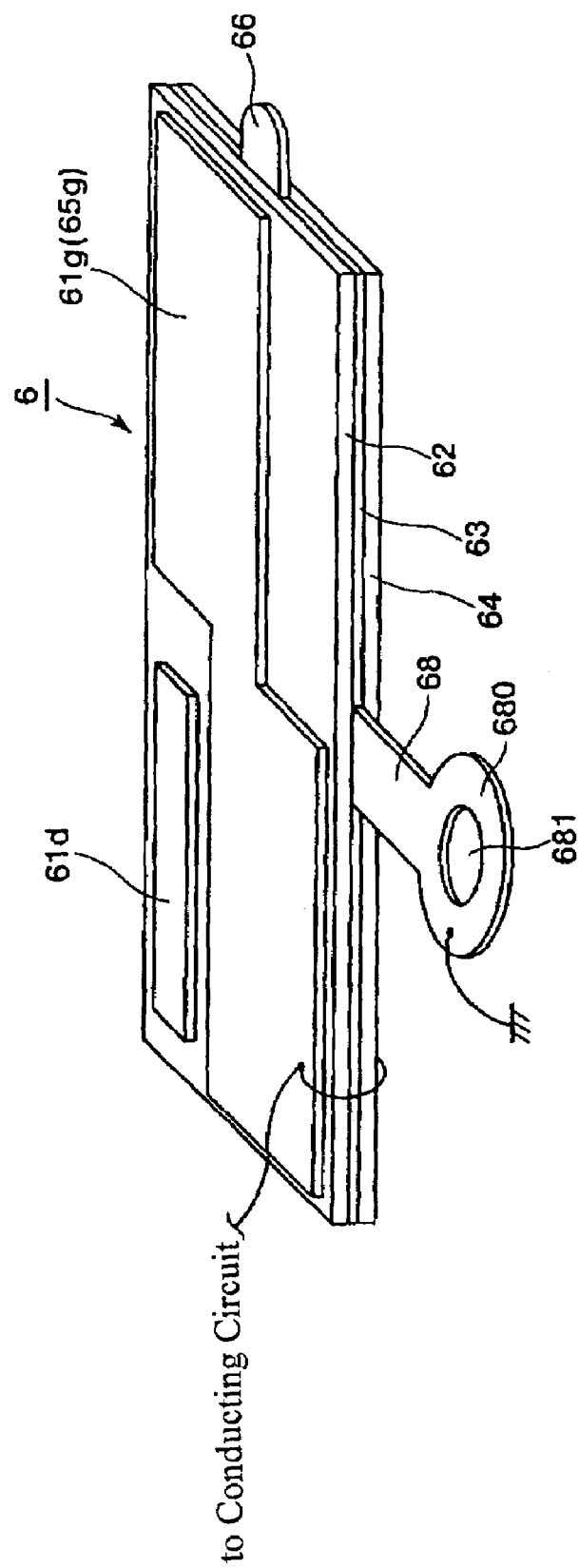
FIG. 24 is a perspective view illustrating a variant of the vibrating element shown in FIG. 21.

FIG. 24 is a perspective view illustrating a variant of the vibrating element shown in FIG. 21. The vibrating element 6 has a single electrode 61g integrating the electrodes 61a, 61c, and 61f at the same position as those of the electrodes in place of these electrodes 61a, 61c, and 61f in comparison with the vibrating element 6 described in FIG. 21. Similarly, the vibrating element 6 has a single electrode 65g integrating the electrodes 65a, 65c, and 65f at the same position as those of the electrodes in place of these electrodes 65a, 65c, and 65f. The electrode 65g is not shown in FIG. 24, but reference numerals of the electrode is merely designated using parentheses. Further, the electrode 61d is provided independent of the electrode 65d. In addition, the electrodes 61b, 65b, and 65d are omitted in this vibrating element 6.

Figure 25:
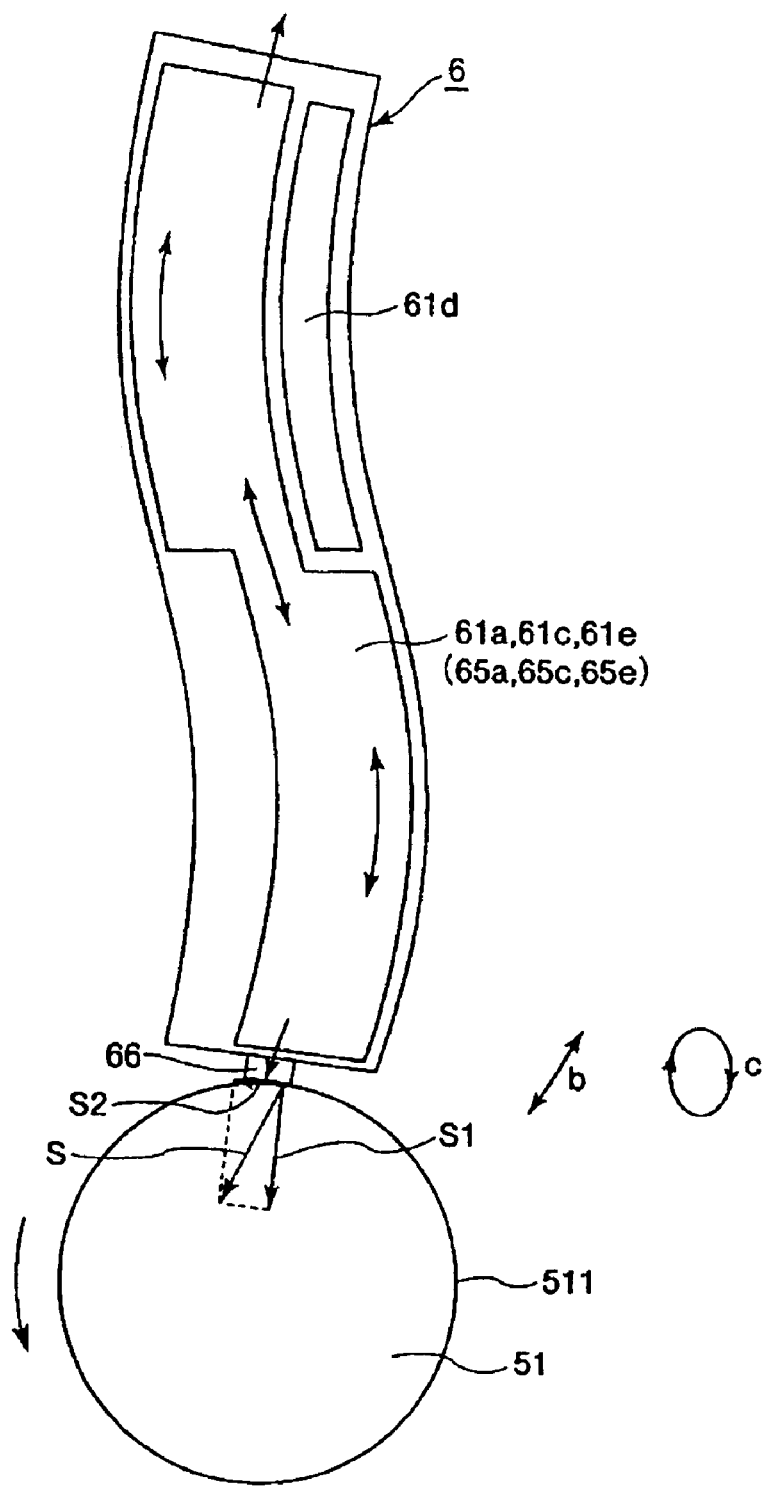
FIG. 25 is a plan view illustrating a vibrating state of the vibrating element shown in FIG. 24.

FIG. 25 is a plan view illustrating a vibrating state of the vibrating element shown in FIG. 24. An electric power is supplied to these single electrode 61g, 65g of the vibrating element 6. The portions corresponding to the electrodes 61g, 65g of the piezoelectric elements 62, 64 repeatedly undergo expansion and contraction at a high speed (see FIG. 25). Then, by the expansion and contraction of portions corresponding to the electrodes 61a, 61c, 65a, and 65c within the portions corresponding to the electrodes 61g, 65g, bending secondary vibration is generated as well as the operation of the fifth mode mentioned above. Further, by the electrodes 61f and 65f within the portions corresponding to the electrodes 61g, 65g, longitudinal primary vibration is generated as well as the operation of the fifth mode. Thus, a complex vibration of combination of the longitudinal primary vibration and the bending secondary vibration is generated, and the rotor 51 rotates in a counterclockwise direction in FIG. 2 by means of the same operation as that of the fifth mode.

The electrode 61d is connected to the oscillating circuit 81 of the drive circuit 8 (not shown), and used to hold its oscillating frequency to a proper value.

In this regard, the rotating direction of the rotor 51 is only one direction in this vibrating element 6. According to this vibrating element 6, since the number of electrodes is reduced in comparison with the vibrating element 6 described in FIG. 21, it is possible to simplify the structure of a production (vibrating element), and to shorten (cut down) the manufacturing steps of the production. In addition, since the rotor 51 is driven (rotated) in only one direction, the switch 9 of the conducting circuit 20 can be omitted. This makes it possible to further simplify the production.

On the other hand, a single electrode 61h (not shown) integrating the electrodes 61b, 61d, and 61f may be disposed at the same position as that of these electrodes in place of the electrodes 61b, 61d, and 61f, and a single electrode 65h (not shown) integrating the electrodes 65b, 65d, and 65f may be disposed at the same position as that of these electrodes in place of the electrodes 65b, 65d, and 65f. Further, the other electrodes 61a, 61c, 65a, and 65c may be omitted. In this case, the rotor 51 can rotate in the reverse direction (the clockwise direction in FIG. 25).

Fourth Embodiment

Next, a description will be given for a fourth embodiment of the present invention.

Figure 27:
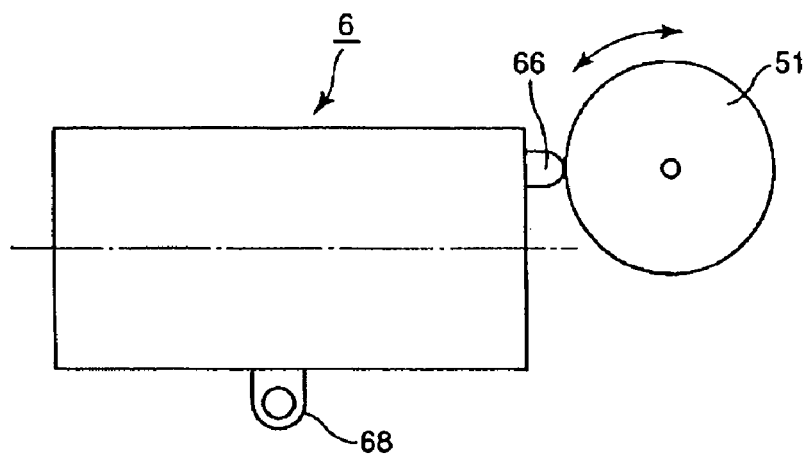
FIG. 27 is a plan view illustrating an electric instrument in a fourth embodiment according to the present invention.

FIG. 27 is a plan view illustrating an electric instrument in a fourth embodiment according to the present invention.

Hereinafter, an electric instrument 1 in the fourth embodiment will be described, focusing on different points between the above-mentioned first embodiment and the fourth embodiment. In this regard, explanation of items including the same matters and the like is omitted.

In the electric instrument 1 of the first embodiment described above, the contact portion 66 was arranged at the center of the short side of the vibrating element 6. However, the position of the contact portion 66 is not limited to this position. For example, as shown in FIG. 27, the contact portion 66 may be located at a position offset from the center portion of the short side of the vibrating element 6, i.e., at a position offset from on the centerline in the longitudinal direction of the vibrating element 6. According to such a configuration, there occur (1) unbalanced state of weight of the vibrating element 6 by offset of the setting position of the contact portion 66; (2) unbalanced state of arrangement of the electrodes 61a–61f and 65a–65f for driving the vibrating element 6; (3) unbalanced state owing that reaction force from the driven element effects the vibrating element 6 out the centerline of the vibrating element 6; and the like. In this case, when the vibrating element 6 undergoes extension and contraction by supplying the electric power to the vibrating element 6, a complex vibration of combination of longitudinal vibration and bending vibration is readily induced. This makes it possible to enhance a drive efficiency of the vibrating element 6.

In this regard, in terms of the reason (3) mentioned above, if the center of the rotor 51 is offset from the centerline of the vibrating element 6 even though the contact portion 66 protrudes from the entire short side of the vibrating element 6 as shown in FIG. 19, the vibrating element 6 has similar effects. Therefore, such a structure is also included in the present invention.

In the same way, if the center of the rotor 51 is offset from the centerline of the vibrating element 6 even though the contact portion 66 protrudes from the center portion of the short side of the vibrating element 6, the vibrating element 6 has similar effects, and the complex vibration may be induced. Therefore, such a structure is also included in the present invention.

Figure 39:
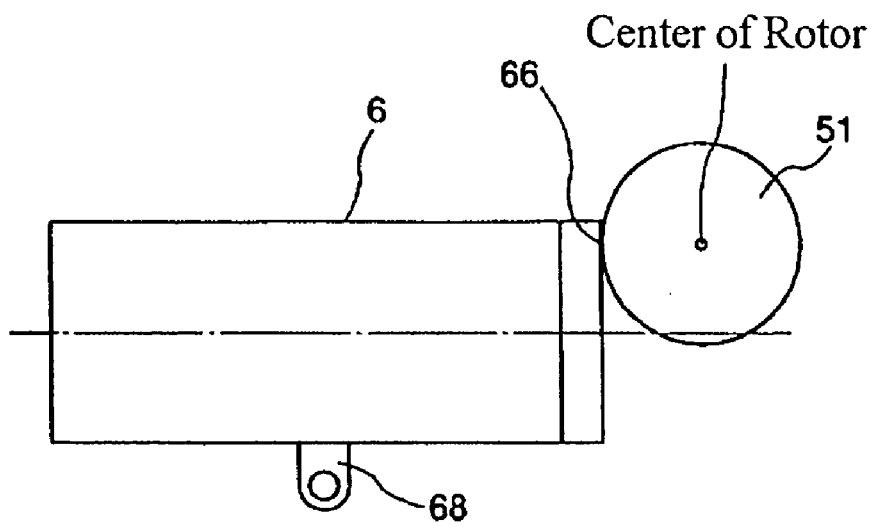
FIG. 39 is a plan view illustrating a variant of the electric instrument in the fourth embodiment.

Hereinafter, a further explanation will be given with reference to FIGS. 39 and 40.

Since the operations (1)–(3) described above are independent from each other, they can be freely combined. For example, as shown in FIG. 39, by adopting the constitution in which the contact portion 66 is provided throughout the short side of the vibrating element 6 and the contact portion 66 is in contact with the rotor 51 at the point offset from the centerline of the vibrating element 6, the operations (2) and (3) make the complex vibration of combination of the longitudinal vibration and the bending vibration be induced. Therefore, it is possible to improve the drive efficiency.

Figure 40:
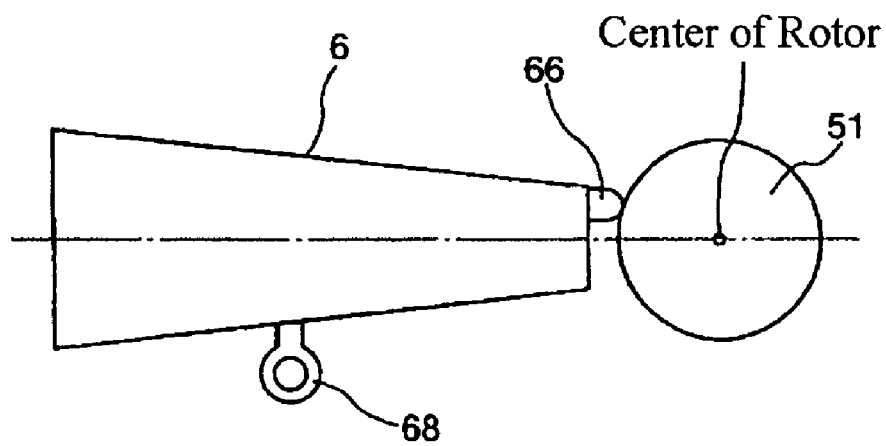
FIG. 40 is a plan view illustrating a variant of the electric instrument in the fourth embodiment.

Further, as shown in FIG. 40, by adopting the constitution in which the vibrating element 6 has a trapezoid-shaped body portion and the contact portion 66 is provided at the position offset from the centerline in the longitudinal direction to bring into contact with the rotor 51, the reaction force from the driven element can act offset from the centerline of the vibrating element 6, and the displacement in a direction orthogonal to the longitudinal direction of the vibrating element 6 can be generated. Thus, it is possible to improve the drive efficiency.

Figure 28:
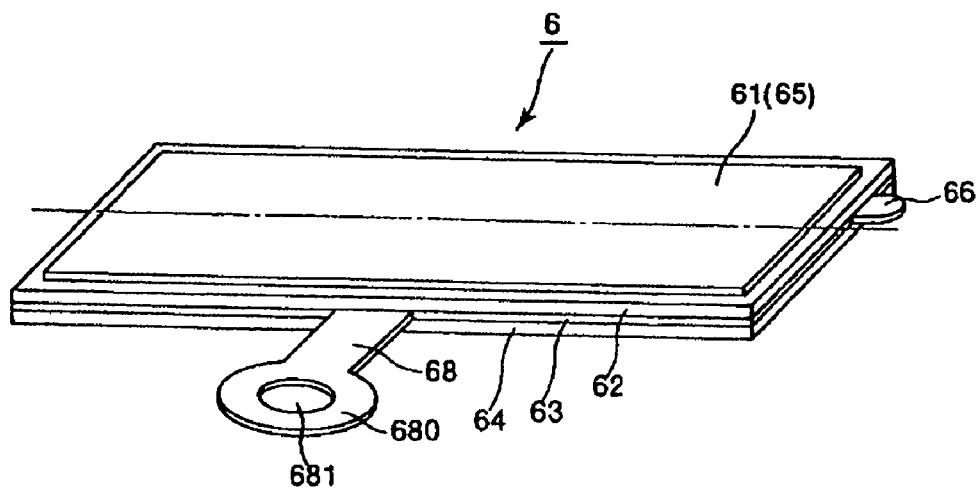
FIG. 28 is perspective view illustrating a variant of the vibrating element shown in FIG. 27.

In addition, in the fourth embodiment, it is possible to adopt the constitution in which single electrodes 61, 65 are disposed at almost whole areas of the piezoelectric elements 62, 64. FIG. 28 is perspective view illustrating a variant of the vibrating element shown in FIG. 27. According to such a structure, since a complex vibration of longitudinal vibration and bending vibration is induced by unbalanced state of the vibrating element 6, it is possible to drive the rotor 51 efficiently with a simplified construction of electrodes.

Fifth Embodiment

Next, a description will be given for a fifth embodiment of the present invention.

Figure 29:
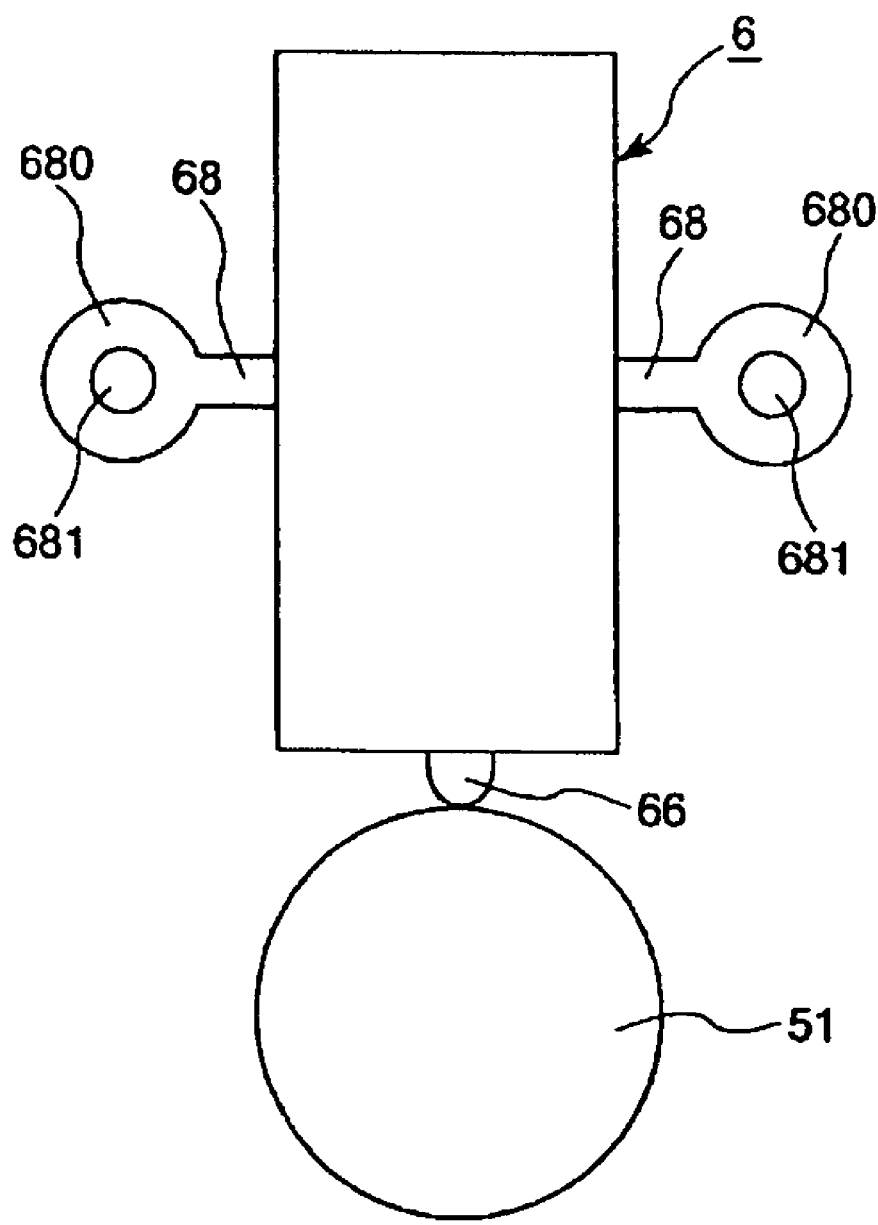
FIG. 29 is a plan view illustrating an electric instrument (ultrasonic motor) in a fifth embodiment according to the present invention.

FIG. 29 is a plan view illustrating an electric instrument (ultrasonic motor) in a fifth embodiment according to the present invention. Now, in following explanations using FIG. 29, an upper side is referred to as "upper," a lower side is referred to as "lower," a right side is referred to as "right", and a left side is referred to as "left."

Hereinafter, an electric instrument 1 in the fifth embodiment will be described, focusing on different points between the above-mentioned first embodiment and the fifth embodiment. In this regard, explanation of items including the same matters and the like is omitted.

As shown in FIG. 29, in the electric instrument 1 (ultrasonic motor) in the fifth embodiment of the present invention, a pair of (two) arm portions 68, 68 each having elasticity (flexibility) are integrally formed with the reinforcing plate 63 of the vibrating plate 6.

The pair of arm portions 68, 68 are provided at substantially center portions in the longitudinal direction of the reinforcing plate 63 (a upper-and-lower direction in FIG. 29) and in the direction substantially perpendicular to the longitudinal direction thereof so as to protrude in mutually opposite directions via the reinforcing plate 63 (the body portion of the vibrating element 6) (symmetrical with respect to a vertical direction in FIG. 21).

According to the electric instrument 1 of the fifth embodiment according to the present invention, it is possible to obtain effects similar to that of the first embodiment described above.

Further, since the pair of arm portions 68, 68 are provided on the vibrating element 6 in this electric instrument 1, rigidity against the support can be enhanced, whereby it is possible to stably support the vibrating element 6 against external force such as reaction force of the drive or the like. Moreover, since the pair of arm portions 68, 68 are symmetrical, influence on the drive characteristics in both clockwise and counterclockwise directions in FIG. 29 (in right and left directions) can be uniformized. Therefore, the constitution where characteristics in both forward and reverse directions are equal can be realized.

Furthermore, each of the constitutions described in the second to fourth embodiments can be applied to this constitution of the fifth embodiment. It is preferable that the constitution of the third embodiment is applied to this constitution of the fifth embodiment.

Sixth Embodiment

Next, a description will be given for a sixth embodiment of the present invention.

Hereinafter, an electric instrument 1 in the sixth embodiment will be described, focusing on different points between the above-mentioned first embodiment and the sixth embodiment. In this regard, explanation of items including the same matters and the like is omitted.

In the electric instrument 1 of the first embodiment described above, a diaphragm portion 5 having a cylinder-shaped rotor 51 is driven (moved) using a vibrating element 6. However, the present invention is not limited to this structure. A driven element having other shape and structure may be driven using the vibrating element 6. For example, the driven element of this electric instrument 1 is the cylinder-shaped rotor 51, but the present invention is not limited to this constitution. It is preferable that the driven element is a rotational structure having a cylinder shape, a shape having cross-sectional surface of sector form or circular arc form, or the like (not shown in the drawings). Further, the driven element is not limited to the rotational structure such as the rotor 51. The driven element may be a translational structure such as a slider or the like (not shown in the drawings).

Figure 30:
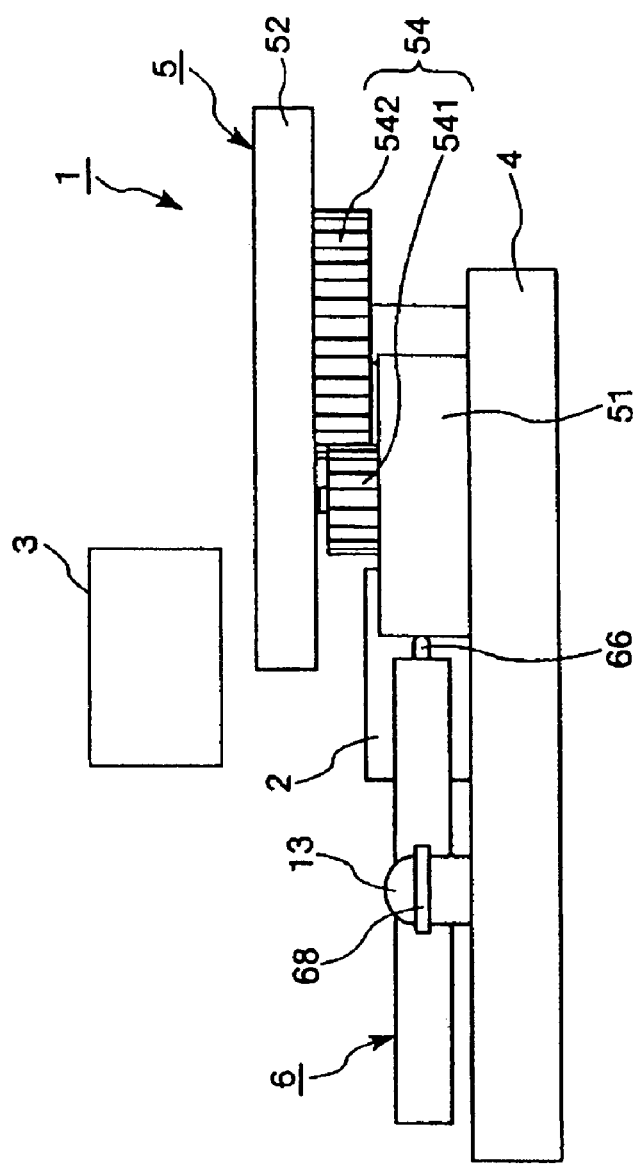
FIG. 30 is a side view illustrating an example of an electric instrument in a sixth embodiment according to the present invention.
Figure 31:
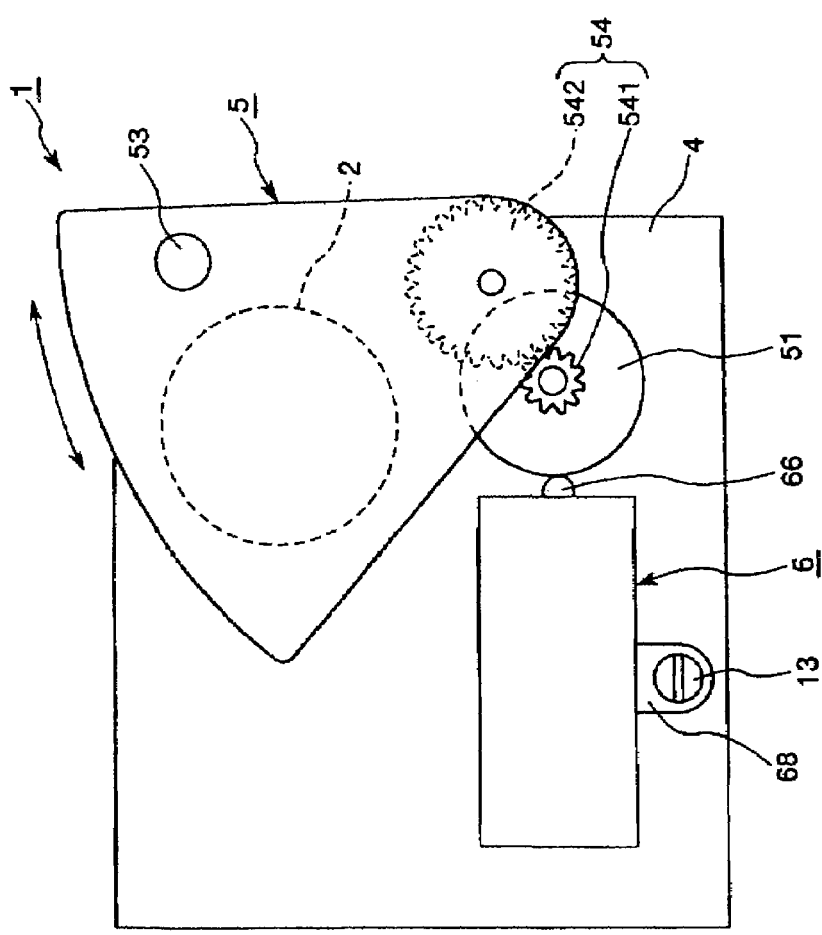
FIG. 31 is a plan view illustrating an example of an electric instrument in a sixth embodiment according to the present invention.

FIG. 30 is a side view illustrating an example of an electric instrument in a sixth embodiment according to the present invention. FIG. 31 is a plan view illustrating an example of an electric instrument in a sixth embodiment according to the present invention. This electric instrument 1 has a characteristic on the point to be provided with a deceleration mechanism 54 between the rotor 51 of the diaphragm portion 5 and a shielding plate 52. The deceleration mechanism 54 is constructed from a small gear 541 and a large gear 542. The small gear 541 is coaxially provided on the rotor 51, and fixed on the top portion of the rotor 51. The large gear 542 is fixedly provided at the bottom of the shielding plate 52 so as to engage with the small gear 541. In this structure, when the vibrating element 6 strikes the side portion of the rotor 51 to rotate the rotor 51, the small gear 541 is rotated with the rotor 51. The small gear 541 makes the large gear 542 rotate, there by rotating the shielding plate 52. This makes a diaphragm from the optical system 3 toward the imaging portion 2 be switched (changed). According to this structure, it is possible to drive the shielding plate 52 with high (great) torque by means of operation of the deceleration mechanism 54.

(First Variant)

Figure 32:
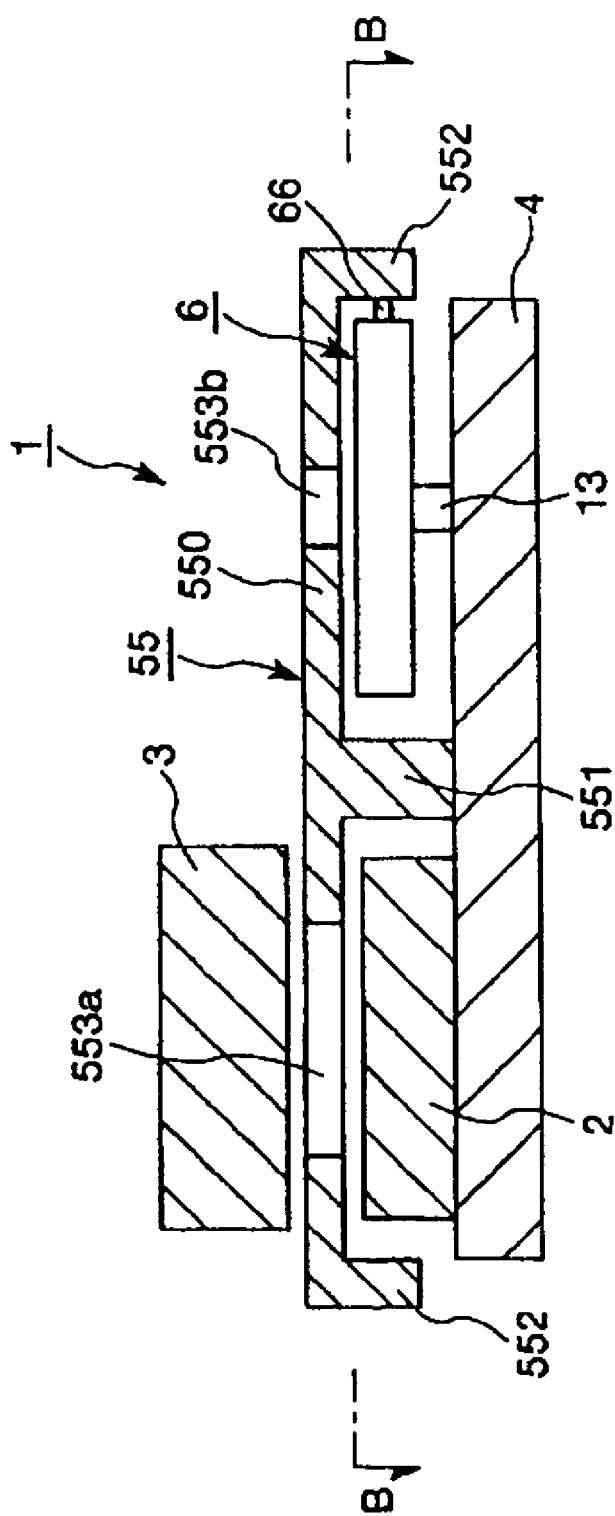
FIG. 32 is a side sectional view illustrating a first variant of the electric instrument in the sixth embodiment.
Figure 33:
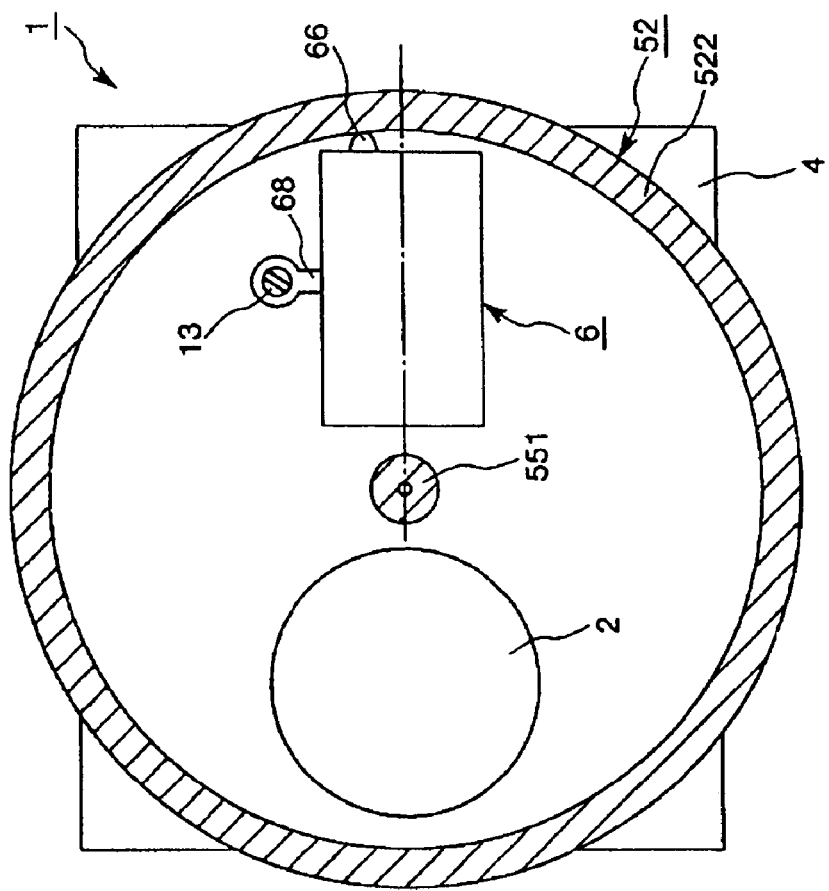
FIG. 33 is a plan sectional view illustrating a first variant of the electric instrument in the sixth embodiment.
Figure 34:
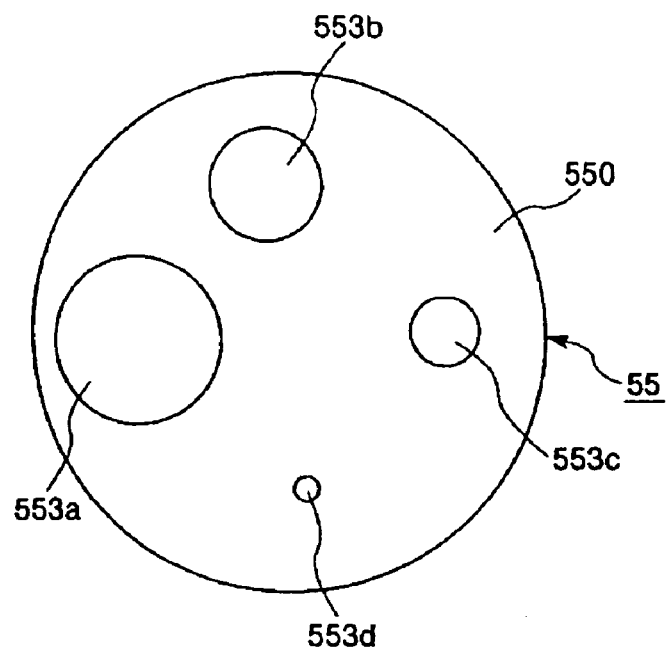
FIG. 34 is a plan view illustrating the shielding plate shown in FIGS. 32 and 33.

FIG. 32 is a side sectional view illustrating a first variant of the electric instrument in a sixth embodiment. FIG. 33 is a plan sectional view illustrating a first variant of the electric instrument in the sixth embodiment. FIG. 34 is a plan view illustrating the shielding plate shown in FIGS. 32 and 33. In these drawings, the same parts (components) as those of the electric instrument 1 in the sixth embodiment described above are designated as the same reference numerals, and explanations thereof will be omitted.

The electric instrument 1 has a characteristic on the point to be provided with a disk-shaped rotating plate 55. The rotating plate 55 has a shielding plate 550, a shaft 551, an end portion 552, and openings 553a–553d. The shielding plate 550 has a disk-shaped structure, and constitutes a base plate of the rotating plate 55. The shaft 551 is provided so as to be stuck on the center of the disk as a rotational axis thereof. The rotating plate 55 is rotatably provided so that the plane of the shielding plate 550 is provided as substantially parallel to the plane of the base 4 and the shaft 551 is located at the center of the base 4. The end portion 552 is provided at the outer circumferential of the shielding plate 550 to constitute an annular wall surface on the outer circumferential of the shielding plate 550. The openings 553a–553d are provided on the shielding plate 550 so as to surround the shaft 551, and respectively have mutually different areas. Further, the openings 553a–553d is located between the optical system 3 and the imaging portion 2 to be mutually changed by the rotation of the rotating plate 55. On the other hand, the contact portion 66 of the vibrating element 6 comes in frictional contact with the inner circumferential surface of the end portion 552 of the rotating plate 55. In this regard, the contact portion 66 of the vibrating element 6 is provided at a position out of the centerline in the longitudinal direction of the vibrating element 6 (see FIG. 33). Thus, an unbalanced state is generated in the vibrating element 6 while driving the vibrating element 6. Therefore, since a complex vibration of longitudinal vibration and bending vibration is readily induced, it is possible to enhance the drive efficiency of the vibrating element 6.

In this structure, when the contact portion 66 strikes the end portion 552 of the rotating plate 55 by driving the vibrating element 6, the shielding plate 550 is rotated to switch any one of the openings 553a–553d. Thus, the rotating plate 55 serves as a variable diaphragm portion for switching light intensity from the optical system 3 toward the imaging portion 2 in a stepwise manner.

Figure 35:
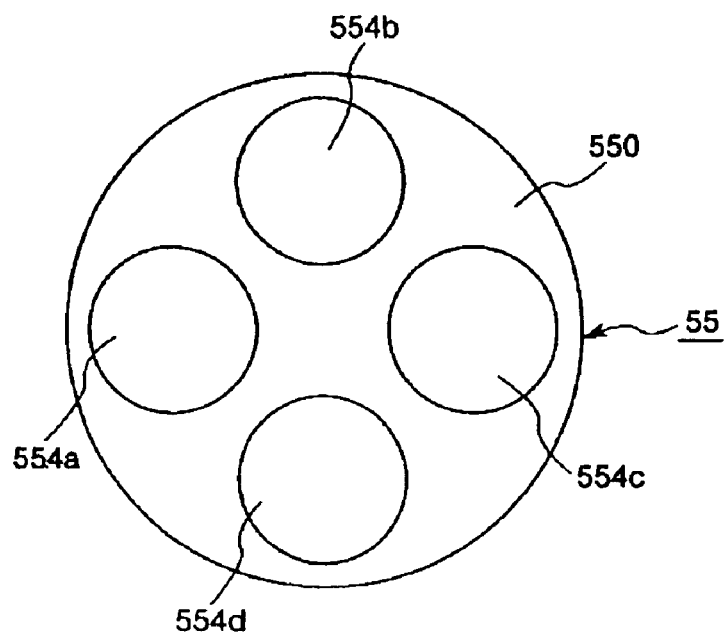
FIG. 35 is a plan view illustrating a variant of the shielding plate shown in FIGS. 32 and 33.

In the first variant of the sixth embodiment, the rotating plate 55 may have color filters 554a–554d each having a mutually different color in place of the openings 553a–553d (see FIG. 35). Thus, the rotating plate 55 serves as a variable filter portion for switching light intensity from the optical system 3 toward the imaging portion 2 in a stepwise manner by the same operation as that mentioned above.

(Second Variant)

Figure 36:
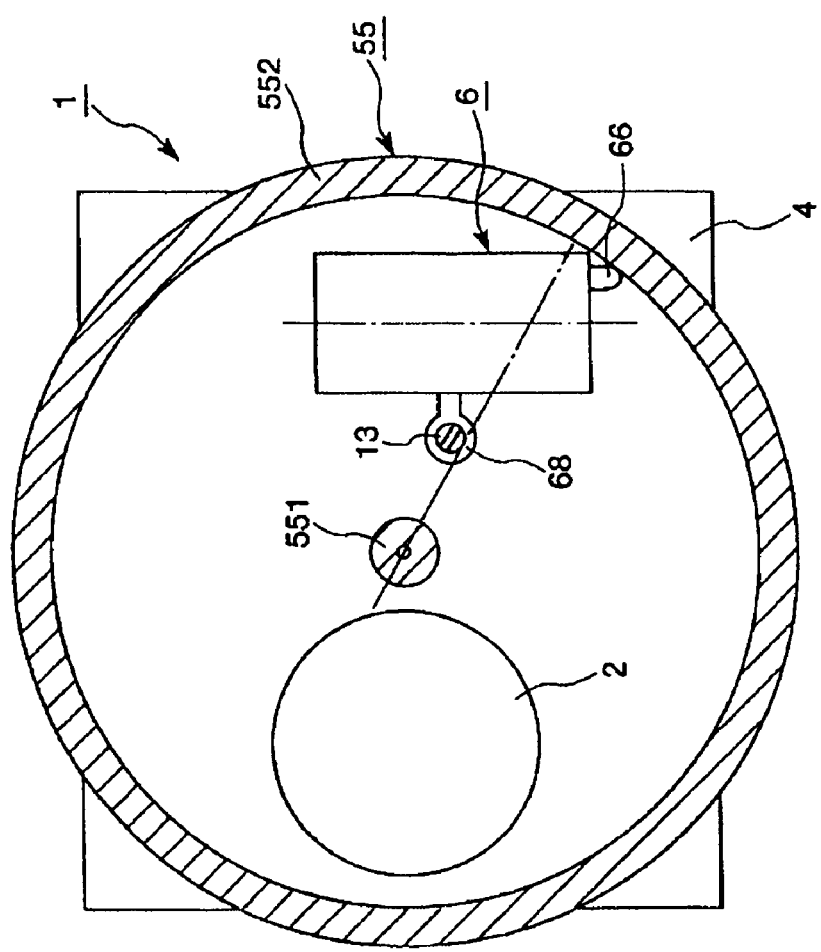
FIG. 36 is a plan sectional view illustrating a second variant of the electric instrument in the sixth embodiment.

FIG. 36 is a plan sectional view illustrating a second variant of the electric instrument in the sixth embodiment. In FIG. 36, the same parts (components) as those of the electric instrument 1 in the sixth embodiment described above are designated as the same reference numerals, and explanations thereof will be omitted.

In the electric instrument 1 of the sixth embodiment described above, the vibrating element 6 is arranged so that the centerline in the longitudinal direction faces to the radial direction of the rotating plate 55 (see FIG. 33). According to this constitution, the vibrating direction of the vibrating element 6 is substantially perpendicular to the inner wall surface of the end portion 552 of the rotating plate 55, and therefore the vibration of the vibrating element 6 is transmitted to the rotating plate 55 efficiently. Thus, this constitution is preferable because the drive efficiency of the mechanism can be enhanced. However, the present invention is not limited to this constitution. For example, as shown in FIG. 36, the centerline in the longitudinal direction of the vibrating element 6 may be arranged with a predetermined angle offset from the radial direction of the rotating plate 55. Since the radius of the rotating plate 55 can be set to be smaller, it is possible to place the vibrating element 6 suitably even though the longitudinal direction of the vibrating element 6 cannot face to the radial direction of the rotating plate 55.

(Third Variant)

Figure 37:
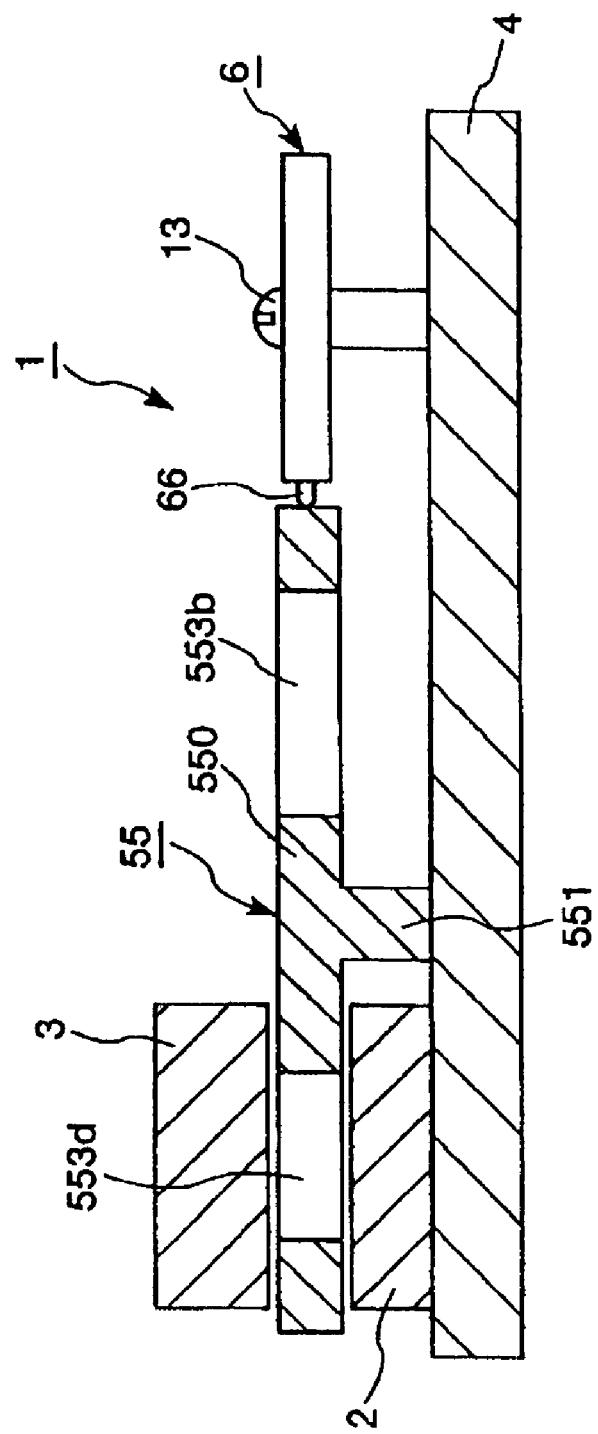
FIG. 37 is a side sectional view illustrating a third variant of the electric instrument in the sixth embodiment.
Figure 38:
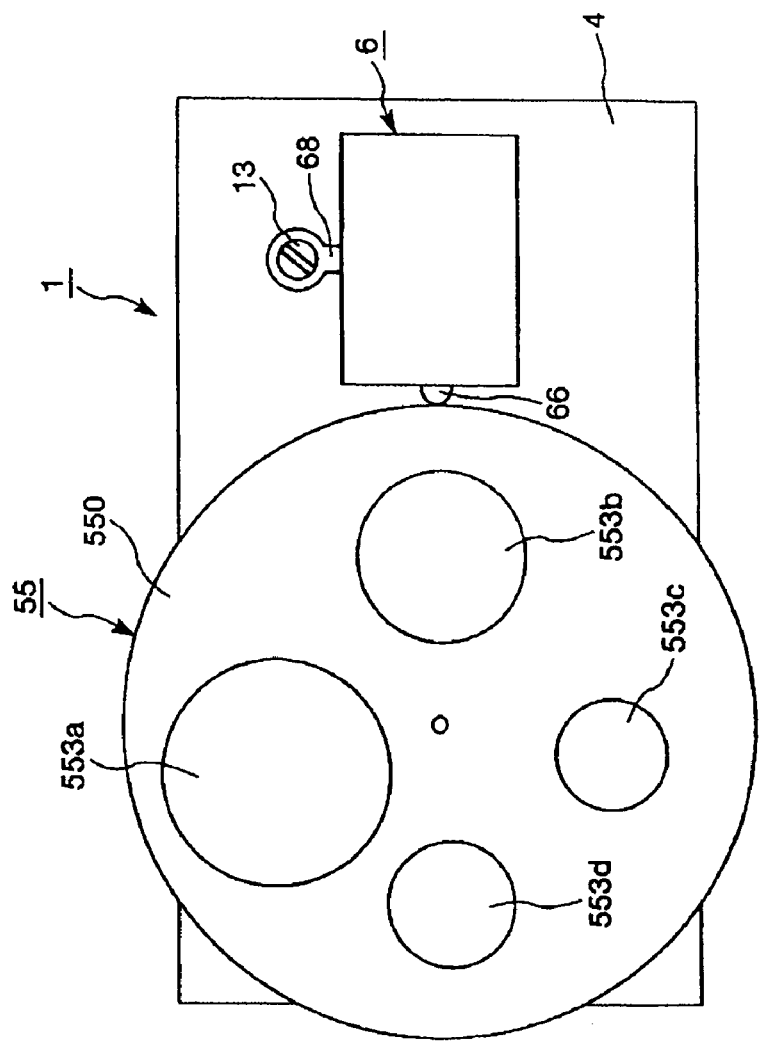
FIG. 38 is a plan sectional view illustrating a third variant of the electric instrument in the sixth embodiment.

FIG. 37 is a side sectional view illustrating a third variant of the electric instrument in the sixth embodiment. FIG. 38 is a plan sectional view illustrating a third variant of the electric instrument in the sixth embodiment. In these drawings, the same parts (components) as those of the electric instrument 1 in the sixth embodiment described above are designated as the same reference numerals, and explanations thereof will be omitted.

In the sixth embodiment described above, the end portion 552 is provided on the rotating plate 55, and the contact portion 66 of the vibrating element 6 abuts on the inner wall surface of the end portion 552 to drive (rotate) the rotating plate 55 from the inner side thereof. However, the present invention is not limited to this structure. As shown in FIGS. 37 and 38, the electric instrument 1 may be adapted so that the vibrating element 6 is provided at the outer circumferential side of the rotating plate 55, and the rotating plate 55 is driven from the outer circumferential side. This makes it possible to utilize variations of arrangement of the vibrating element 6 against the rotating plate 55.

As described above, it should be noted that, even though the ultrasonic motor, the operating apparatus, the optical apparatus and the electric instrument of the present invention have been described with reference to the preferred embodiments shown in the accompanying drawings, the present invention is not limited to these embodiments, it is of course possible to make various changes and modifications to each element of sawtooth wave generating apparatus and the constant current circuit, and various elements described above can be replaced with any other element capable of performing the same or a similar function.

In this regard, the present invention may combine any two or more constitutions (characteristics) in all the embodiments and all the variants described above.

The entire disclosure of Japanese Patent Application No. 2003-055019 filed Feb. 28, 2003 is incorporated by reference.

The invention claimed is:

1. An optical apparatus comprising:
a base;
a driven element provided on the base;
an ultrasonic motor constructed from a vibrating element, the ultrasonic motor being provided on the base, the vibrating element including a first piezoelectric element that undergoes extension and contraction by application of an AC voltage, a reinforcing plate having a contact portion and an arm portion, and a second piezoelectric element that undergoes extension and contraction by application of an AC voltage, in which the first piezoelectric element, the reinforcing plate and the second piezoelectric element being laminated in this order, and the vibrating element being supported on the base through the arm portion so that the contact portion abuts on the driven element, in which driving force is generated by the vibration of the vibrating element, and the driven element is driven by means of the driving force from the ultrasonic motor;
an imaging portion mounted on the base;
an optical system disposed above the imaging portion so as to face toward the imaging portion and to be spaced from the imaging portion for a predetermined spacing, the optical system emitting light to the imaging portion; and
a switching mechanism for adjusting the amount of the light emitted to the imaging portion from the optical system, the switching mechanism being provided so as to move between the optical system and the imaging portion in association with the driving of the driven element.

2. The optical system as claimed in claim 1, wherein the switching mechanism has at least one of a diaphragm portion, a filter portion, and a mechanical shutter.

3. The optical system as claimed in claim 1, wherein the vibrating element has a body portion, and wherein, in the case where a length of the body portion in a direction in which the vibrating element extends and contracts by the application of the AC voltage is defined as L (mm), L satisfies the relation: $1 \leq L < 7$ mm.

4. The optical system as claimed in claim 1, wherein the length L of the body portion in the extension-and-contraction direction is more than 3 mm.

5. The optical system as claimed in claim 1, wherein the arm portion is arranged at a substantially central portion of the body portion in the extension-and-contraction direction.

6. The optical system as claimed in claim 1, wherein the body portion has a short side substantially perpendicular to the extension-and-contraction direction of the body portion, and the contact portion is arranged at a substantially central portion of the short side.

7. The optical system as claimed in claim 1, wherein the body portion has a short side substantially perpendicular to the extension-and-contraction direction of the body portion, and the contact portion is arranged at a portion of the short side other than a substantially central portion thereof.

8. The optical system as claimed in claim 1, wherein the body portion has a centerline in a direction parallel to the extension-and-contraction direction, and the contact portion is arranged at a portion other than the centerline.

9. The optical system as claimed in claim 1, wherein the contact portion is arranged so as to protrude in the extension-and-contraction direction partly.

10. The optical system as claimed in claim 1, wherein the vibrating element has a vibrational node, and the arm portion supports the vibrating element at the vibrational node.

11. The optical system as claimed in claim 1, wherein the length of body portion of the vibrating element in the extension-and-contraction direction is longer than that in a direction perpendicular to the extension-and-contraction direction.

12. The optical system as claimed in claim 1, wherein the vibrating element undergoes a complex vibration of combination of longitudinal vibration and bending vibration, and a resonant frequency of the longitudinal vibration is different from but close to that of the bending vibration.

* * * * *